(12) United States Patent
Kodama et al.

(10) Patent No.: US 7,783,141 B2
(45) Date of Patent: Aug. 24, 2010

(54) SUBSTRATE FOR MOUNTING IC CHIP AND DEVICE FOR OPTICAL COMMUNICATION

(75) Inventors: Hiroaki Kodama, Ibi-gun (JP); Toyoaki Tanaka, Ibi-gun (JP); Kazuhito Yamada, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 116 days.

(21) Appl. No.: 11/696,434

(22) Filed: Apr. 4, 2007

(65) Prior Publication Data

US 2008/0247703 A1 Oct. 9, 2008

(51) Int. Cl.
*G02B 6/42* (2006.01)
(52) U.S. Cl. .......................................... 385/14; 385/88
(58) Field of Classification Search ........................ None
See application file for complete search history.

(56) References Cited

U.S. PATENT DOCUMENTS

| | | | |
|---|---|---|---|
| 7,004,644 B1* | 2/2006 | Johnson ....................... | 385/89 |
| 7,070,207 B2 | 7/2006 | Asai | |
| 2002/0098609 A1* | 7/2002 | Ono et al. ..................... | 438/31 |
| 2004/0067025 A1* | 4/2004 | Haraguchi et al. ............ | 385/49 |
| 2005/0025435 A1* | 2/2005 | Miyamae ..................... | 385/88 |
| 2005/0185880 A1 | 8/2005 | Asai | |
| 2005/0226569 A1* | 10/2005 | Sashinaka et al. ............. | 385/92 |
| 2006/0012967 A1 | 1/2006 | Asai et al. | |
| 2006/0045434 A1* | 3/2006 | Numata et al. ................ | 385/88 |
| 2006/0159405 A1* | 7/2006 | Yajima ......................... | 385/88 |
| 2006/0263003 A1 | 11/2006 | Asai et al. | |
| 2007/0104412 A1* | 5/2007 | Hsu ............................. | 385/14 |

FOREIGN PATENT DOCUMENTS

| | | |
|---|---|---|
| JP | 11-95072 | 4/1999 |
| JP | 2000-81524 | 3/2000 |
| JP | 2002-329891 | 11/2002 |
| JP | 2003-98400 | 4/2003 |
| JP | 2006-53266 | 2/2006 |
| JP | 2006-91753 | 4/2006 |

OTHER PUBLICATIONS

U.S. Appl. No. 11/623,923, filed Jan. 17, 2007, Kodama, et al.
U.S. Appl. No. 11/696,436, filed Apr. 4, 2007, Kodama, et al.
U.S. Appl. No. 11/693,188, filed Mar. 29, 2007, Kodama, et al.
U.S. Appl. No. 11/733,361, filed Apr. 10, 2007, Asai, et al.
U.S. Appl. No. 11/737,792, filed Apr. 20, 2007, Asai, et al.
U.S. Appl. No. 11/750,625, filed May 18, 2007, Yamada, et al.
U.S. Appl. No. 11/763,670, filed Jun. 15, 2007, Kodama, et al.

* cited by examiner

*Primary Examiner*—Mike Stahl
(74) *Attorney, Agent, or Firm*—Oblon, Spivak, McClelland, Maier & Neustadt, L.L.P.

(57) ABSTRACT

The substrate for mounting an IC chip according to the present invention is a substrate for mounting an IC chip, where conductor circuits and insulating layers are formed and layered, an optical element is mounted, an optical path for transmitting an optical signal is formed, wherein an optical element sealing layer is formed so as to make contact with the periphery of the above described optical element.

35 Claims, 22 Drawing Sheets

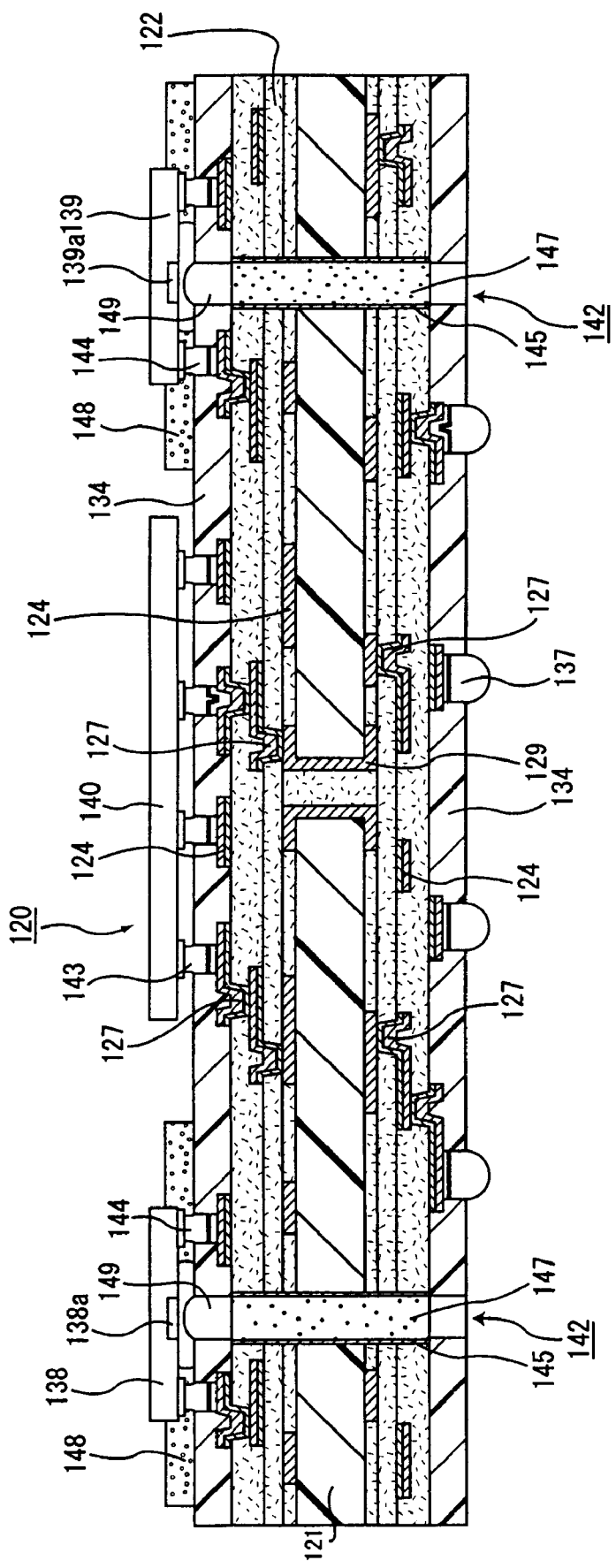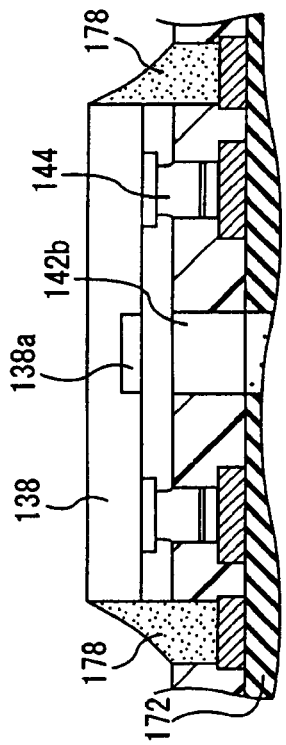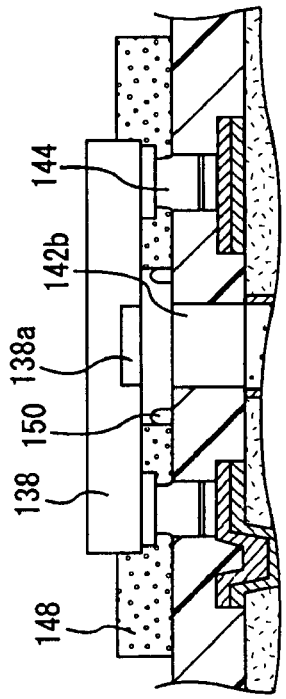

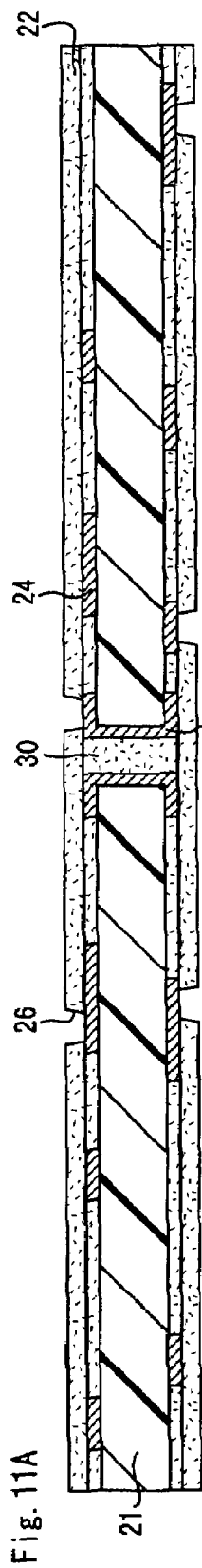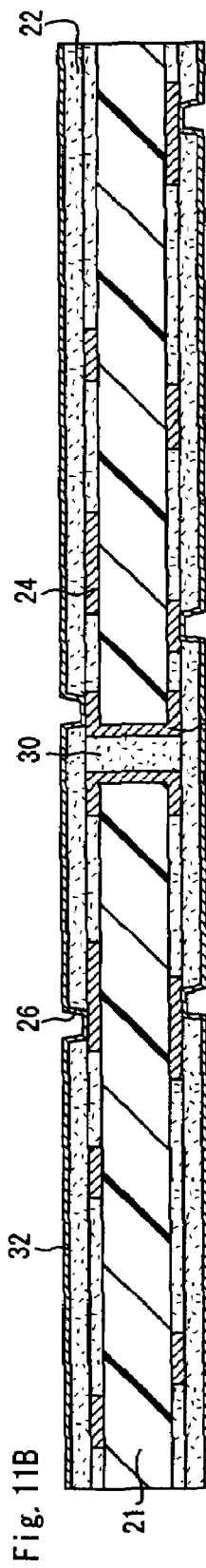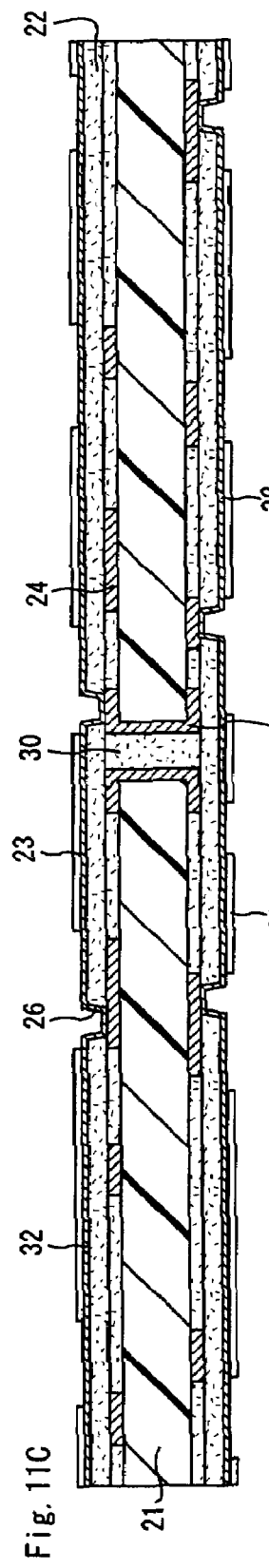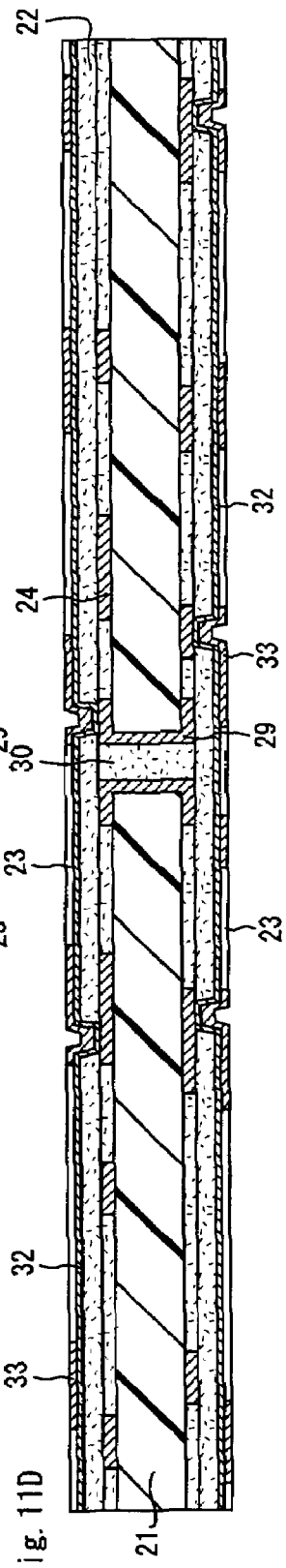

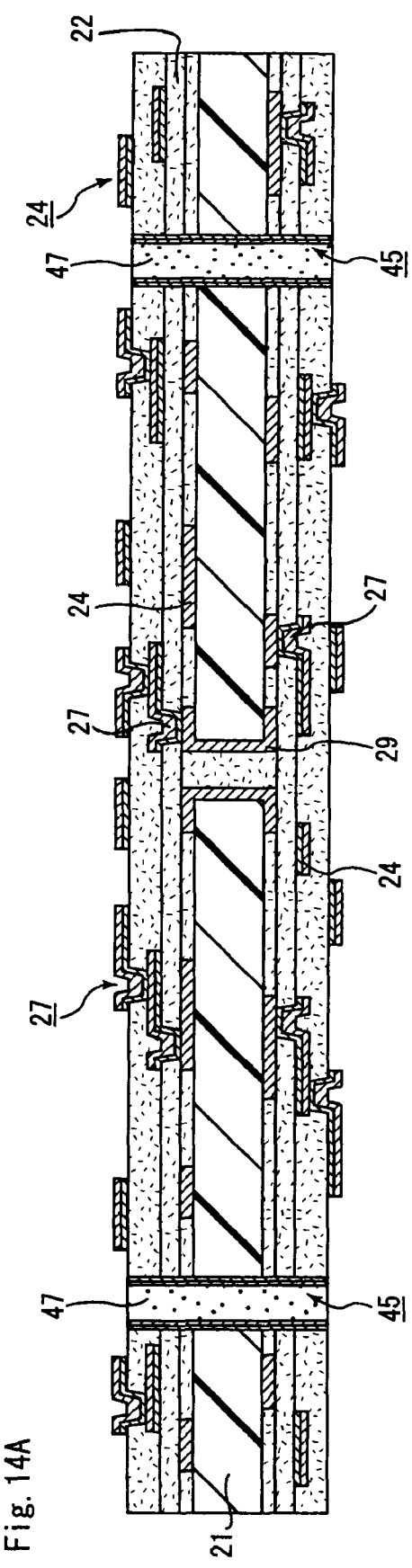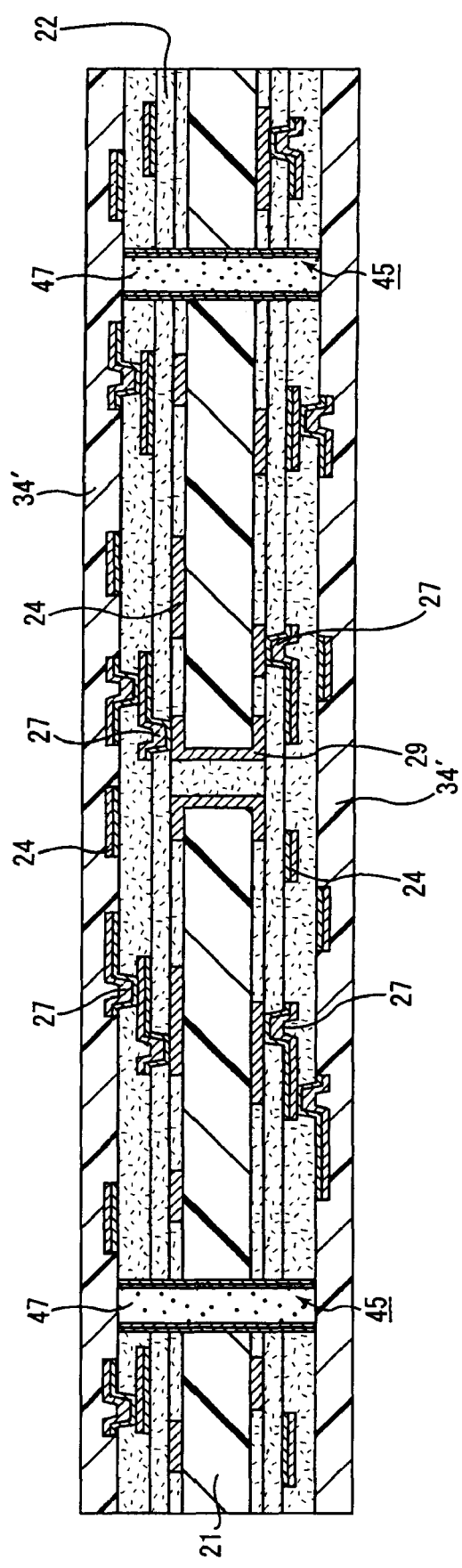

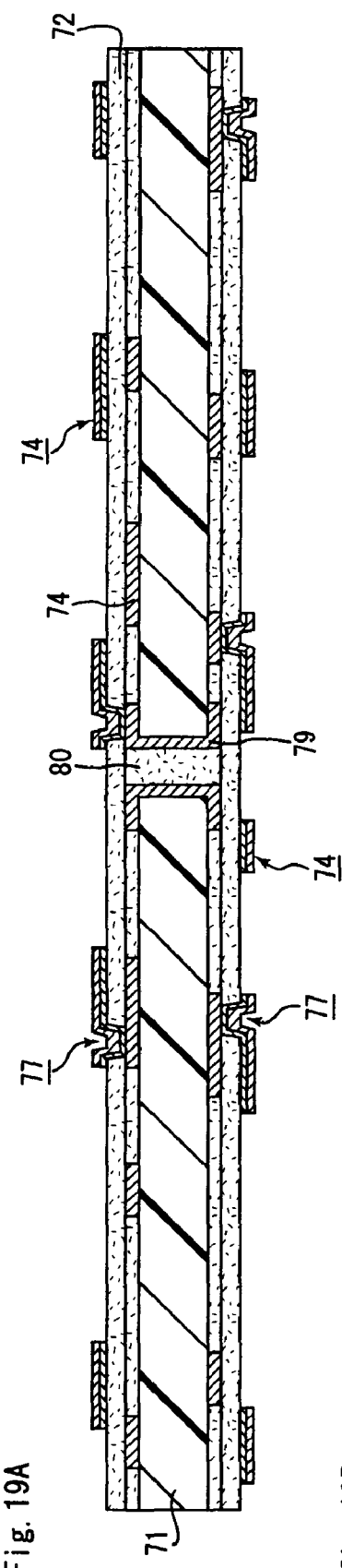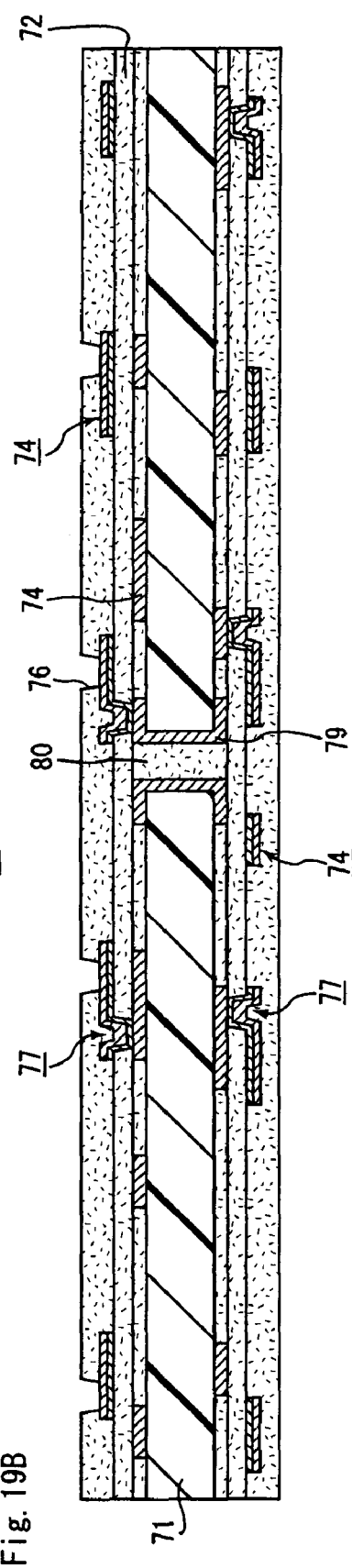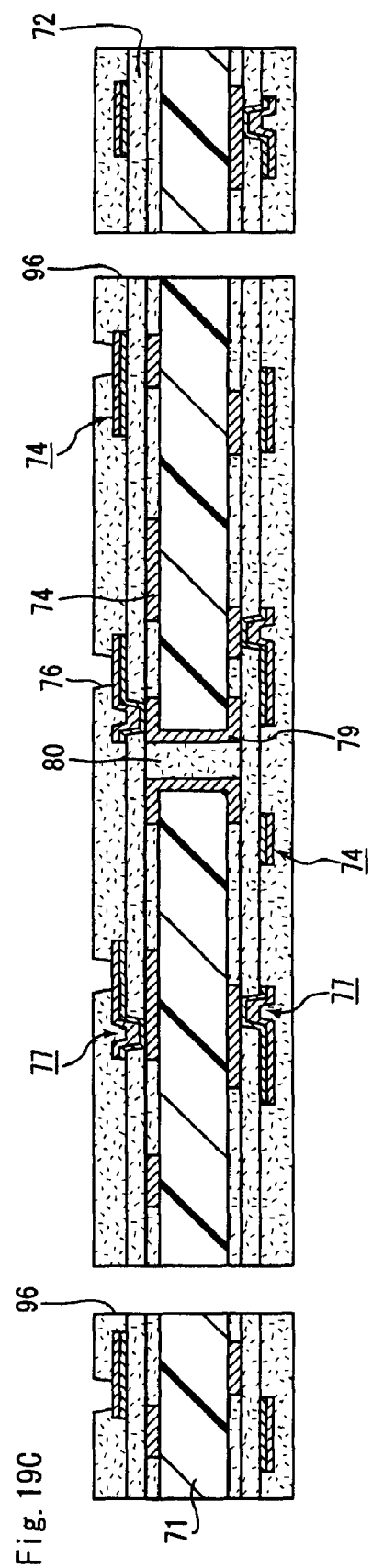
Fig. 19A
Fig. 19B
Fig. 19C

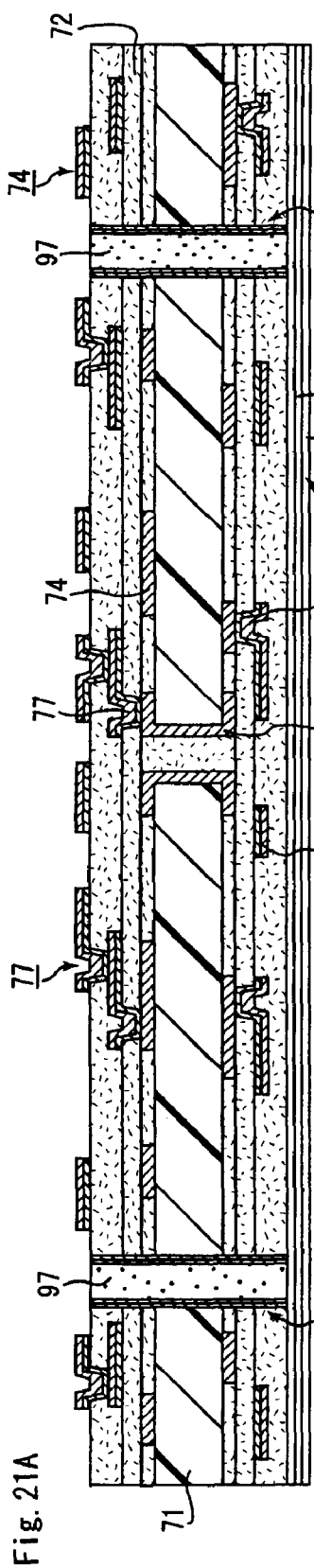
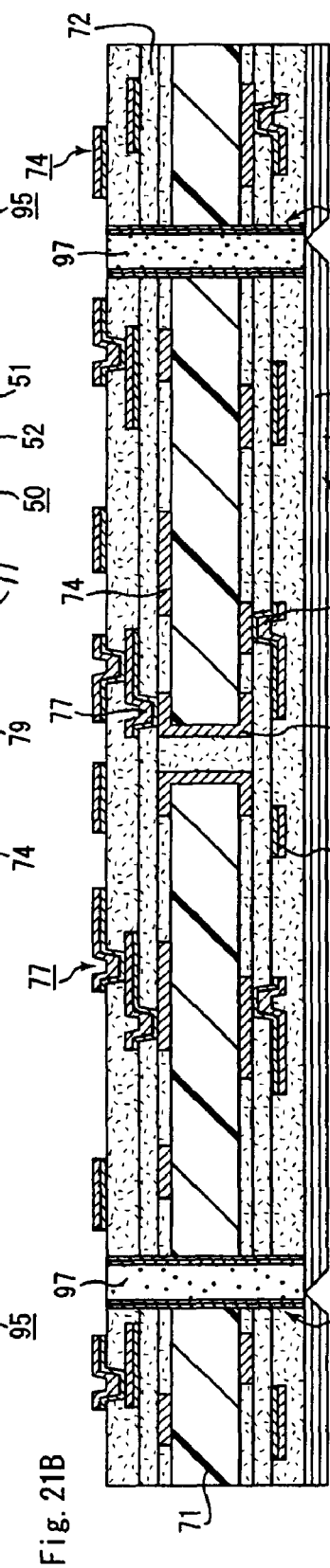
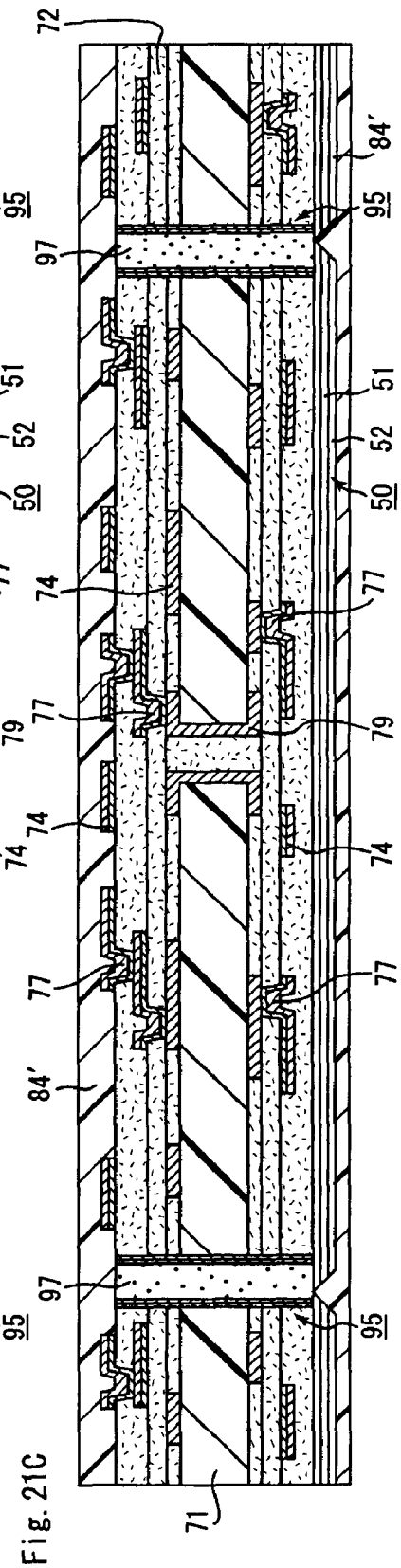
Fig. 21A
Fig. 21B
Fig. 21C

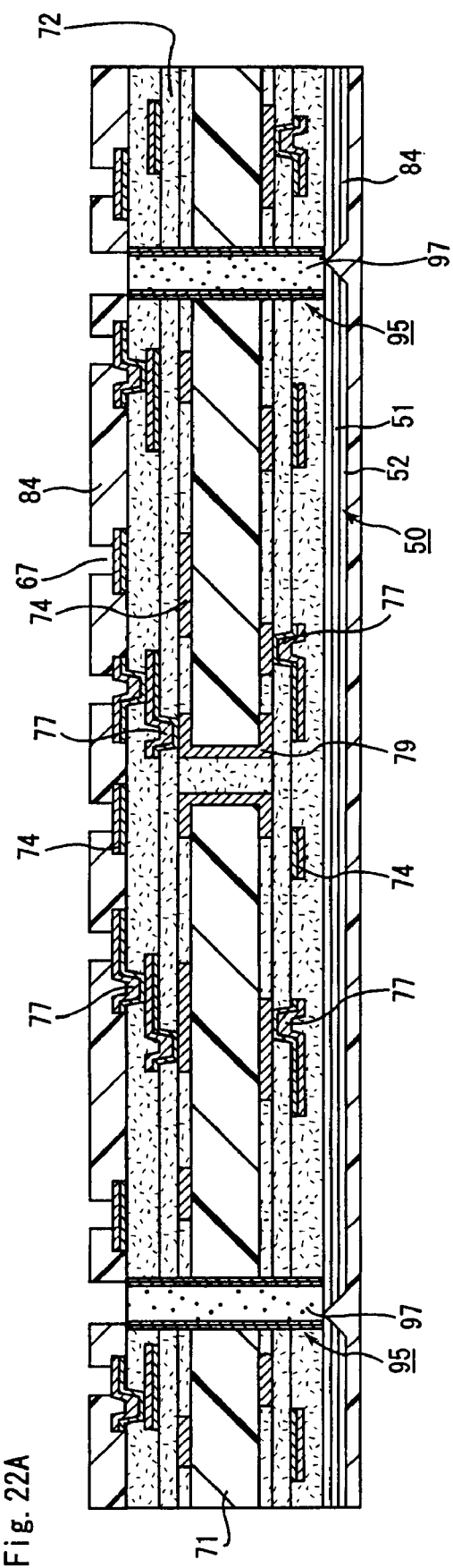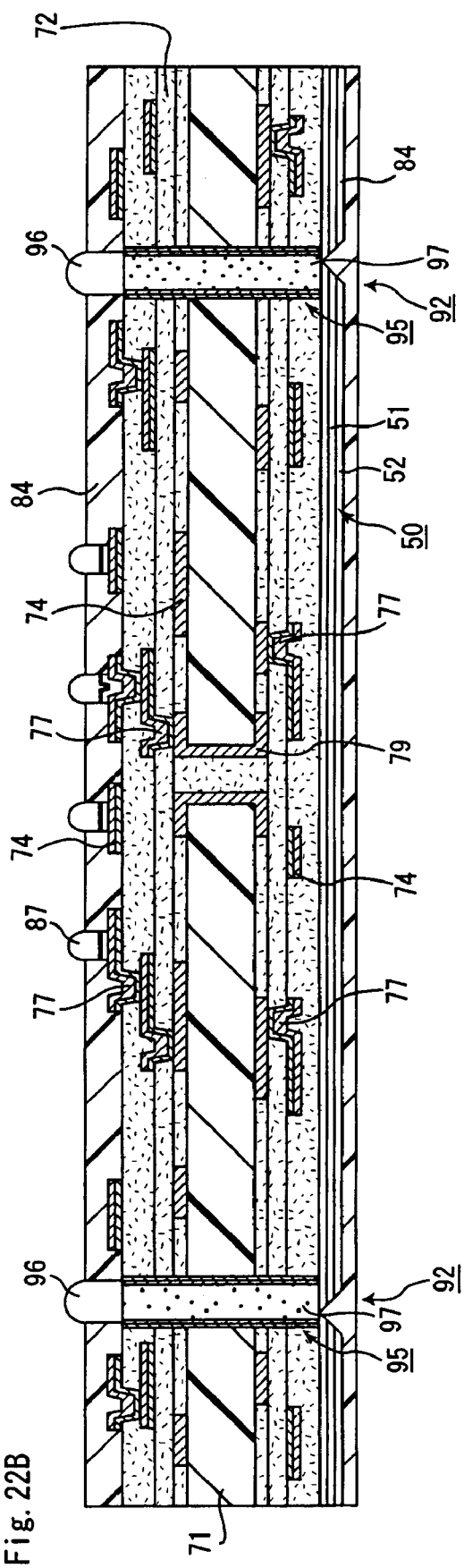

SUBSTRATE FOR MOUNTING IC CHIP AND DEVICE FOR OPTICAL COMMUNICATION

CROSS-REFERENCE TO RELATED APPLICATIONS

This application relates to JP-A 2006-91753 published on Apr. 6, 2006. The contents of this application are incorporated herein by reference in their entirety.

BACKGROUND OF THE INVENTION

1. Field of the Invention

The present invention relates to a substrate for mounting an IC chip and a device for optical communication.

2. Discussion of the Background

In recent years, optical fibers have been drawing attention as the center of the field of communications. In particular, communication technology using optical fibers has become necessary in the field of IT (information technology), for the development of high-speed Internet networks.

The optical fiber has characteristics of (1) low loss, (2) high band, (3) small diameter and light weight, (4) non-induction, (5) resource saving, and the like. A communication system which employs the optical fibers having these characteristics can considerably decrease the number of relays as compared with a communication system which employs conventional metallic cables, can be easily constructed and maintained, and can improve its economical efficiency and reliability.

Further, since the optical fiber can transmit not only light having a single wavelength but also light having a number of different wavelengths simultaneously, a large capacity of a transmission line which can deal with diversified purposes and tends to deal with picture service and the like can be achieved.

Therefore, for the network communication such as the Internet, the employment of optical transmission using optical fibers not only for the communication of a basic network but also for the communication between the basic network and terminal device (a personal computer, a mobile, a game machine and the like) and for the communication between the terminal devices is proposed.

Conventionally, as an optical transmitter receiver system, an optical transmitter receiver system is disclosed in which for example, a pair of planar light emitting and receiving elements are mounted with the face facing downwards using a flip chip bonding method on the surface of a multilayer substrate (substrate for a motherboard), through holes having a core portion and a clad portion right under the center of the planar light emitting and receiving elements are formed therein, and furthermore, the optical waveguide which linearly extends even from right under one through hole to right under the other through hole is formed on the bottom surface of the planar light emitting and receiving element (see for example JP-A 2000-81524).

The contents of JP-A 2000-81524 are incorporated herein by reference in their entirety.

SUMMARY OF THE INVENTION

The substrate for mounting an IC chip according to the first aspect of the present invention is a substrate for mounting an IC chip, where conductor circuits and insulating layers are formed and layered, an optical element is mounted, an optical path for transmitting an optical signal is formed, wherein an optical element sealing layer is formed so as to make contact with the periphery of the above described optical element.

In the substrate for mounting an IC chip according to the first aspect of the present invention, a gap part is desirably formed in the portion where the above described optical path for transmitting an optical signal makes contact with the above described optical element.

In the substrate for mounting an IC chip according to the first aspect of the present invention, the above described optical element sealing layer desirably comprises a resin composite. Here, a resin component of the above described resin composite is desirably a thermosetting resin, a photosensitive resin, resin where a photosensitive group is added to a portion of a thermosetting resin, or a resin compound which includes these and a thermoplastic resin.

In the substrate for mounting an IC chip according to the first aspect of the present invention, particles are desirably included in the above described optical element sealing layer. In addition, the particle diameter of the above described particles is desirably at least about 1 μm and at most about 500 μm and/or the average particle diameter of the above described particles is at least about 10 μm and at most about 100 μm.

In the substrate for mounting an IC chip according to the first aspect of the present invention, the above described optical element sealing layer comprises solder. In this case, a metal layer is desirably formed on the portion where the side of the above described optical element makes contact with the above described optical element sealing layer.

In the substrate for mounting an IC chip according to the first aspect of the present invention, the above described optical element is desirably a light receiving element and/or a light emitting element.

In the substrate for mounting an IC chip according to the first aspect of the present invention, an IC chip is desirably mounted, and an optical element sealing layer is desirably formed so as to integrally cover the above described IC chip and the above described optical element.

In the substrate for mounting an IC chip according to the first aspect of the present invention, a micro lens is desirably provided on the above described optical element or the above described optical path for transmitting an optical signal.

In the substrate for mounting an IC chip according to the first aspect of the present invention, part or the entirety of the above described optical path for transmitting an optical signal is desirably formed of a resin composite.

In the substrate for mounting an IC chip according to the first aspect of the present invention, the above described optical path for transmitting an optical signal is desirably formed so as to penetrate through at least the above described insulating layer.

Here, the portion where the above described optical path for transmitting an optical signal penetrates through at least the above described insulating layer is desirably formed of a resin composite.

In the substrate for mounting an IC chip according to the first aspect of the present invention, a solder resist layer is desirably formed as an outermost layer, and the above described optical path for transmitting an optical signal is desirably formed so as to penetrate through at least the above described insulating layer and the above described solder resist layer.

Here, the portion where the above described optical path for transmitting an optical signal penetrates through at least the above described insulating layer is desirably formed of a resin composite, and the portion where the above described optical path for transmitting an optical signal penetrates through the above described solder resist layer is desirably formed of a gap. In addition, the portion where the above described optical path for transmitting an optical signal penetrates through at least the above described insulating layer and the above described solder resist layer is desirably formed of a resin composite.

In addition, in the case where an optical path for transmitting an optical signal is formed so as to penetrate through at least the above described insulating layer and the above described solder resist layer, the portion where the above described optical path for transmitting an optical signal penetrates through the above described solder resist layer is formed of a gap, and the cross-sectional diameter of the portion in which the above described gap is formed, is desirably smaller than the cross-sectional diameter of the portion where the optical path for transmitting an optical signal penetrates through at least the above described insulating layer.

In the substrate for mounting an IC chip according to the first aspect of the present invention, particles are desirably included in a resin composite forming the above described optical path for transmitting an optical signal.

Here, the above described particles are desirably inorganic particles comprising alumina, silica, or titania. In addition, the particle diameter of the above described particles is desirably at least about 0.01 μm and at most about 0.8 μm.

In the substrate for mounting an IC chip according to the first aspect of the present invention, in the case where an optical path for transmitting an optical signal is formed so as to penetrate through at least the above described insulating layer, the above described optical path for transmitting an optical signal has a collective through hole structure or an individual through hole structure.

In the substrate for mounting an IC chip according to the first aspect of the present invention, a solder resist layer is desirably formed as an outermost layer, and a dam is desirably formed on the above described solder resist layer between the above described optical element and the above described solder resist layer so as to prevent the inflow of the above described optical element sealing layer into the above described optical element.

Here, the above described dam is desirably formed by printing an epoxy resin, a silicone resin, or an acrylic resin.

The substrate for mounting an IC chip according to the second aspect of the present invention is a substrate for mounting an IC chip, where conductor circuits and insulating layers are formed and layered, an optical element is mounted, an optical path for transmitting an optical signal is formed, wherein a cap member is attached so as to at least cover the above described optical element.

In the substrate for mounting an IC chip according to the second aspect of the present invention, the above described cap member is desirably bonded and fixed with resin or solder.

In the substrate for mounting an IC chip according to the second aspect of the present invention, the above described optical element is desirably a light receiving element and/or a light emitting element.

In the substrate for mounting an IC chip according to the second aspect of the present invention, a plurality of optical elements are desirably mounted, and the above described cap member is desirably attached so as to integrally cover a plurality of optical elements.

In the substrate for mounting an IC chip according to the second aspect of the present invention, desirably, the above described cap member comprises a heat sink portion, or the above described cap member itself functions as a heat sink.

In the substrate for mounting an IC chip according to the second aspect of the present invention, further, an IC chip is desirably mounted, and the above described cap member is desirably attached so as to integrally cover the above described optical element and the above described IC chip.

In the substrate for mounting an IC chip according to the second aspect of the present invention, a micro lens is desirably provided on the above described optical element or the above described optical path for transmitting an optical signal.

In the substrate for mounting an IC chip according to the second aspect of the present invention, part or the entirety of the above described optical path for transmitting an optical signal is desirably formed of a resin composite.

In the substrate for mounting an IC chip according to the second aspect of the present invention, the above described optical path for transmitting an optical signal is desirably formed so as to penetrate through at least the above described insulating layer. Here, the portion where the above described optical path for transmitting an optical signal penetrates through at least the above described insulating layer is desirably formed of a resin composite.

In the substrate for mounting an IC chip according to the second aspect of the present invention, a solder resist layer is desirably formed as an outermost layer, and the above described optical path for transmitting an optical signal is desirably formed so as to penetrate through at least the above described insulating layer and the above described solder resist layer.

Here, the portion where the above described optical path for transmitting an optical signal penetrates through at least the above described insulating layer is desirably formed of a resin composite, and the portion where the above described optical path for transmitting an optical signal penetrates through the above described solder resist layer is desirably formed of a gap. In addition, the portion where the above described optical path for transmitting an optical signal penetrates through at least the above described insulating layer and the above described solder resist layer is desirably formed of a resin composite.

In addition, in the case where an optical path for transmitting an optical signal is formed so as to penetrate through at least the above described insulating layer and the above described solder resist layer, the portion where the above described optical path for transmitting an optical signal penetrates through the above described solder resist layer is desirably formed of a gap, and the cross-sectional diameter of the portion in which the above described gap is formed is desirably smaller than the cross-sectional diameter of the portion where the optical path for transmitting an optical signal penetrates through at least the above described insulating layer.

In the substrate for mounting an IC chip according to the second aspect of the present invention, particles are desirably included in a resin composite forming the above described optical path for transmitting an optical signal.

Here, the above described particles are desirably inorganic particles comprising alumina, silica, or titania. In addition, the particle diameter of the above described particles is desirably at least about 0.01 μm and at most about 0.8 μm.

In the substrate for mounting an IC chip according to the second aspect of the present invention, in the case where an optical path for transmitting an optical signal is formed so as to penetrate through at least the above described insulating layer, the above described optical path for transmitting an optical signal desirably has a collective through hole structure or an individual through hole structure.

The device for optical communication according to the third aspect of the present invention is a device for optical communication, where conductor circuits and insulating layers are formed and layered, an optical waveguide is formed thereon, and furthermore, a substrate for mounting an IC chip mounted with an optical element is mounted on a substrate for a motherboard on which an optical path for transmitting an optical signal is formed, wherein sealing layers of a substrate for mounting an IC chip are formed so as to make contact with the periphery of the above described substrate for mounting an IC chip.

In the device for optical communication according to the third aspect of the present invention, a gap part is desirably formed in the portion where the above described optical path for transmitting an optical signal makes contact with the above described substrate for mounting an IC chip.

In the device for optical communication according to the third aspect of the present invention, the above described sealing layers of a substrate for mounting an IC chip desirably comprise a resin composite. Here, a resin component of the above described resin composite is desirably a thermosetting resin, a photosensitive resin, resin where a photosensitive group is added to a portion of a thermosetting resin, or a resin compound which includes these and a thermoplastic resin.

In the device for optical communication according to the third aspect of the present invention, particles are desirably included in the above described sealing layers of a substrate for mounting an IC chip.

In addition, the particle diameter of the above described particles is at least about 1 μm and at most about 500 μm and/or the average particle diameter of the above described particles is at least about 10 μm and at most about 100 μm.

In the device for optical communication according to the third aspect of the present invention, the above described sealing layers of a substrate for mounting an IC chip desirably comprises solder.

In the device for optical communication according to the third aspect of the present invention, the above described optical waveguide is desirably an organic based optical waveguide, and particles are desirably mixed in the above described organic based optical waveguide. Here, the particle diameter of the above described particles is desirably smaller than the wavelength for communication.

In addition, the particle diameter of the above described particles is desirably at least about 0.01 μm and at most about 0.8 μm.

In the device for optical communication according to the third aspect of the present invention, the above described optical waveguide desirably comprises a core portion and a clad portion, and particles are desirably mixed only in the above described clad portion.

In addition, optical conversion mirrors are desirably formed in the above described optical waveguide.

In the device for optical communication according to the third aspect of the present invention, the above described optical element is desirably a light receiving element and/or a light emitting element.

In the device for optical communication according to the third aspect of the present invention, a micro lens is desirably provided on the above described optical path for transmitting an optical signal.

In the device for optical communication according to the third aspect of the present invention, part or the entirety of the above described optical path for transmitting an optical signal is desirably formed of a resin composite.

In the device for optical communication according to the third aspect of the present invention, a solder resist layer is desirably formed as both sides of an outermost layer of the substrate for a motherboard, and the above described optical path for transmitting an optical signal is desirably formed so as to penetrate through at least the above described insulating layer and one side of the solder resist layer.

Here, the portion where the above described optical path for transmitting an optical signal penetrates through at least the above described insulating layer is desirably formed of a resin composite, and the portion where the above described optical path for transmitting an optical signal penetrates through the above described solder resist layer is desirably formed of a gap.

In addition, the device for optical communication according to the third aspect of the present invention, the portion where the above described optical path for transmitting an optical signal penetrates through the above described solder resist layer is desirably formed of a gap, and the cross-sectional diameter of the portion in which the above described gap is formed, is desirably smaller than the cross-sectional diameter of the portion where the optical path for transmitting an optical signal penetrates through at least the above described insulating layer.

In the device for optical communication according to the third aspect of the present invention, particles are desirably included in a resin composite forming the above described optical path for transmitting an optical signal. Here, the above described particles are desirably inorganic particles comprising alumina, silica, or titania. In addition, the particle diameter of the above described particles is desirably at least about 0.01 μm and at most about 0.8 μm.

In the device for optical communication according to the third aspect of the present invention, the above described optical path for transmitting an optical signal desirably has a collective through hole structure or an individual through hole structure.

In the device for optical communication according to the third aspect of the present invention, a solder resist layer is formed as an outermost layer of the substrate for a motherboard, and a dam is desirably formed on the solder resist layer between the above described substrate for mounting an IC chip and the above described solder resist layer of the substrate for a motherboard so as to prevent the inflow of the above described sealing layers of a substrate for mounting an IC chip.

Here, the above described dam is desirably formed by printing an epoxy resin, a silicone resin, or an acrylic resin.

The device for optical communication according to the fourth aspect of the present invention is a device for optical communication, where conductor circuits and insulating layers are formed and layered, an optical waveguide is formed thereon, and furthermore, an optical element is mounted on a substrate for a motherboard on which an optical path for transmitting an optical signal is formed, wherein a cap member is attached so as to at least cover the above described substrate for mounting an IC chip.

In the device for optical communication according to the fourth aspect of the present invention, the above described cap member is desirably bonded and fixed with resin or solder.

In addition, desirably, the above described cap member comprises a heat sink portion, or the above described cap member itself functions as a heat sink.

In the device for optical communication according to the fourth aspect of the present invention, the above described optical waveguide is desirably an organic based optical waveguide, and particles are desirably mixed in the above described organic based optical waveguide. Here, the particle diameter of the above described particles is desirably smaller than the wavelength for communication.

In addition, the particle diameter of the above described particles is desirably at least about 0.01 µm and at most about 0.8 µm.

In the device for optical communication according to the fourth aspect of the present invention, the above described optical waveguide desirably comprises a core portion and a clad portion, and particles are desirably mixed only in the above described clad portion.

In addition, optical conversion mirrors are desirably formed in the above described optical waveguide.

In the device for optical communication according to the fourth aspect of the present invention, the above described optical element is desirably a light receiving element and/or a light emitting element.

In the device for optical communication according to the fourth aspect of the present invention, a micro lens is desirably provided on the above described optical path for transmitting an optical signal.

In the device for optical communication according to the fourth aspect of the present invention, part or the entirety of the above described optical path for transmitting an optical signal is desirably formed of a resin composite.

In the device for optical communication according to the fourth aspect of the present invention, a solder resist layer is desirably formed as both sides of an outermost layer of the substrate for a motherboard, and the above described optical path for transmitting an optical signal is desirably formed so as to penetrate through at least the above described insulating layer and one side of the solder resist layer.

Here, the portion where the above described optical path for transmitting an optical signal penetrates through at least the above described insulating layer is desirably formed of a resin composite, and the portion where the above described optical path for transmitting an optical signal penetrates through the above described solder resist layer is desirably formed of a gap.

Here, in the device for optical communication according to the fourth aspect of the present invention, the portion where the above described optical path for transmitting an optical signal in the substrate for a motherboard penetrates through the above described solder resist layer is desirably formed of a gap, and the cross-sectional diameter of the portion in which the above described gap is formed, is desirably smaller than the cross-sectional diameter of the portion where the optical path for transmitting an optical signal penetrates through at least the above described insulating layer.

In the device for optical communication according to the fourth aspect of the present invention, particles are desirably included in a resin composite forming the above described optical path for transmitting an optical signal. Here, the above described particles are inorganic particles comprising alumina, silica, or titania. In addition, the particle diameter of the above described particles is desirably at least about 0.01 µm and at most about 0.8 µm.

In the device for optical communication according to the fourth aspect of the present invention, the above described optical path for transmitting an optical signal desirably has a collective through hole structure or an individual through hole structure.

BRIEF DESCRIPTION OF THE DRAWINGS

FIG. 1A is a partial cross-sectional view schematically illustrating part of an example of a substrate for mounting an IC chip according to one embodiment of the first aspect of the present invention, and FIG. 1B and FIG. 1C are partial cross-sectional views schematically illustrating part of another example of the substrate for mounting an IC chip according to one embodiment of the first aspect of the present invention.

FIGS. 11A to 11D are cross-sectional views schematically illustrating part of a method for manufacturing a substrate for mounting an IC chip according to one embodiment of the present invention.

FIGS. 14A and 14B are cross-sectional views schematically illustrating part of a method for manufacturing a substrate for mounting an IC chip according to one embodiment of the present invention.

FIGS. 19A to 19C are cross-sectional views schematically illustrating part of a method for manufacturing a substrate for a motherboard which forms a device for optical communication according to one embodiment of the present invention.

FIGS. 21A to 21C are cross-sectional views schematically illustrating part of a method for manufacturing a substrate for a motherboard which forms a device for optical communication according to one embodiment of the present invention.

FIGS. 22A and 22B are cross-sectional views schematically illustrating part of a method for manufacturing a substrate for a motherboard which forms a device for optical communication according to one embodiment of the present invention.

DESCRIPTION OF THE EMBODIMENTS

Figure 2:
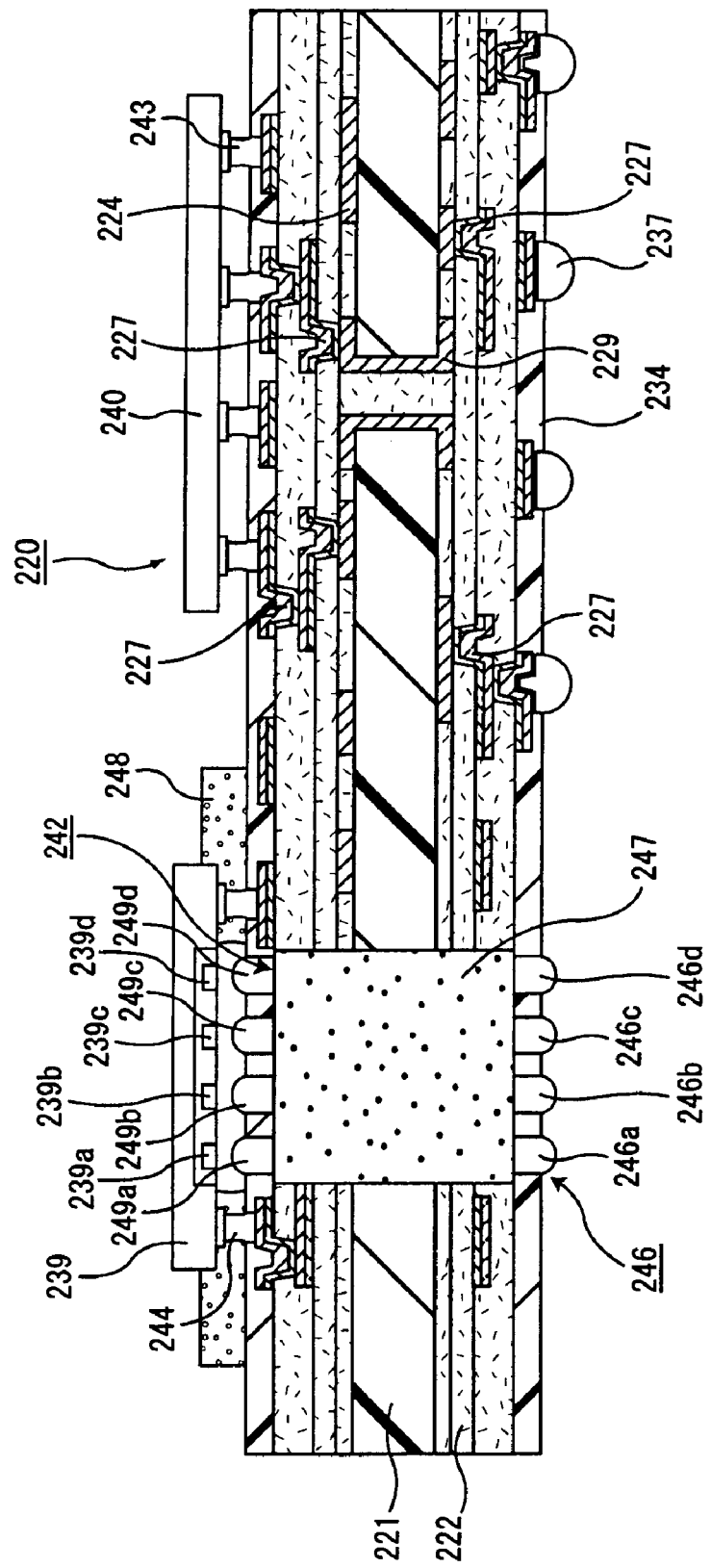
FIG. 2 is a cross-sectional view schematically illustrating an example of a substrate for mounting an IC chip according to one embodiment of the first aspect of the present invention.

A substrate for mounting an IC chip according to the embodiments of the first aspect of the present invention is a substrate for mounting an IC chip, where conductor circuits and insulating layers are formed and layered, an optical element is mounted, an optical path for transmitting an optical signal is formed, wherein an optical element sealing layer is formed so as to make contact with the outer periphery of the above described optical element.

Since an optical element sealing layer is formed in a substrate for mounting an IC chip according to the embodiments of the first aspect of the present invention so as to make contact with the periphery of the optical element, there is no portion opened to the outside between the optical element and the optical element mounting side on a substrate for mounting an IC chip on which the optical element is mounted, dust, foreign matter, or the like tends not to intrude inside or on an optical path for transmitting an optical signal, and thereby transmission of an optical signal tends not to be obstructed for lack of this dust or the like.

Accordingly, the substrate for mounting an IC chip according to the first aspect of the present invention has excellent reliability.

A substrate for mounting an IC chip according to the embodiments of the second aspect of the present invention is a substrate for mounting an IC chip, where conductor circuits and insulating layers are formed and layered, an optical element is mounted, an optical path for transmitting an optical signal is formed, wherein a cap member is attached so as to at least cover the above described optical element.

Since a cap member is attached in a substrate for mounting an IC chip according to the embodiments of the second aspect of the present invention so as to at least cover an optical element, there is no portion opened to the outside between the cap member and the optical element mounting side on a substrate for mounting an IC chip, dust, foreign matter, or the like tends not to intrude inside or on an optical path for transmitting an optical signal, and thereby transmission of an optical signal tends not to be obstructed for lack of this dust or the like.

Accordingly, the substrate for mounting an IC chip according to the embodiments of the second aspect of the present invention has excellent reliability.

A device for optical communication according to the embodiments of the third aspect of the present invention is a substrate for mounting an IC chip, where conductor circuits and insulating layers are formed and layered, an optical waveguide is mounted thereon, and furthermore, an optical element is mounted on a substrate for a motherboard on which an optical path for transmitting an optical signal is formed, wherein an IC chip sealing layer is formed so as to make contact with the periphery of the above described substrate for mounting an IC chip.

Since an optical element sealing layer is formed in a device for optical communication according to the embodiments of the third aspect of the present invention so as to make contact with the periphery of the substrate for mounting an IC chip, there is no portion opened to the outside between a substrate for mounting an IC chip and the side on which the substrate for mounting an IC chip is mounted on a substrate for a motherboard, dust, foreign matter, or the like tends not to intrude inside or on an optical path for transmitting an optical signal, and thereby transmission of an optical signal tends not to be obstructed for lack of this dust or the like.

Accordingly, the device for optical communication according to the embodiments of the third aspect of the present invention has excellent reliability.

In addition, since a device for optical communication according to the embodiments of the third aspect of the present invention, electronic parts and optical elements required for optical communication can be mounted on a substrate for a motherboard and be integrated, which is more likely to contribute to the reduction of a terminal apparatus for optical communication in thickness and size.

A device for optical communication according to the embodiments of the fourth aspect of the present invention is a substrate for mounting an IC chip, where conductor circuits and insulating layers are formed and layered, an optical waveguide is formed thereon, and furthermore, an optical element is mounted on a substrate for a motherboard on which an optical path for transmitting an optical signal is formed, wherein a cap member is attached so as to at least cover the above described substrate for mounting an IC chip.

Since a cap member is attached in a device for optical communication according to the embodiments of the fourth aspect of the present invention so as to at least cover the above described substrate for mounting an IC chip, there is no portion opened to the outside between the cap member and the side on which a substrate for mounting an IC chip mounted with an optical element is mounted on a substrate for a motherboard, dust, foreign matter, or the like tends not to intrude inside or on an optical path for transmitting an optical signal, and thereby transmission of an optical signal tends not to be obstructed for lack of this dust or the like.

Accordingly, the device for optical communication according to the embodiments of the fourth aspect of the present invention has excellent reliability.

First, a substrate for mounting an IC chip according to the embodiments of the first aspect of the present invention is described.

Since a substrate for mounting an IC chip according to the embodiments of the first aspect of the present invention functions as what is called a package substrate, a conductor circuit is basically formed with a fine pattern, and it may become easier to expand circuits from the IC chip side to the motherboard side.

In addition, since the optical path for transmitting an optical signal is formed while an optical element is mounted thereon, input and output signals of the above described optical element may be transmitted more easily via the above described optical path for transmitting an optical signal. In addition, in the case where an IC chip is mounted on this substrate for mounting an IC chip, the distance between the IC chip and the optical element is short, resulting in excellent reliability of transmission of an electrical signal.

In addition, in the substrate for mounting an IC chip according to the embodiments of the first aspect of the present invention, a solder resist layer is usually formed as an outermost layer on a substrate on which conductor circuits and insulating layers are formed and layered on the both sides, in order to protect the conductor circuits and the like.

In the present specification, the substrate for mounting an IC chip according to the embodiments in which the solder resist layer is formed as the outermost layer is described in the following. Here, the above described solder resist layer does not always need to be formed.

Here, the substrate for mounting an IC chip according to the first aspect of the present invention may have a substrate as a base and may have a structure where insulating layers and conductor circuits are formed and layered on both sides thereof; or it may not have a substrate as a base and may have a structure (coreless structure) where insulating layers and conductor circuits are formed and layered.

The following description will discuss the substrate for mounting an IC chip according to the embodiments of the first aspect of the present invention citing the embodiment in which insulating layers and conductor circuits are formed and layered on both sides of a substrate.

In the substrate for mounting an IC chip according to the embodiments of the first aspect of the present invention, as described above, in the case where the above described solder resist layer is formed as the outermost layer, an optical element sealing layer is formed on this solder resist layer so as to make contact with the periphery of the optical element, and a gap at the bottom of the optical element (gap between the bottom surface of the optical element and the surface of the solder resist layer) is formed so as not to be opened outside.

As the material of the above described optical element sealing layer, a thermosetting resin, a photosensitive resin, resin where a photosensitive group is added to a portion of a thermosetting resin, or a resin composite which comprises, as a resin component, a resin compound which includes these, a thermoplastic resin and the like, for example, can be used. The use of these enables optical elements to be sealed without fail.

With regard to the above described thermosetting resin, an epoxy resin, a phenolic resin, a polyimide resin, a polyester resin, a bismaleimide resin, a polyolefin based resin, a polyphenylene ether resin, a polyphenylene resin, a fluorine resin and the like can be cited as examples.

With regard to the specific examples of the above described epoxy resin, a novolac type epoxy resin such as a phenol novolac type and a cresol novolac type, a dicyclopentadiene-modified alicyclic epoxy resin and the like can be cited.

An acrylic resin and the like can be cited as an example of the above described photosensitive resin.

In addition, with regard to the resin where a photosensitive group is added to a portion of the above described thermosetting resin, a resin gained by making the thermosetting group of any of the above described thermosetting resins and methacrylic acid or acrylic acid react with each other in order to bring about acrylic conversion, and the like can be cited.

With regard to the above described thermoplastic resin, a phenoxy resin, polyether sulfone (PES), polysulfone (PSF), polyphenylene sulfone (PPS), polyphenylene sulfide (PPES), polyphenylene ether (PPE), polyether imide (PI) and the like can be cited as examples.

In addition, particles are desirably included in the above described optical element sealing layer.

In the case where particles are included, the thixotropy ratio of a resin composite for forming the optical element sealing layer may be adjusted more easily and a property suitable for applying a resin composite to the periphery of an optical element may be given more easily, by adjusting a particle diameter and the amount of the mixed particles.

In addition, since the amount of the mixed particles is more likely to adjust the coefficient of thermal expansion in the case where particles are mixed, the matching of the coefficient of thermal expansion tends to be achieved between the optical element sealing layer and the substrate for mounting an IC chip or the optical element.

With regard to the above described particles, inorganic particles, resin particles, metal particles and the like can be cited as examples.

With regard to the above described particles, particles comprising aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate and talc, silicon compounds such as silica and zeolite, titanium compounds such as titania, and the like can be cited as examples. These may be used alone, or two or more kinds may be used together.

In addition, particles having a mixed component where at least two kinds of inorganic materials are mixed or melted together may be used.

With regard to the above described resin particles, particles comprising, for example, a thermosetting resin, a thermoplastic resin or the like can be cited, and specifically, particles comprising an amino resin (such as a melamine resin, a urea resin or a guanamine resin), an epoxy resin, a phenolic resin, a phenoxy resin, a polyimide resin, a polyphenylene resin, a polyolefin resin, a fluorine resin and a bismaleimide-triazine resin and the like can be cited as examples. These may be used alone, or two or more kinds may be used together.

With regard to the above described metal particles, particles comprising gold, silver, copper, tin, zinc, a stainless steel, aluminum, nickel, iron and lead and the like can be cited as examples. These may be used alone, or two or more kinds may be used together.

The surface layer of the above described metal particles is desirably coated with resin or the like in order to secure insulating properties.

From among these, inorganic particles comprising alumina, silica, or titania are particularly desirable. It is because mixing is easy and the coefficient of thermal expansion and the like tend to be adjusted.

In addition, an optical element sealing layer having low stress is desirable so as to be more easily adapted to the curvature of the substrate for mounting an IC chip.

In the case where the above described optical element sealing layer is formed, the lower limit of the viscosity of the resin composite used as a material is desirably about 100 Pa·s, and the upper limit thereof is desirably about 1000 Pa·s.

This is because, since the fluidity of the resin composite does not become too high in the case where the viscosity thereof is about 100 Pa·s or more, it may become easier to seal only the part of the desired portion around the optical element; whereas in the case where the viscosity thereof is 1000 Pa·s or less, the resin composite does not become too hard and more easily adheres to the peripheral portion, and a portion which cannot be completely sealed tends not to occur. A more desirable lower limit is about 200 Pa·s, and a more desirable upper limit is about 500 Pa·s.

Now, the above described viscosity is a value measured with a BH type viscometer.

In the case where the above described particles are included in the above described optical element sealing layer, the lower limit of the amount of the mixed particles is desirably about 70% by weight, and the upper limit thereof is desirably about 85% by weight.

This is because it may become easier to give the above described desirable viscosity (about 100 Pa·s) in the case where the amount of the mixed particles is about 70% by weight or more; whereas the resin composite does not become too hard and more easily adheres to the peripheral portion, and a portion which cannot be completely sealed tends not to occur in the case where the amount of the mixed particles is 85% by weight or less.

In the case where the above described particles are included in the above described optical element sealing layer, a particle diameter thereof is desirably at least about 1 μm and at most about 500 μm, and the average particle diameter is desirably at least about 10 μm and at most about 100 μm. It is more desirable to satisfy both ranges. Here, a particle diameter means a length of a longest particle.

In the case where the above described particle diameter is about 1 μm or more or the average particle diameter is 10 μm or more, the fluidity of a resin composite does not become too high; whereas in the case where the above described particle diameter is about 500 μm or less or the above described particle diameter is about 100 μm or less, a viscosity tends to be stable.

In addition, in the case where the above described optical element sealing layer is formed, the lower limit of the thixotropy ratio of the resin composite used as a material is desirably about 1.5, and the upper limit is desirably about 5.0.

In the case where the thixotropy ratio thereof is about 1.5 or more, the fluidity of a resin composite does not become too high; whereas in the case where it is about 5.0 or less, the fluidity of the resin composite does not become too low.

A more desirable lower limit is about 1.5, and a more desirable upper limit is about 3.0. This is because within this range it is especially appropriate for applying a resin paste.

Now, the above described thixotropy ratio is a value measured with a BH type viscometer.

The above described optical element sealing layer can be formed by potting the uncured resin composite, and then carrying out a hardening process and the like.

Here, in the case where the above described optical element sealing layer is formed by potting, only if this optical element sealing layer is formed so as to make contact with the periphery of an optical element, it may be formed so as to cover the optical element.

In addition, in a substrate for mounting an IC chip according to the embodiments of the first aspect of the present invention, since an IC chip is to be usually mounted on the same side as the side on which an optical element is mounted, the above described optical element sealing layer may be formed so as to integrally cover this IC chip and the above described optical element after an IC chip is mounted. It is because formation of the optical element sealing layer is easy, and in particular easy in the case where the mounting position of the optical element is adjacent to that of an IC chip.

In addition, in a substrate for mounting an IC chip according to the embodiments of the first aspect of the present invention, a gap part is desirably formed in the gap between the bottom surface of the above described optical element and the surface of the above described solder resist layer, more specifically, the portion between the above described optical path for transmitting an optical signal and the bottom surface of the above described optical element.

That is, desirably, the optical element sealing layer is not formed in the portion between the above described optical path for transmitting an optical signal and the bottom surface of the above described optical element.

In the following, the reason for this is briefly described.

The first reason is that in the case where an optical element sealing layer is formed in the entirety of the gap between the bottom surface of an optical element and the surface of a solder resist layer, high-speed transmission of an optical signal is difficult when the transmittance of this optical element sealing layer is low, and especially in the case where particles are mixed so as to adjust the coefficient of thermal expansion, the transmittance of the optical element sealing layer drops to about 75%/mm to about 85%/mm, and thereby high-speed transmission of an optical signal becomes more difficult, even if the transmittance of a resin component is about 90%/mm or more.

In addition, since an index of refraction of an optical element sealing layer may change with temperature, the transmission performance of an optical signal sometimes falls in the case where an index of refraction of the optical element sealing layer changes at the time of use.

In addition, in the case where the optical element sealing layer is formed in the entirety of the gap between the bottom surface of the optical element and the surface of the solder resist layer, a void tends to be easily formed in the central portion of this optical element sealing layer, and the size thereof tends not to be usually constant. Thus, since in some cases a void is formed and in other cases not, and furthermore, an optical signal is refracted in the void portion when the size of the void formed is different, it may become difficult to constantly transmit an optical signal in the predetermined direction, and thereby, the transmission loss of the optical signal may become large, or it may become impossible to transmit an optical signal.

The second reason is that in a substrate for mounting an IC chip according to the embodiments of the first aspect of the present invention, since as described above, diffusion of transmission light tends to be suppressed and an optical signal tends to be more certainly transmitted, a micro lens may be provided on the optical element or the optical path for transmitting an optical signal, and particularly desirably, a gap part is formed in the portion between the above described optical path for transmitting an optical signal and the bottom surface of the above described optical element when a micro lens is provided.

It is because, in the case where light is generally condensed using a micro lens, the larger the difference between an index of refraction of a micro lens and an index of refraction of the periphery thereof tends to be, the shorter the condensing distance can be. Then, when a micro lens is made of resin, an index of refraction is about 1.4 to at most about 1.6, and when a micro lens is made of glass, an index of refraction is about 1.8. Accordingly, in terms of enlarging the difference between an index of refraction of a micro lens and an index of refraction of the periphery thereof, it is more desirable for a gap part (for example, an air layer with an index of refraction of 1.0) than for the optical element sealing layer to be formed in the portion between the above described optical path for transmitting an optical signal and the bottom surface of the above described optical element.

In addition, when the difference between an index of refraction of a micro lens and an index of refraction of the periphery of the micro lens is short, in order for transmission light to be condensed, a radius of curvature of the micro lens needs to be made short. However, when a radius of curvature of a micro lens is made large, the permissible value of the location for formation becomes small, and transmission loss becomes large due to a small positional error. On the other hand, as above described, when the difference between an index of refraction of a micro lens and an index of refraction of the periphery of the micro lens is large (that is, a gap part is formed in the portion between the above described optical path for transmitting an optical signal and the bottom surface of the above described optical element), since transmission light tends to be condensed, the permissible value of the location for formation of a micro lens becomes large, and thereby transmission loss tends to be made small, even if the radius of curvature of a micro lens is small.

As a method for keeping the above described uncured resin composite from flowing into the gap between the above described optical element and the above described solder resist layer, for example, a method for setting a viscosity of the resin composite, used when forming the above described optical element sealing layer, at a predetermined viscosity, a method for mixing particles with a bigger particle diameter than the distance of the gap between above described optical element and the above described solder resist layer, a method for carrying out a surface treatment, which can prevent the uncured resin composite from flowing in the above described gap beforehand, on the surface of the solder resist layer near directly under the outer periphery of the above described optical element, and the like can be cited.

As a method for making the viscosity of the above described uncured resin composite high, for example, a method of increasing the amount of the mixed particles which are mixed in a resin composite and the like can be cited.

In addition, in the case where particles with a larger particle diameter than the distance of the gap between the above described optical elements and the above described solder resist layer are mixed, it is necessary to properly determine the distance of the above described gap, considering that the distance of the above described gap is usually about 30 µm to about 100 µm and that the distance of the above described gap in the case of using an optical element of a flip chip mounting type is about 50 µm, which is a distance often used in general.

In addition, as the above described surface treatment which is carried out on the predetermined portion of the surface of the above described solder resist layer beforehand, a water repellent coating and the like can be cited as an example.

In addition, the following results were obtained when the resin which is especially suitable for forming the above described optical element sealing layer was examined.

That is, each of the resin composite A to C was applied with a dispenser to an end portion of two sheets of glass plates which was arranged so that the gap is set to 50 µm or 300 µm with a spacer. The distance in which the end portion of the two sheets of glass plates entered the gap of the glass plate was observed by cutting this glass plate crosswise after hardening this resin composite, and the fluidity of the resin composite was evaluated by the above described distance entered.

Here, a resin composite with a viscosity of 235 Pa·s and a thixotropy ratio of 1.7, in which 75% by weight of silica with a particle diameter of 1 µm to 100 µm and an average particle diameter of 25 µm was mixed with an epoxy based resin component, was used as resin A, a resin composite (CCN 800, made by Kyushu Matsushita Electric Co., Ltd.) with a viscosity of 12 Pa·s and a thixotropy ratio of 1.1, in which particles with a maximum particle diameter of 30 µm or less were mixed with an epoxy based resin component, was used as resin B, and a resin composite (EPA 521D, made by Kyushu Matsushita Electric Co., Ltd.) with a viscosity of 8 Pa·s and a thixotropy ratio of 1.3, in which particles with a maximum particle diameter of 20 µm or less were mixed with an epoxy based resin component, was used as resin C.

As a result, in the case where resin A was used, the fluidity (the distance in which the end portion of the two sheets of glass plates entered the gap of the glass plate) in a 50 µm gap was 1.0 mm to 2.0 mm, and the fluidity in a 300 µm gap was 4.0 mm to 5.0 mm. On the other hand, both when resin A was used and when resin B was used, both the fluidity in a 300 µm gap and the fluidity in a 50 µm gap were 40 mm or more.

When a glass substrate on one side (downsurface) was replaced with a copper clad laminate on whose surface layers comprising a resin composite for solder resist layers (RPZ1 made by Hitachi Chemical Co., Ltd.) were molded and the same study was made, the same results as in the case where two sheets of glass plates were used were obtained.

It became clear also from these results that the resin composite having the above described characteristics is suitable especially as an optical element sealing layer.

Now, in the substrate for mounting an IC chip according to the embodiments of the first aspect of the present invention, as described above, although it is desirable for a gap part to be formed in the above described portion where the optical path for transmitting an optical signal makes contact with the optical element, and for the optical element sealing layer not to be formed therein, and in some cases, for the optical element sealing layer to be formed in the portion where the optical path for transmitting an optical signal makes contact with the above described optical element depending on the case.

In the substrate for mounting an IC chip according to the embodiments of the first aspect of the present invention, when an optical path for transmitting an optical signal penetrates through a substrate and insulating layers, and furthermore, solder resist layers are formed, the optical path for transmitting an optical signal is provided so as to also penetrate through the solder resist layers.

In a substrate for mounting an IC chip of this kind according to the embodiments, an optical signal is more likely to be transmitted via the above described optical path for transmitting an optical signal.

In addition, by connecting the above described substrate for mounting an IC chip according to the embodiments with external substrates such as a substrate for a motherboard on which optical elements are mounted on one side and other optical parts (for example, an optical waveguide and the like) are formed on the other side by interposing solder and the like, information exchange between the optical element which is formed on the substrate for mounting an IC chip according to the embodiments of the first aspect of the present invention and the optical parts which is mounted on the above described external substrate is more likely to be carried out by an optical signal via an optical path for transmitting an optical signal.

A collective through hole structure, an individual through hole structure and the like can be cited as specific embodiments for the above described optical path for transmitting an optical signal. The specific structures of these are described in the following in reference to the drawings.

In addition, the above described optical path for transmitting an optical signal may only comprise a gap part, and part thereof may be filled in with a resin composite. Specifically, for example, the portion where the optical path for transmitting an optical signal penetrates through a substrate and insulating layers is filled in with the resin composite, and the portion where the optical path for transmitting an optical signal penetrates through a solder resist layers forms a gap and the like. Furthermore, the portion where the optical path for transmitting an optical signal penetrates through the above described substrate, the above described insulating layers, and the above described solder resist layer may be filled in with the above described resin composite.

It is because by filling in part or the entirety of the optical path for transmitting an optical signal with the resin composite, an optical waveguide, a micro lens, and the like become easy to form, leading to excellent reliability. Here, in a substrate for mounting an IC chip according to the embodiments of the first aspect of the present invention, the portion where the optical path for transmitting an optical signal penetrates through the substrate and insulating layers is desirably filled in with the resin composite, and the portion where the optical path for transmitting an optical signal penetrates through the solder resist layer is desirably formed of a gap part. In addition, as described below, a micro lens may be provided on the portion where the optical path for transmitting an optical signal penetrates through a solder resist layer.

It is because a micro lens can be provided on a gap part which penetrates through a solder resist layer, and the micro lens tends to be provided accurately.

In addition, a gap part is desirably formed in the above described portion between the optical path for transmitting an optical signal and the bottom surface of the optical element.

A resin component of the above described resin composite is not particularly limited as long as it has a little absorption in the wavelength band for communication, and a thermosetting resin, a thermoplastic resin, a photosensitive resin, a resin of which a portion of a thermosetting resin is converted to have photosensitivity and the like can be cited as examples.

Specifically, an epoxy resin, an UV curing epoxy resin, a polyolefin based resin, an acrylic resin such as PMMA (polymethyl methacrylate), deuterated PMMA or deuterated PMMA fluoride, a polyimide resin, such as polyimide fluoride, a silicone resin, such as a deuterated silicone resin, a polymer manufactured from benzocyclobutene, and the like can be cited as examples.

In addition, the above described resin composite may include particles, for example, resin particles, inorganic particles, metal particles or the like in addition to the above described resin component. The matching of the coefficient of thermal expansion is more likely to be achieved between the optical path for transmitting an optical signal and the substrate, the insulating layer or the solder resist layer by including these particles, an index of refraction of light tends to be adjusted, and in addition, incombustibility also tends to be added depending on the kind of particles.

As the above described resin particles, particles comprising a thermosetting resin, a thermoplastic resin, a photosensitive resin, a resin where a portion of a thermosetting resin is made photosensitive, a resin compound of a thermosetting resin and a thermoplastic resin and a compound of a photosensitive resin, a thermoplastic resin and the like can be cited.

Specifically, for example, particles comprising: a thermosetting resin such as an epoxy resin, a silicone resin, a phenolic resin, a polyimide resin, a bismaleimide resin, a polyphenylene resin, a polyolefin resin and a fluorine resin; a resin in which the thermosetting group of such a thermosetting resin (for example, the epoxy group in an epoxy resin) is reacted with methacrylic acid, acrylic acid, or the like, and which is added to the acrylic group; a thermoplastic resin such as a phenoxy resin, polyether sulfone (PES), polysulfone (PSF), polyphenylene sulfone (PPS), a polyphenylene sulfide (PPES), polyphenylene ether (PPE), and polyether imido (PI); a photosensitive resin such as an acrylic resin, and the like can be cited.

In addition, particles comprising a resin compound of the above described thermosetting resin and the above described thermoplastic resin, a resin having the above described acrylic groups, or a resin compound of the above described photosensitive resin, the above described thermoplastic resin and the like can also be used.

With regard to the above described particles, resin particles comprising rubber can be used.

In addition, with regard to the above described inorganic particles, particles comprising aluminum compounds such as alumina and aluminum hydroxide, calcium compounds such as calcium carbonate and calcium hydroxide, potassium compounds such as potassium carbonate, magnesium compounds such as magnesia, dolomite and basic magnesium carbonate, silicon compounds such as silica and zeolite, titanium compounds such as titania, and the like can be cited as examples. In addition, phosphorus or phosphorus compounds can be used as the above described inorganic particles. In addition, particles having a mixed component where at least two kinds of inorganic materials are mixed or melted together may be used.

With regard to the above described metal particles, particles comprising gold, silver, copper, palladium, nickel, platinum, iron, zinc, lead, aluminum, magnesium, calcium, and the like can be cited as examples.

In addition, these resin particles, inorganic particles or metal particles may be solely used or two or more kinds may be used together.

From among these, inorganic particles comprising alumina, silica, or titania are particularly desirable. It is because mixing is easy and the coefficient of thermal expansion and an index of refraction tend to be adjusted.

In addition, the form of the above described resin particles is not particularly limited, and sphere, elliptical sphere, rubble and polyhedron and the like can be cited. Among these, sphere or elliptical sphere is desirable. It is because, since there is no corner in particles, it is harder for cracks and the like to occur in a resin composite with which an optical path for transmitting an optical signal is filled in.

In addition, a particle diameter of the above described particles (the longest portion of the particles) is desirably smaller than the wavelength for communication. This is because in the case where a particle diameter is greater than the wavelength for communication, transmission of an optical signal may sometimes be obstructed.

In addition, the lower limit of the average particle diameter of the above described particles is desirably about 0.01 µm, more desirably about 0.1 µm, and most desirably about 0.2 µm. Meanwhile, the upper limit of the average particle diameter of the above described particles is desirably about 0.8 µm, and more desirably about 0.6 µm. Within this range of particle diameter, particles with two or more different particle diameters can be contained. Here, in the present specification, the particle diameter means the length of the longest portion of a particle.

The lower limit of the amount of the mixed particles contained by the above described resin composite is desirably about 10% by weight and the upper limit is desirably about 50% by weight. This is because in the case where the amount of the mixed particles is about 10% by weight or more, the effects of mixing particles may be gained more easily; while in the case where the amount of the mixed particles is 50% by weight or less, it may become easier for the optical path for transmitting an optical signal to be filled in with the resin. The more desirable lower limit of the amount of the mixed particles is about 20% by weight and the more desirable upper limit of the amount of the mixed particles is about 40% by weight.

In addition, in the substrate for mounting an IC chip according to the embodiments of the first aspect of the present invention, when the portion where the above described optical path for transmitting an optical signal penetrates through the substrate and the insulating layers is filled in with a resin composite, the cross-sectional diameter of the portion where the above described optical path for transmitting an optical signal penetrates through the above described solder resist layer may be smaller than that of the portion which is formed in the above described substrate and the above described insulating layers.

It is because, in the case where the cross-sectional diameter of the portion where the optical path for transmitting an optical signal penetrates through solder resist layers is smaller than that of the portion where the optical path for transmitting an optical signal penetrates through a substrate and insulating layers, the portion where an optical path for transmitting an optical signal penetrates through insulating layers and the boundary portion with a resin composite get covered up with part of the above described solder resist layers, the above described boundary portion and the outer periphery of the above described resin composite are adhered to by the above described solder resist layers, and as a result, it becomes unlikely for separations (peeling) and cracks to occur, leading to excellent reliability.

In addition, the specific value of the cross-sectional diameter of the portion where the above described optical path for transmitting an optical signal penetrates through the solder resist layers is not specifically limited if it is smaller than the cross-sectional diameter of the portion which is formed in the above described substrate and the above described insulating layers, and it is necessary to properly choose it according to the design of a substrate for mounting an IC chip. However, it is usually desirably at least about 50 μm and at most about 490 μm.

In addition, conductor layers may be formed on the wall surface of the above described optical path for transmitting an optical signal.

Diffused reflection of light from the wall surface of the optical path for transmitting an optical signal tends to be reduced and the transmissivity of the optical signal tends to be increased by forming a conductor layer as described above. The above described conductor layer may be formed of one layer, or may be formed of two or more layers.

As the material of the above described conductor layer, copper, nickel, chromium, titanium, noble metals, and the like can be cited as examples.

In addition, the above described conductor layers is more likely to play a role as through holes, namely a role in electrically connecting conductor circuits which sandwich a substrate with each other or conductor circuits which sandwich a substrate and insulating layers with each other.

In addition, the above described conductor layers may be formed of glossy metal (for example, gold, silver, nickel, platinum, aluminum, rhodium and the like). It is because an optical signal will be suitably reflected on the wall surface of an optical path for transmitting an optical signal and it will become unlikely for the attenuation of signal strength and the like to occur, in the case where the conductor layers comprising such glossy metal are formed.

Furthermore, the surface of the conductor layer itself may be roughened by an etching process and the like.

In addition, a coating layer and a coarse layer which comprise tin, titanium, zinc, and the like may be provided on the above described conductor layer. By providing the above described coating layer and the above described coarse layer, the adhesiveness of an optical path for transmitting an optical signal to a substrate and an insulating layer is more likely to be increased.

In addition, the portion where the optical path for transmitting an optical signal which is filled in with the above described resin composite penetrates through the substrate and the insulating layers, and the above described conductor layers may be in contact with the substrate or the insulating layers via the coarse surface. It is because it excels in adhesiveness to the substrate and the insulating layers and separations (peeling) of an optical path for transmitting an optical signal and the like tend not to occur when the above described optical path for transmitting an optical signal and the like is in contact via the coarse surface.

Optical elements such as a light receiving element and a light emitting element are mounted on a substrate for mounting an IC chip according to the embodiments of the first aspect of the present invention.

A PD (photodiode), an APD (avalanche photodiode) and the like can be cited as examples of the above described light receiving element.

These can be used in different applications, taking the configuration and required properties and the like of the above described substrate for mounting an IC chip into consideration.

Si, Ge, InGaAs, and the like can be cited as the material of the above described light receiving element.

From among these, InGaAs is desirable from the point of view of having excellent photosensitivity.

An LD (laser diode), a DFB-LD (distributed-feedback laser diode), an LED (light emitting diode), an infrastructure or oxide-confinement VCSEL (vertical cavity surface emitting laser) and the like can be cited as examples of the above described light emitting element.

These can be used in different applications, taking the configuration and required properties of the above described substrate for mounting an IC chip into consideration.

With regard to the material of the above described light emitting element, a compound of gallium, arsenic and phosphorous (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorous (InGaAsP) and the like can be cited.

These may be used in different applications, taking the wavelength for communication into consideration, and in the case where the wavelength for communication is, for example, a band of 0.85 μm, GaAlAs can be used, and in the case where the wavelength for communication is a band of 1.31 μm or a band of 1.55 μm, InGaAs and InGaAsP can be used.

Here, each of these light receiving elements and light emitting elements may be a one-channel or multi-channel array element.

The mounting position of the above described optical element is desirably located on the surface of the above described substrate for mounting an IC chip. As described above, it is because in the case where the optical element is mounted on the surface of the substrate for mounting an IC chip, it is necessary to replace only the optical element when an inconvenience occurs in one optical element.

In addition, electronic parts such as a capacitor are desirably mounted on the surface of the above described substrate for mounting an IC chip. It is because only the defective parts can be replaced in the same manner as in the case of the above described optical element.

In addition, in the above described substrate for mounting an IC chip according to the embodiments, a micro lens may be provided on the above described optical path for transmitting an optical signal. This is because when a micro lens is provided, transmission light tends to be condensed through a micro lens, and thereby, it may become easier to reduce the transmission loss of an optical signal.

Specifically, for example, in the case where the portion where an optical path for transmitting an optical signal penetrates through a substrate, insulating layers, and solder resist layers is filled in with a resin composite, a micro lens may be provided on an end portion of the resin composite directly or with an adhesive in between; and in the case where the portion where an optical path for transmitting an optical signal penetrates through a substrate and insulating layers is filled in with a resin composite and the portion where a solder resist layer penetrates through a gap is not filled in with a resin composite, a micro lens may be provided on an end portion of the resin composite and at the same time on the portion where the above described optical path for transmitting an optical signal penetrates through the solder resist layer.

In addition, a micro lens may be provided on the light receiving portion of the mounted light receiving element, and the light emitting portion of the light emitting element.

The above described micro lens is not particularly limited and any micro lens used as an optical lens can be cited, and with regard to the specific examples of the material thereof, optical glass, resins for an optical lens and the like can be cited. With regard to the above described resins for an optical lens, the same materials as the polymer material, such as an acrylic resin and an epoxy resin, which are described as the resin composite with which the above described optical path for transmitting an optical signal is filled in, can be cited as examples.

An index of refraction of the above described micro lens is not particularly limited and may be approximately the same as or larger than an index of refraction of the above described resin composite with which the above described optical path for transmitting an optical signal is filled in.

In the case where an index of refraction of the above described micro lens is approximately the same as an index of refraction of the above described optical path for transmitting an optical signal, an optical signal tends to be transmitted more certainly because a reflection of an optical signal does not occur in both interfaces. In the case where an index of refraction of the above described micro lens is larger than an index of refraction of the above described optical path for transmitting an optical signal, an optical signal tends to be transmitted more certainly because the optical signal tends to be more condensed in the desired direction.

In addition, with regard to the form of the above described micro lens, a convex lens having a convex surface only on one side and the like can be cited as an example and in this case the radius of curvature of the above described convex surface of the lens can be appropriately selected taking the design of the optical path for transmitting an optical signal and the like into consideration. Specifically, in the case where it is necessary to make the focal distance long, for example, it is desirable to make the radius of curvature large, while in the case where it is necessary to make the focal distance short, it is desirable to make the radius of curvature small. However, as described above, the radius of curvature is desirably short in terms of increasing a permissible value of the location for formation of a micro lens.

Here, the form of the above described micro lens is not limited to a convex lens, and any form which is more likely to condense an optical signal in a desired direction may be used.

The above described micro lens desirably have a transmittance for light having a wavelength for communication of about 70%/mm or more.

It is because, in the case where the transmittance for light having a wavelength for communication is about 70%/mm or more, the loss of the optical signal tends not to be great, which tends not to lead to lowering of transmissivity of the optical signal. The above described transmittance is more desirably about 90%/mm or more.

Here, in the present specification, the transmittance of light having a wavelength for communication is a transmittance of light having a wavelength for communication per 1 mm in length. Specifically, this is the value that can be calculated through the following formula (1) in the case where light having a power of $I_1$ enters a micro lens, passes through a micro lens by 1 mm, and comes out with a power of $I_2$ in light.

$$\text{Transmittance}(\%) = (I_2/I_1) \times 100 \quad (1)$$

Here, the above described transmittance is a transmittance measured at room temperature of 25° C.

In addition, the above described micro lens may include particles such as resin particles, inorganic particles, metal particles or the like.

This is because the strength of the micro lens can be increased so that the form can be maintained without failure by including particles and the coefficient of thermal expansion tends to be matched between the micro lens and the above described substrate for mounting an IC chip, and thus, it may become unlikely for cracks and the like to occur due to the difference in the coefficient of thermal expansion.

In the case where the above described micro lens includes particles, the index of refraction of a resin component of the micro lens and the index of refraction of the above described particles are desirably approximately the same. Therefore, the particles included in the micro lens are desirably a mixture of particles of two or more kinds having different indices of refraction so that the index of refraction of the particles becomes approximately the same as the index of refraction of the resin component.

Specifically, in the case where the resin component is an epoxy resin having an index of refraction of 1.53, for example, the particles included in the micro lens are desirably particles which are gained by mixing and melting silica particles having an index of refraction of 1.46 and titania particles having an index of refraction of 2.65.

Here, with regard to the method for mixing particles, a method for kneading particles and a method for melting and mixing two or more kinds of particles and afterward, converting the mixture into particle form, and the like can be cited.

Here, the same kinds of particles as those added to the above described resin composite can be cited as specific examples of the above described particles.

In addition, the form of the above described resin particles is not particularly limited, and sphere, elliptical sphere, rubble, polyhedron and the like can be cited. Among these, sphere or elliptical sphere is desirable. It is because, since there is no corner in particles of sphere or elliptical sphere, it is harder for cracks and the like to occur in a micro lens.

Furthermore, in the case where the form of the above described particles is sphere or elliptical sphere, it is difficult for light to be reflected on the particles, and the transmission loss of an optical signal is reduced.

In addition, though the particles diameter (maximum length of particles) of the above described particles is not particularly limited, the upper limit thereof is desirably about 0.8 μm and the lower limit thereof is desirably about 0.01 μm.

The above described micro lens is usually provided using an inkjet apparatus, a dispenser or the like, and this is because about 20 μm is the smallest size at present for the inner diameter of the application nozzle of inkjet apparatuses and the inner diameter of the nozzle of dispensers, and thus, application is more likely to be carried out without the nozzle being clogged in the case where the particle diameter is within the above described range.

In addition, the lower limit of the above described particle diameter is more desirably about 0.1 μm.

This is because the above described particle diameter is more desirably within this range from the points of view of stability in the viscosity for the application by means of inkjet apparatuses, dispensers or the like, and inconsistency in the applied amount.

A desirable lower limit of the amount of mixed particles included in the above described micro lens is about 5% by weight, and a more desirable lower limit is about 10% by weight. Meanwhile, a desirable upper limit of the above described amount of mixed particles is about 60% by weight and a more desirable upper limit is about 50% by weight. This is because, in the case where the amount of mixed particles is about 5% by weight or more, the effects of mixing particles tend to be gained; whereas in the case where the amount of mixed particles is about 60% by weight or less, transmission of an optical signal tends not to be obstructed.

Though the above described micro lenses may be directly provided on an end portion of the resin composite or may be provided by using an optical adhesive.

The above described optical adhesive is not particularly limited and optical adhesives such as an epoxy resin based adhesive, an acrylic resin based adhesive and a silicone resin based adhesive can be used.

The properties of the above described optical adhesive are desirably a viscosity of about 0.2 Pa·s to about 1.0 Pa·s, an index of refraction of about 1.4 to about 1.6, an optical transmittance of about 80%/mm or more and a coefficient of thermal expansion (CTE) of about $4.0 \times 10^{-5}$ to about $9.0 \times 10^{-5}$ (/° C.).

In addition, the thickness of the above described optical adhesive is desirably about 50 μm or less.

In addition, a surface treatment may be carried out on the region where the above described micro lenses are provided.

When resin for forming micro lenses is applied by means of an inkjet apparatus or the like, though the form of a micro lens, in particular the degree of sagging, easily becomes uneven due to the inconsistent conditions for the process up to the formation of the solder resist layer and due to the inconsistent wettability of the portions on which micro lenses are provided which is caused by the difference in time during which the resin is left, the unevenness in the degree of sagging is more likely to be reduced by carrying out a surface treatment using a water repellent coating agent, and the like.

With regard to the above described surface treatment, a process using a water repellent coating agent such as a fluorine based polymer coating agent (surface tension: about 10 mN/m to about 12 mN/m), a water repellent process using $CF_4$ plasma and a hydrophilic process using $O_2$ plasma and the like can be cited as examples.

A specific method for the surface treatment described above is briefly described.

In the case where a process is carried out using a water repellent coating agent as described above, first, a mask having an opening in a portion which corresponds to the portion where the micro lens of a substrate for mounting an IC chip is to be formed is provided, after which a water repellent coating agent is applied through spraying or using a spin coater, and afterward, the water repellent coating agent is naturally dried and the mask is peeled off, and thereby, the surface treatment is completed. Here, the thickness of the water repellent coating agent layer is usually about 1 μm.

Here, a mesh plate or a mask where a resist is formed may be used.

Here, in the case where a process is carried out using a water repellent coating agent, a process using a water repellent coating agent may be carried out on the entirety of the exposed portion including the wall surface of the solder resist layer without using a mask. It is because the effects of a dam tend to be achieved when a solder resist layer forms a micro lens.

In addition, in the case where a water repellent process is carried out using $CF_4$ plasma as described above, first, a mask having an opening in a portion which corresponds to the portion of the substrate for mounting an IC chip where the micro lens is to be formed is provided, after which a $CF_4$ plasma process is carried out, and furthermore, the mask is peeled off, and thereby, the surface treatment is completed. Here, a mask where a resist is formed may be used.

In addition, in the case where a hydrophilic process is carried out using the above described $O_2$ plasma, first, a mask having an opening in a portion which corresponds to the portion of the substrate for mounting an IC chip where the micro lens is to be formed is provided, after which an $O_2$ plasma process is carried out, and furthermore, the mask is peeled off, and thereby, the surface treatment is completed. Here, a metal plate or a mask where a resist is formed may be used.

In addition, it is desirable to carry out the above described water repellent process (including a process using a water repellent coating agent) and a hydrophilic process in combination.

Here, in the present specification, the degree of sagging of a micro lens means the height in portions which protrude from the surface of the solder resist layer. Here, in the case where the solder resist layer is not formed on the substrate for mounting an IC chip, it means the height in portions which protrude from the surface of the outermost layer.

In addition, in the substrate for mounting an IC chip according to the embodiments of the first aspect of the present invention, a solder resist layer is formed as an outermost layer. The lower limit of a thickness of the solder resist layer is desirably about 10 μm, and more desirably about 15 μm. On the other hand, the upper limit thereof is desirably about 40 μm, and more desirably about 30 μm.

In addition, in the substrate for mounting an IC chip according to the embodiments of the first aspect of the present invention, conductor circuits which sandwich the above described substrate to be connected via through holes and for conductor circuits which sandwich the above described insulating layer are desirably connected through via holes. This is because miniaturization of the device for optical communication may be achieved more easily while increasing the density of wires of the substrate for mounting an IC chip.

Next, a substrate for mounting an IC chip according to the embodiments of the first aspect of the present invention is described in reference to the drawings.

FIG. 1A is a cross-sectional view which schematically illustrates one embodiment of a substrate for mounting an IC chip according to the first aspect of the present invention, and FIG. 1B is a partial enlarged sectional view which schematically illustrates part of another embodiment of a substrate for mounting an IC chip according to the first aspect of the present invention. Here, FIG. 1A illustrates a substrate for mounting an IC chip with an IC chip mounted thereon.

As illustrated in FIGS. 1A and 1B, in a substrate for mounting an IC chip 120 according to one embodiment of the first aspect of the present invention, conductor circuits 124 and insulating layers 122 are formed and layered on both sides of a substrate 121, and conductor circuits which sandwich the substrate 121 are electrically connected to each other through a through hole 129, and conductor circuits which sandwich an insulating layer 122 are electrically connected to each other through via holes 127. In addition, solder resist layers 134 are formed as outermost layers.

In this substrate for mounting an IC chip 120, the optical path for transmitting an optical signal 142 is formed so as to penetrate through the substrate 121, the insulating layer 122, and the solder resist layer 134.

In an optical path for transmitting an optical signal 142, the portion where the optical path for transmitting an optical signal penetrates through a substrate 121 and insulating layers 122 is filled in with a resin composite 142a, conductor layers are formed on the periphery of this resin composite 142a, and in addition, a micro lens 149 is provided on the portion where the optical path for transmitting an optical signal penetrates through solder resist layers 134.

The input and output signals of an optical element (a light emitting element 138 and a light receiving element 139) which are mounted on a substrate for mounting an IC chip 120 is transmitted via an optical path for transmitting an optical signal 142.

Here, the portion where the optical path for transmitting an optical signal penetrates through the solder resist layers may be formed of a gap 142b, as illustrated in FIGS. 1A and 1B, or may be filled in with a resin composite. In addition, conductor layers 145 do not need to be formed on the periphery of the portion where the optical path for transmitting an optical signal penetrates through the substrate 121 and the insulating layers 122, and furthermore, as illustrated in FIGS. 1A and 1B, the conductor layers 145 may be formed of one layer, or may be made of two or more layers.

On one side of a substrate for mounting an IC chip 120, the light emitting element 138 and the light receiving element 139 are mounted on the surface by interposing solder connection portions 144, and furthermore, an IC chip 140 is mounted on the surface by interposing solder connection portions 143 so that each of the light emitting portion 138a and the light receiving portion 139a face the optical path for transmitting an optical signal 142.

In addition, on one side of solder resist layers 134, an optical element sealing layer 148 is formed so as to make contact with each of the periphery of the light emitting element 138 and the light receiving element 139, and the gap part is formed in the portion between the bottom surface of the light emitting element 138 and the light receiving element 139 and the optical path for transmitting an optical signal. Accordingly, the optical element sealing layer 148 is not formed in the portion between the optical path for transmitting an optical signal and the bottom surface of the light receiving element 138 and the light receiving element 139.

Since an optical element sealing layer 148 of this kind is formed, dust, foreign matter, or the like tends not to intrude inside or on the optical path for transmitting an optical signal 142, and thereby, transmission of an optical signal tends not to be obstructed for lack of this dust, foreign matter, or the like.

In addition, solders bumps 137 are formed at the solder resist layer 134 on the other side of the substrate for mounting an IC chip 120.

In the substrate for mounting an IC chip 120 comprising such a configuration, the optical signal sent from the outside via an optical fiber, an optical waveguide and the like (not illustrated) is converted into electrical signals in the light receiving element 139 after being received in the light receiving element 139 (light receiving portion 139a) via the optical path for transmitting an optical signal 142, and furthermore, is sent to an IC chip 140 via the solder connection portions 143, 144, the conductor circuit 124, via holes 127, and through holes 129 and the like.

In addition, the electrical signal sent out from the IC chip 140 is converted into an optical signal in the light emitting element 138 after being sent to the light emitting element 138 via the solder connection portions 143, 144, the conductor circuit 124, the via holes 127, the through hole 129 and the like, and the optical signal sent from the light emitting element 138 (light emitting portion 138a) are sent out to external optical elements (an optical fiber, an optical waveguide, and the like) via the optical path for transmitting an optical signal 142.

In the substrate for mounting an IC chip according to the embodiments of the first aspect of the present invention, since optical/electrical signals are converted in a light receiving element and an light emitting element which are mounted in the vicinity of an IC chip, the transmission distance of an electrical signal is short, and it excels in the reliability of a signal transmission and tends to handle high-speed communication.

In addition, in the substrate for mounting an IC chip 120, since solder bumps 137 are formed at the solder resist layers 134 on the metal plating layer, an electrical signal sent out from the IC chip is, as described above, converted into an optical signal, and then, is not only sent to the outside via an optical path for transmitting an optical signal 142 and the like, but also transmitted to an external substrate via solder bumps 137.

In the case where the solder bumps are formed in such a manner, the above described substrate for mounting an IC chip can be connected to external substrates such as a substrate for a motherboard by interposing the solder bumps. In this case, the above described substrate for mounting an IC chip is more likely to be placed at a predetermined position by the self-alignment function of the solder.

Here, the above described self-alignment function means a function of solder which tends to exist in a stable form in the vicinity of the center of openings for forming solder bumps due to the liquidity of the solder itself at the time of reflow processing and this function presumably occurs because the solder is repelled by the solder resist layer and a strong surface tension works to make the solder in spherical form when the solder adheres to metal.

In the case where this self-alignment function is used, the above described substrate for mounting an IC chip moves at the time of reflow even when a positional error occurs before reflow between the above described substrate for mounting an IC chip and an external substrate at the time of connection of the two by interposing the above described solder bumps so that the substrate for mounting an IC chip tends to be mounted to the external substrate at the precise position.

Accordingly, in the case where an optical signal is transmitted between the light receiving element and light emitting element mounted on the above described substrate for mounting an IC chip and an external optical element via the optical path for transmitting an optical signal, the optical signal tends to be transmitted precisely between the above described substrate for mounting an IC chip and the above described external substrate only if the mounting position of the light receiving element and the light emitting element mounted on the above described substrate for mounting an IC chip is precise.

In addition, in a substrate for mounting an IC chip according to one embodiment of the first aspect of the present invention, as in a partial cross-sectional view illustrated in FIG. 1B, a dam 150 may be formed on the solder resist layer between the optical element 138 and the solder resist layer.

By forming the above described dam, the above described optical element sealing layer tends to be formed only in a desired portion on the solder resist layer.

Since the inflow of this optical element sealing layer into or on an optical path for transmitting an optical signal (right under a light receiving portion 138a of a light emitting element 138) is more likely to be prevented especially when forming the optical element sealing layer by potting, it is suitable that the dam is formed.

The above described dam can be formed by, for example, printing an epoxy resin, a silicone resin, an acrylic resin and the like, joining with an adhesive a frame-shaped substrate such as a glass epoxy substrate, a BT resin substrate, a polyimide substrate and the like which have been punched in a frame shape with a punching press machine or cut down in a frame shape in a router process, and the like. Here, considering the gap between an optical element and a solder resist layer is usually about 50 μm, it is desirable to form a dam by printing an epoxy resin, a silicone resin, an acrylic resin, and the like because formation thereof is easy.

In addition, the location for forming the above described dam is not particularly limited, and it is necessary to appropriately choose according to the design of a substrate for mounting an IC chip. For example, it may be formed inside the solder connection portion which connects a substrate for mounting an IC chip with an optical element, and at the same time outside an optical path for transmitting an optical signal (see FIG. 1B). In addition, it may be formed between a substrate for mounting an IC chip and an optical element, and at the same time outside a solder connection portion. Furthermore, part of the solder connection portion may be formed in such a position so as to make contact with the optical element sealing layer.

In addition, when the above described dam is formed, as the resin composite for forming an optical element sealing layer, it becomes possible to use the resin composite which has high fluidity; and the viscosity of the resin composite suitable for forming the optical element sealing layer, a maximum particle diameter and an average particle diameter of particles, the content of particles, and freedom of choice of a thixotropy ratio improve more. Specifically, the resin composite or the like which seals a conventionally well-known IC chip is more likely to be used suitably.

In addition, optical elements mounted on a substrate for mounting an IC chip according to the embodiments of the first aspect of the present invention, such as a light receiving element and a light emitting element, may not be limited to a one-channel optical element as illustrated in FIGS. 1A and 1B, but may be a multi-channel optical element.

In addition, when a multi-channel optical element is mounted, it is necessary to form an optical path for transmitting an optical signal (for example, an optical path for transmitting an optical signal in a collective through hole structure, or an optical path for transmitting an optical signal in an individual through hole structure) in accordance with the shape thereof. In the following, the substrate for mounting an IC chip with a multi-channel optical element mounted thereon is described in reference to the drawings.

In addition, in a substrate for mounting an IC chip according to the embodiments of the first aspect of the present invention, an optical element sealing layer formed is not specifically limited to an optical element sealing layer comprising a resin composite, and may comprise solder, for example. In the following, this is described in reference to FIG. 1C.

FIG. 1C is a partial cross-sectional view which schematically illustrates part of another example of the substrate for mounting an IC chip according to one embodiment of the first aspect of the present invention.

In the substrate for mounting an IC chip illustrated in FIG. 1C, a light emitting element 138 is mounted on the surface by interposing a solder connection portion 144 at a solder resist layer in the same manner as in a substrate for mounting an IC chip 120 illustrated in FIG. 1A.

In addition, on a solder resist layer 134, an optical element sealing layer 178 comprising solder which is formed so as to make contact with the periphery of the light emitting element 138. The optical element sealing layer 178 comprising this solder is soldered on a pad for forming an optical element sealing layer which is formed on an insulating layer 172. Therefore, an opening for forming the optical element sealing layer is provided in the solder resist layer 134.

In addition, a metal layer may be formed on the portion where the side of the light emitting element 138 makes contact with the optical element sealing layer in order to improve connectivity with the optical element sealing layer 178 comprising solder. In this case, it is because the periphery of the light emitting element 138 is more likely to be sealed with the optical element sealing layer 178. Here, it is necessary to form a metal layer with such methods as plating and vapor deposition.

Thus, in the substrate for mounting an IC chip according to the embodiments of the first aspect of the present invention, an optical element sealing layer may comprise solder. Of course, a gap part is desirably formed in the portion between the above described optical path for transmitting an optical signal and the bottom surface of the above described light emitting element (optical element).

In addition, in the case where an optical element sealing layer comprising solder is used as an optical element sealing layer, the periphery of the optical element is more likely to be made hermetically sealed, and in this case, gases other than air (nitrogen, argon, and the like) may be included in the gap part, and particularly desirably, the gas whose index of refraction is smaller than that of air (namely, about 1.0 or less) is included therein. It is because it is suitable especially for condensing an optical signal with a micro lens.

FIG. 2 is a cross-sectional view which schematically illustrates another embodiment of a substrate for mounting an IC chip according to the first aspect of the present invention.

As illustrated in FIG. 2, in a substrate for mounting an IC chip 220, conductor circuits 224 and insulating layers 222 are formed and layered on both sides of a substrate 221, and conductor circuits which sandwich the substrate 221 are electrically connected to each other through a through hole 229, and conductor circuits which sandwich the insulating layer 222 are electrically connected to each other through via holes 227. In addition, solder resist layers 234 are formed as outermost layers.

In this substrate for mounting an IC chip 220, the optical path for transmitting an optical signal 242 is provided so as to penetrate through the substrate 221, the insulating layer 222, and the solder resist layer 234.

This optical path for transmitting an optical signal 242 is filled in with a resin composite 247 in the portion where the optical path for transmitting an optical signal penetrates through the substrate 221 and the insulating layer 222. Then, the diameter of the portion where the optical path for transmitting an optical signal penetrates through the solder resist layer 234 is smaller than that of the portion where the optical path for transmitting an optical signal penetrates through the substrate 221 and the insulating layer 222.

Here, the portion where an optical path for transmitting an optical signal penetrates through the solder resist layer may be filled in with the resin composite. In addition, the conductor layer may be formed on the periphery of the above described resin composite.

On one side of a substrate for mounting an IC chip 220, a four-channel light receiving element 239 is mounted on the surface by interposing a solder connection portion 244, and furthermore, an IC chip 240 is mounted on the surface by interposing a solder connection portion 243 so that each of the receiving portion 239a to 239d faces the optical path for transmitting an optical signal 242.

In addition, on one side of solder resist layers 234, an optical element sealing layer 248 is formed so as to at least make contact with each of the periphery of the light receiving element 239, and a gap part is formed in the portion between the bottom surface of the light receiving element 239 and the optical path for transmitting an optical signal. Accordingly, the optical element sealing layer 248 is not formed in the portion between the bottom surface of the light receiving element 239 and the optical path for transmitting an optical signal.

Since an optical element sealing layer of this kind is formed, dust, foreign matter, or the like tends not to intrude inside or on the optical path for transmitting an optical signal 242, and thereby transmission of an optical signal tends not to be obstructed for lack of this dust, foreign matter, or the like.

In addition, solders bumps 237 are formed at the solder resist layer 234 on the other side of the substrate for mounting an IC chip 220.

Accordingly, an output signal from a four-channel light receiving element 239 can be transmitted via an optical path for transmitting an optical signal 242. Here, the optical path for transmitting an optical signal 242 is large enough in size to transmit an optical signal for four channels more easily, and is collectively formed so as to penetrate through a substrate 221, insulating layers 222, and solder resist layers 234.

Each of the four micro lens lenses 249a to 249d are provided on the side where a light receiving element 239 is mounted in this optical path for transmitting an optical signal 242, and each of the four micro lens lenses 246a to 246d are provided on an end portion of a resin composite 247 on the opposite side thereof and at the same time on the portion where this optical path for transmitting an optical signal 242 penetrates through the solder resist layer 234. Here, each of the micro lenses 249a to 249d, 246a to 246d are arranged in the positions corresponding to each of the channels 239a to 239d of the light receiving element 239.

Accordingly, an optical signal to the light receiving element 239 passes through the micro lenses 246 (246a to 246d), 249 (249a to 249d), and in this manner, the transmission loss of an optical signal may be reduced more easily by providing a micro lens on the portion where the optical path for transmitting an optical signal 242 penetrates through the solder resist layer.

In the substrate for mounting an IC chip 220 comprising such a configuration, the electrical signal transmitted via external optical parts (an optical fiber, an optical waveguide, and the like) will be transmitted to the light receiving element 239 (light receiving portion 239a) via micro lenses 246a to 246d, the optical path for transmitting an optical signal 242, and micro lenses 249a to 249d, and will be sent to an IC chip 240 via the solder connection portion 243, the conductor circuit 224, via holes 227, and the like and be processed after being converted to electrical signals in this light receiving element 239.

In addition, since in the substrate for mounting an IC chip 220, solder bumps 237 are formed at a solder resist layer 234 on a metal plating layer, electrical signals can be transmitted between an IC chip 240, external substrates, and the like via the solder bumps 237.

In the case where the solder bumps are formed in such a manner, the above described substrate for mounting an IC chip can be connected to external substrates such as a substrate for a motherboard by interposing the solder bumps, and in this case, the above described substrate for mounting an IC chip tends to be placed at a predetermined position by the self-alignment function of the solder.

In this manner, in the case where micro lenses are provided as an optical element in a substrate for mounting an IC chip on which the multi-channel array element (hereinafter, simply referred to as an array element) is mounted in the package substrate on which a multi channel optical element is mounted, the diameter of the micro lens may be appropriately determined in accordance with the pitch between the respective channels in the array element (the multi-channel array element) and in the case where an array element having a pitch of 250 µm is used, for example, the diameter is desirably at least about 100 µm and at most about 240 µm, and the diameter is more desirably in the range of about 180 µm to about 230 µm. In the case where the diameter is about 100 µm or more, a desired focal distance is more likely to be gained; whereas in the case where the diameter is 490 µm or less, adjacent micro lenses tend not to make contact with each other, and the micro lenses are more likely to be placed at predetermined positions.

In addition, in the case where an array element having a pitch of 500 µm is used, for example, the diameter is desirably at least about 100 µm and at most about 490 µm, and more desirably in the range of about 180 µm to about 480 µm. In the case where the diameter is about 100 µm or more, a desired focal distance is more likely to be gained; whereas in the case where the diameter is about 490 µm or less, adjacent micro lenses are more unlikely to make contact with each other, and the micro lenses may be placed more easily at predetermined positions.

In addition, with regard to the form of the optical path for transmitting an optical signal in the above described collective through hole structure, a round pillar, a rectangular pillar, a cylindroid shape, a form where a number of round pillars are aligned in parallel and portions of sides of adjacent round pillars are connected to each other, and a pillar form where the bottom is surrounded by a line and an arc, and the like can be cited as examples in both the portion where an optical path for transmitting an optical signal penetrates through the substrate and insulating layers and the portion where the optical path for transmitting an optical signal penetrates through solder resist layers. It is not always necessary for the portion where the optical path for transmitting an optical signal penetrates through the above described substrate and the above described insulating layers to have the same shape as the portion where the optical path for transmitting an optical signal penetrates through the above described solder resist layers.

In addition, the shape of the longitudinal section of the portion where the optical path for transmitting an optical signal penetrates through the solder resist layers may be a trapezoidal shape in which the side of the substrate and the insulating layer is a short side in some cases. In this case, the length of that short side is the cross-sectional diameter of the portion where the optical path for transmitting an optical signal penetrates through the solder resist layers.

In addition, in a substrate for mounting an IC chip according to the embodiments of the first aspect of the present invention, an optical path for transmitting an optical signal in a collective through hole structure may be formed on the portion where the optical path for transmitting an optical signal penetrates through a substrate, insulating layers, and the optical path for transmitting an optical signal may be formed on the portion where the optical path for transmitting an optical signal penetrates through solder resist layers, only on the portion corresponding to a light receiving portion of a light receiving element, and the optical path for transmitting an optical signal in a collective through hole structure may be formed also on the portion where the optical path for transmitting an optical signal penetrates through a solder resist layer.

In addition, in the case where the form of the above described optical path for transmitting an optical signal is a form where a number of round pillars are aligned in parallel and portions of sides of adjacent round pillars are connected to each other, dummy round pillars, which do not actually function as an optical path for transmitting a optical signal, may be formed as some of the round pillars thereof.

In addition, the longitudinal and lateral sizes of the optical path for transmitting an optical signal having a collective through hole structure illustrated in FIG. 2 are desirably at least about 100 μm and at most about 5 mm. In addition, in the case where the form of the above described optical path for transmitting an optical signal is a elongated round shape or an almost rectangular pillar shape, the size thereof is desirably within the above described range.

In the case of the size of about 100 μm or more, transmission of an optical signal tends not to be obstructed; whereas in the case of the size of about 5 mm or less, an optical signal can be transmitted certainly, the freedom of design of conductor circuits tends not to be affected, and miniaturization of the above described substrate for mounting an IC chip is more likely to be achieved.

Here, in the optical path for transmitting an optical signal which penetrates through a substrate, insulating layers, and solder resist layers, the cross-sectional size of the portion where the optical path for transmitting an optical signal penetrates through the substrate and the insulating layers may be approximately the same as that of the portion which penetrate through the solder resist layers.

Figure 3:
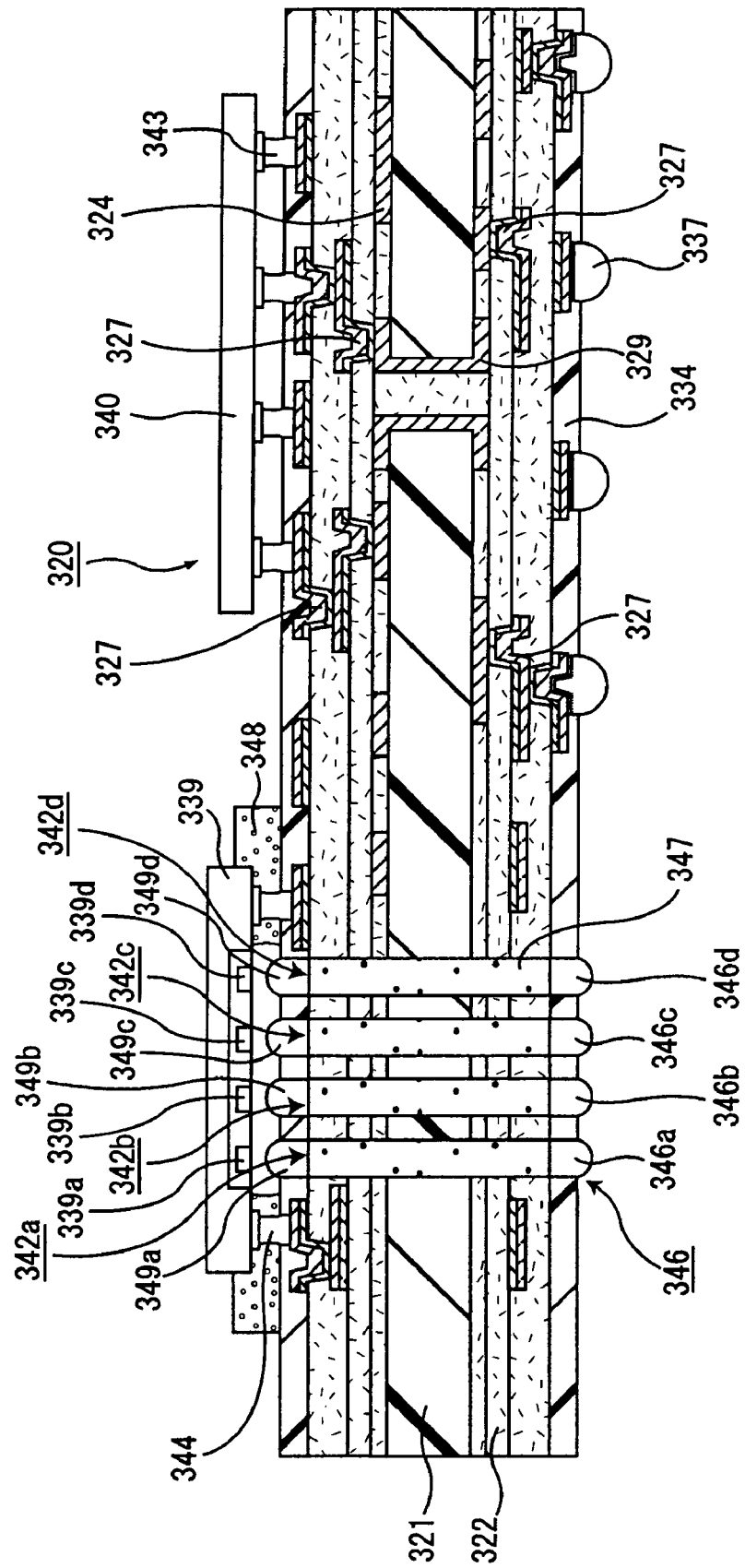
FIG. 3 is a cross-sectional view schematically illustrating an example of a substrate for mounting an IC chip according to one embodiment of the first aspect of the present invention.

Next, a substrate for mounting an IC chip having an optical path for transmitting an optical signal with an individual through hole shape is described. FIG. 3 is a cross-sectional diagram schematically illustrating another embodiment of a substrate for mounting an IC chip according to the first aspect of the present invention.

A substrate for mounting an IC chip illustrated in FIG. 3, namely a substrate for mounting an IC chip in the embodiment in which it has an optical path for transmitting an optical signal in an individual through hole structure, has the same configuration as a substrate for mounting an IC chip whose embodiments are illustrated in FIG. 2, except that the form of an optical path for transmitting an optical signal is different. Accordingly, the form of the optical path for transmitting an optical signal is herein described in detail.

As illustrated in FIG. 3, in a substrate for mounting an IC chip 320, four independent optical paths for transmitting optical signals 342 (342a to 342d) are provided so as to penetrate through a substrate 321, insulating layers 322, and solder resist layers 334.

In the optical paths for transmitting optical signals 342a to 342d, the portion where the optical path for transmitting an optical signal penetrates through the substrate 321 and the insulating layers 322 is filled in with a resin composite 347.

Then, the cross-sectional diameter of the portion where the optical path for transmitting an optical signal penetrates through the solder resist layer 334 is approximately the same as that of the portion where the optical path for transmitting an optical signal penetrates through the substrate 321 and the insulating layers 322. Here, the diameter of the portion where the optical path for transmitting an optical signal penetrates through solder resist layers may be smaller than that of the portion where the optical path for transmitting an optical signal penetrates through a substrate and insulating layers.

On one side of a substrate for mounting an IC chip 320, a four-channel light receiving element 339 is mounted on the surface by interposing solder connection portions 344 so that each of the light receiving portions 339a to 339d respectively face optical paths for transmitting optical signals 342a to 342d. And a gap part is formed in the portion between the bottom surface of the light receiving element 339 and the optical path for transmitting an optical signal.

Accordingly, an output signal to the four-channel light receiving element 339 having is more likely to be transmitted via any of the optical paths for transmitting optical signals 342a to 342d. Here, the individual optical paths for transmitting optical signals are independently formed, so that each thereof can transmit an optical signal from a light receiving portion 339a to 339d of the four-channel light receiving element.

Here, the portion where the optical path for transmitting an optical signal penetrates through the solder resist layers may be filled in with a resin composite. In addition, the conductor layers may be formed around the periphery of the portion where optical paths for transmitting optical signals 342a to 342d penetrate through the substrate 321 and the insulating layers 322.

Micro lenses 349 (349a to 349d) are provided on the side where a light receiving element 339 is mounted in this optical paths for transmitting optical signals 342a to 342d, and micro lens lenses 346 (346a to 346) are provided on an end portion of a resin composite 347 on the opposite side thereof and at the same time on the portion where this optical path for transmitting an optical signal 342 penetrates through the solder resist layers 334.

Accordingly, an optical signal to the light receiving element 339 passes through the micro lenses 349a to 349d, 346a to 346d. In this manner, the transmission loss of an optical signal is more likely to be reduced by providing the micro lenses 349a to 349d, 346a to 346d on both sides of the optical path for transmitting an optical signal 342a to 342d.

In addition, the lower limit of the cross-sectional diameter of each individual optical path for transmitting an optical signal in the portion where this optical path for transmitting an optical signal penetrates through the substrate and insulating layer is desirably about 150 μm, and the upper limit thereof is desirably about 450 μm. Specifically, in the case where an array element having a pitch of 250 μm is used, it is desirably at least about 150 μm and at most about 200 μm; whereas in the case where an array element having a pitch of 500 μm is used, it is desirably at least about 150 μm and at most about 450 μm.

In addition, the reason why the cross-sectional diameter of the individually formed optical paths for transmitting optical signals is desirably about 150 μm or more is as follows.

That is, the optical paths for transmitting optical signals in the above described embodiment are formed by filling through holes which penetrate through the substrate and the insulating layers with a resin composite if necessary after the creation of the through holes, and the above described through holes are usually formed using a drill, and in the case where through holes are formed through a drilling process, it is difficult to form through holes of which the diameter is less than about 150 µm.

On the other hand, in the case where the cross-sectional diameter of the portion where the above described optical path for transmitting an optical signal penetrates through solder resist layers is smaller than that of the portion where the optical path for transmitting an optical signal penetrates through the above described substrate and the above described insulating layers, the size thereof is desirably at least about 20 µm and at most about 390 µm smaller, and more desirably in the range of about 30 µm to about 100 µm smaller.

It is because incomplete land (a state where the solder resist layer is not formed so as to cover the above described interface between an insulating layer and a resin composite, and openings for optical paths in the solder resist layer are formed outside the above described interface) tends not to occur in the solder resist layer in a process through exposure to light and development.

Here, the cross-sectional diameter of the portion of the above described optical paths for transmitting optical signals which penetrates through the substrate and the insulating layers means: the cross-sectional diameter in the case where the above described optical paths for transmitting optical signals are in a round pillar shape; the long diameter of the cross section in the case where the above described optical paths for transmitting optical signals are in cylindroid shape; and the length of the longest portion in the cross section in the case where the above described optical paths for transmitting optical signals are quadrangular or polyangular pillars. In addition, in the case where the diameter of the cross section is not constant from an incident end side thereof to an emitting end side thereof, it means the cross-sectional diameter on an incident end side.

In addition, in the present invention, the cross section of an optical path for transmitting an optical signal means the cross section in the direction parallel to the main surface of a substrate for mounting an IC chip or the after-mentioned substrate for a motherboard, and the longitudinal section of the optical path for transmitting an optical signal means the cross section in the direction perpendicular to the above described main surface.

In addition, the shape of the above described optical path for transmitting an optical signal may be the shape which includes the portion the cross section of which becomes small or large continuously from an incident end side of an optical signal to an emitting end side thereof.

In addition, the shape of the longitudinal section of the portion where the above described optical path for transmitting an optical signal penetrates through the solder resist layer may be a trapezoidal shape in which the side of the insulating layer is a short side in some cases.

In the substrate for mounting an IC chip 320 comprising such a configuration, the electrical signal transmitted via external optical parts (an optical fiber, an optical waveguide, and the like) will be transmitted to the light receiving element 339 (light receiving portion 339a) via micro lenses 349a to 349d, 346a to 346d, the optical path for transmitting an optical signal 342, and is sent to an IC chip 340 via the solder connection portion 343, the conductor circuit 324, via holes 327, and the like and be processed after being converted to electrical signals in this light receiving element 339.

In a substrate for mounting an IC chip according to the embodiments of the first aspect of the present invention, since optical/electrical signals are converted in a light receiving element which is mounted on the vicinity of an IC chip, the transmission distance of an electrical signal is short, and it excels in the reliability of a signal transmission and is more likely to handle high-speed communication.

An appropriate diameter may be determined for the micro lens which is provided on the optical paths for transmitting optical signals in the substrate for mounting an IC chip of this embodiment in accordance with the pitch between the channels in the array element, and in the case where an array element having a pitch of 250 µm is used, for example, the diameter of the micro lens is desirably at least about 100 µm and at most about 190 µm.

In addition, in the case where an array element having a pitch of 500 µm is used, for example, the diameter of the micro lens is desirably at least about 100 µm and at most about 490 µm, and more desirably in the range of about 180 µm to about 480 µm.

Here, the diameter of the above described micro lens is desirably approximately the same as that of the cross section of the portion where the above described optical path for transmitting an optical signal penetrates through a solder resist layer.

In addition, with regard to the form of the optical path for transmitting an optical signal in the above described individual through hole structure, a round pillar, a rectangular pillar, a cylindroid shape, and a pillar form where the bottom is surrounded by a line and an arc can be cited as examples in both the portion of an optical path for transmitting an optical signal which is formed in the substrate and insulating layers and the portion where the optical path for transmitting an optical signal penetrates through a solder resist layer. Here, it is not always necessary for the portion which is formed in the above described substrate and the above described insulating layer to have the same shape as the portion where the optical path for transmitting an optical signal penetrates through the above described solder resist layer.

In the substrate for mounting an IC chip according to the embodiments of the first aspect of the present invention which has been described so far, a substrate and an insulating layer comprise a resin material.

However, also in the case where the substrate, the insulating layer, and the like comprise materials other than the resin, for example, glass, ceramics and the like, the same effects as in the first aspect of the present invention tend to be obtained.

That is, also in the substrate for mounting an IC chip in which an optical element is mounted on the circuit board comprising glass or ceramics, and an optical element sealing layer is formed so as to make contact with the periphery of this optical element, the same effect as in the above described substrate for mounting an IC chip according to the embodiments of the first aspect of the present invention can be obtained. In addition, in the substrate for mounting an IC chip using the circuit board comprising glass or ceramics, in the case where an optical element sealing layer is formed, this optical element sealing layer desirably comprises solder.

Next, a method for manufacturing a substrate for mounting an IC chip according to the embodiments of the first aspect of the present invention is described in the order of the processes.

(1) An insulating substrate is prepared as a starting material, and first, conductor circuits are formed on this insulating substrate.

As the above described insulating substrate, a glass epoxy substrate, a polyester substrate, a polyimide substrate, a bis-maleimide-triazine (BT) resin substrate, a thermosetting polyphenylene ether substrate, a copper clad laminate, a RCC substrate and the like can be cited as examples.

In addition, a ceramic substrate such as an aluminum nitride substrate and a silicon substrate may be used.

The above described conductor circuits may be formed more easily by forming a solid conductor layer on the entirety of the surface of the above described insulating substrate in accordance with, for example, an electroless plating process, and afterward, carrying out an etching process. In addition, it may be formed by carrying out an etching process on a copper clad laminate or a RCC substrate.

In addition, in the case of making a connection between the conductor circuits which sandwich the above described insulating substrate with a through hole, for example, after using a drill, a laser, and the like to form a hole for a through hole, the through hole is formed by carrying out an electroless plating process and the like. The diameter of the above described hole for a through hole is usually at least about 100 μm and at most about 300 μm.

In addition, in the case where a through hole is formed, this through hole is desirably filled in with a resin filler.

(2) Next, a roughening process is carried out on the surface of the conductor circuit if necessary.

As the above described roughening process, a blackening (oxidation)-reduction process, an etching process using an etchant including a cupric complex and an organic acid salt, a process with a Cu—Ni—P needle alloy plating, and the like can be cited as examples.

Here, when a coarse surface is formed, in general, the lower limit of the average roughness of this coarse surface is desirably about 0.1 μm, and the upper limit thereof is desirably about 5 μm. Taking the adhesiveness between a conductor circuit and an insulating layer, an influence on the transmission performance of an electrical signal of a conductor circuit, and the like into consideration, the lower limit of the above described average roughness is desirably about 2 μm, and the upper limit thereof is desirably about 4 μm.

Here, this roughening process is carried out before a through hole is filled in with a resin filler, and a coarse surface may be formed also on the wall surface of the through hole. It is because the adhesiveness between a through hole and a resin filler is improved.

(3) Next, on the substrate on which the conductor circuits are formed, uncured resin layers comprising a thermosetting resin, a photosensitive resin, a resin where a photosensitive group is added to a portion of a thermosetting resin, or a resin compound including any of these and a thermoplastic resin are formed, or resin layers comprising a thermoplastic resin are formed. Here, for example, the same resin and the like as used for a substrate can also be used in order to form these resin layers.

The above described uncured resin layer may be formed more easily by applying an uncured resin using a roll coater, a curtain coater and the like, or bonding a uncured (half-cured) resin film through thermocompression.

In addition, a resin layer made of the above described thermoplastic resin tends to be formed by bonding a resin mold in film form through thermocompression.

Among these, the method for bonding a uncured (half-cured) resin film through thermocompression is desirable, and pressure bonding of a resin film can be carried out using a vacuum laminator and the like, for example.

In addition, the conditions of pressure bonding are not particularly limited, and it is necessary to appropriately choose them in consideration of the composition of a resin film and the like. It is usually desirable to carry out pressure bonding under the conditions of a pressure of at least about 0.25 MPa and at most about 1.0 MPa, a temperature of at least about 40° C. and at most about 70° C., a degree of vacuum of at least about 13 Pa and at most about 1300 Pa, and a time of at least about 10 seconds and at most about 120 seconds.

With regard to the above described thermosetting resin, an epoxy resin, a phenolic resin, a polyimide resin, a polyester resin, a bismaleimide resin, a polyolefin based resin, a polyphenylene ether resin, a polyphenylene resin, a fluorine resin and the like can be cited as examples.

With regard to the specific examples of the above described epoxy resin, a novolak type epoxy resin such as a phenol novolak type and a cresol novolak type, a dicyclopentadiene-modified alicyclic epoxy resin and the like can be cited.

An acrylic resin and the like can be cited as an example of the above described photosensitive resin.

In addition, with regard to the resin where a photosensitive group is added to a portion of the above described thermosetting resin, a resin gained by making the thermosetting group of any of the above described thermosetting resins and methacrylic acid or acrylic acid react with each other in order to bring about acrylic conversion, and the like can be cited as an example.

With regard to the above described thermoplastic resin, a phenoxy resin, polyether sulfone (PES), polysulfone (PSF), polyphenylene sulfone (PPS), polyphenylene sulfide (PPES), polyphenylene ether (PPE), polyether imide (PI) and the like can be cited as examples.

In addition, with regard to the above described resin compound, especially when a thermosetting resin, a photosensitive resin (a resin where a photosensitive group is added to a portion of a thermosetting resin is also included), and a thermoplastic resin are included, it is not particularly limited. With regard to specific combinations of a thermosetting resin and a thermoplastic resin, a phenolic resin/polyether sulfone, a polyimide resin/polysulfone, an epoxy resin/polyether sulfone, an epoxy resin/phenoxy resin, and the like can be cited as examples. In addition, with regard to specific combinations of a photosensitive resin and a thermoplastic resin, an acrylic resin/phenoxy resin and an epoxy resin where a portion of the epoxy group has been converted to an acryl/polyether sulfone, and the like can be cited as examples.

In addition, desirably, the mixture ratio of (the thermosetting resin or the photosensitive resin) to (the thermoplastic resin) in the above described resin compound is (thermosetting resin or photosensitive resin)/(thermoplastic resin)= (about 95/about 5) to (about 50/about 50). This is because a high degree of toughness may be secured more easily without losing heat resistance.

In addition, the above described insulating layers may be formed of two or more different resin layers.

Specifically, for example, the lower layer is formed of a resin compound with the mixture ratio of (the thermosetting resin or the photosensitive resin) to (the thermoplastic resin)= (about 50/about 50), the upper layer is formed of a resin compound with the mixture ratio of (the thermosetting resin or the photosensitive resin) to (the thermoplastic resin)= (about 90/about 10), and the like.

With a configuration of this kind, it may become easier to secure not only an excellent adhesiveness with a substrate but also the ease of formation in forming openings for via holes and the like in the following processes.

In addition, the above described resin layer may be formed of a resin composite for forming a coarse surface.

As the above described resin composite for forming a coarse surface, a substance which is soluble in a coarsening liquid made of at least one selected among acid, alkali and an oxidant is dispersed in an uncured resin matrix which is heat-resistant and insoluble and a coarsening liquid made of at least one selected from among acid, alkali and an oxidant can be cited as an example.

Here, with regard to the above described words "insoluble" and "soluble," substances of which the rate of dissolution is relatively high in the case where the substance is immersed in the same coarsening liquid for the same period of time are referred to as "soluble" for the sake of convenience, and substances of which the rate of dissolution is relatively low are referred to as "insoluble" for the sake of convenience.

With regard to the above described resin matrix which is heat-resistant, resins which allow the form of the coarse surface to be maintained more easily when the coarse surface is formed on the insulating layer using the above described coarsening liquid can be used preferably, and a thermosetting resin, a thermoplastic resin, a compound of these and the like can be cited as examples. In addition, by using a photosensitive resin, openings for via holes tend to be formed in an insulating layer in a process through exposure to light and development.

As the above described thermosetting resin, an epoxy resin, a phenolic resin, a polyimide resin, a polyolefin resin, a fluorine resin and the like can be cited as examples. In addition, in the case where the above described thermosetting resin is photosensitized, the thermosetting group is (meta) acrylated by reacting with methacrylic acid, acrylic acid, or the like.

With regard to the examples of the above described epoxy resin, a cresol novolak type epoxy resin, a bisphenol A type epoxy resin, a bisphenol F type epoxy resin, a phenol novolak type epoxy resin, an alkylphenol novolak type epoxy resin, a biphenol F type epoxy resin, a naphthalene type epoxy resin, a dicyclopentadiene type epoxy resin, the epoxidized product of the condensate of an aromatic aldehyde having phenols and a phenolic hydroxy group, a triglycidyl isocyanurate, a cycloaliphatic epoxy resin, and the like can be cited. These may be used alone, or two or more kinds may be used together. Thereby, it excels in heat resistance and the like.

As the above described thermoplastic resin, a phenoxy resin, a polyether sulfone, a polysulfone, a polyphenylene sulfone, a polyphenylene sulfide, a polyphenylene ether, a polyether imido and the like can be cited as examples. These may be used alone, or two or more kinds may be used together.

A substance which is soluble in a coarsening liquid made of at least one selected among acid, alkali and an oxidant is desirably of at least one kind selected from inorganic particles, resin particles and metal particles.

With regard to the above described inorganic particles, particles comprising aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate and talc, silicon compounds such as silica and zeolite, and the like can be cited as examples. These may be used alone, or two or more kinds may be used together.

With regard to the above described resin particles, particles comprising, for example, a thermosetting resin, a thermoplastic resin, and the like can be cited, and the particles are not particularly limited, as long as the rate of dissolution is higher than the above described resin matrix which is heat-resistant when immersed in a coarsening liquid made of at least one selected from among acid, alkali and an oxidant. Specifically, an amino resin (such as a melamine resin, a urea resin, or a guanamine resin), an epoxy resin, a phenolic resin, a phenoxy resin, a polyimide resin, a polyphenylene resin, a polyolefin resin, a fluorine resin, a bismaleimide-triazine resin, and the like can be cited as examples. These may be used alone, or two or more kinds may be used together.

Here, it is necessary for a hardening process to be carried out in advance on the above described resin particles. This is because the above described resin particles dissolve in a solvent for solving a resin matrix which is heat-resistant, unless the particles are hardened in advance.

In addition, as the above described resin particles, particles comprising rubber particles, a liquid phase resin, a liquid phase rubber, and the like can be used.

With regard to the above described metal particles, particles comprising gold, silver, copper, tin, zinc, a stainless steel, aluminum, nickel, iron, lead, and the like can be cited as examples. These particles may be solely used or two or more kinds may be used together.

The surface layer of the above described metal particles may be coated with resin or the like in order to secure insulating properties.

When two or more kinds of the above described soluble substances are combined for use, as a combination of two kinds of soluble substances, the combination of a resin particle and an inorganic particle is desirable. It is because, since a conductivity of both particles is low, the insulation of an insulating layer is more likely to be secured, thermal expansion can be easily adjusted with an insoluble resin, cracks tend not to occur in the insulating layer comprising a resin composite for forming a coarse surface, and separations (peeling) tend not to occur between an insulating layer and a conductor circuit.

Phosphoric acid, hydrochloric acid, sulfuric acid, nitric acid, and organic acids such as formic acid and acetic acid, and the like can be cited as the acid to be used as the above described coarsening liquid, and among these, organic acids are desirably used. It is because it is hard to corrode a metal conductor layer exposed at the bottom of openings for via holes when a coarsening process is carried out.

Solutions such as those of chromic acid, a chromate acid mixture and alkaline permanganate (such as potassium permanganate) are desirably used as the above described oxidant.

In addition, solutions such as those of sodium hydroxide, potassium hydroxide can be cited as the above described alkali.

The average particle diameter in the above described soluble substance is desirably about 10 μm or less.

In addition, coarse particles of which the average particles diameter is about 2 μm or less and relatively large and microscopic particles of which the average particle diameter is relatively small may be combined for use. That is, for example, a soluble substance with an average particle diameter of at least about 0.1 μm and at most about 0.5 μm and a soluble substance with an average particle diameter of at least about 1 μm and at most about 2 μm may be combined.

Thus, by combining coarse particles of which the average particles diameter is relatively large and microscopic particles of which the average particle diameter is relatively small, a melting residue in a thin film conductor layer tends to be removed, the amount of a palladium catalyst under a plating resist tends to be reduced, and furthermore, a shallow and complex coarse surface tends to be formed.

Furthermore, by forming a complex coarse surface, a practical peel strength may be maintained more easily even if the unevenness of the coarse surface is small.

An average particle diameter of the above described coarse particles is desirably more than about 0.8 μm, but less than about 2.0 μm, and an average particle diameter of microscopic particles is desirably at least about 0.1 μm and at most about 0.8 μm.

(4) Next, in forming insulating layers using a thermosetting resin and an a resin compound as the material, a hardening process is carried out on an uncured resin insulating layer, and an insulating layer with openings for via holes formed therein is formed. In addition, in this process, a hole for a through hole may be formed if necessary.

The above described openings for via holes are desirably formed through a laser process. In addition, when a photosensitive resin is used as a material of an insulating layer, it may be formed through a process through exposure to light and development.

In addition, in the case where an insulating layer is formed using a thermoplastic resin as the material, an insulating layer with openings for via holes comprising a thermoplastic resin in the resin layer is formed. In this case, openings for via holes can be formed by carrying out a laser process.

In addition, when a hole for a through hole is formed in this process, this hole for a through hole may be formed through a drilling process, a laser process, or the like.

As the laser that is used in the above described laser process, a gas carbonate laser, an ultraviolet ray laser, an excimer laser, and the like can be cited as examples. Among these, an excimer laser and a gas carbonate laser with a short pulse are desirable.

In addition, it is desirable to use the excimer laser of a hologram system among excimer lasers. The hologram system is a system in which the specified substance is irradiated via a hologram, a condenser lens, a laser mask, a transfer lens, and the like, and by using this system many openings for via holes tend to be efficiently formed in a resin film layer by one irradiation.

In addition, when a gas carbonate laser is used, the pulse interval thereof is desirably at least about $10^{-4}$ second and at most about $10^{-8}$ second. In addition, a time to irradiate a laser for forming openings is desirably at least about 10 µsecond and at most about 500 µsecond.

In addition, many openings for via holes are more likely to be formed at once by irradiating a laser beam via an optical system lens and a mask. It is because via an optical system lens and a mask, a plurality of portions may be irradiated more easily with the same strength and with laser beams of which the irradiation intensity is the same.

Thus, after forming openings for via holes, a desmear process may be carried out if necessary.

(5) Next, a conductor circuit is formed on the surface of the insulating layer which includes the inner walls of the openings for via holes.

In forming conductor circuits, first, a thin film conductor layer is formed on the surface of the insulating layer. The above described thin film conductor layer may be formed more easily through methods such as electroless plating and sputtering.

As the material for the above described thin film conductor layer, copper, nickel, tin, zinc, cobalt, thallium, lead, and the like can be cited as examples.

Among these, the layer desirably comprises copper or copper and nickel, in order to gain excellent electrical properties and economic efficiency, and the like In addition, in the case where the thin film conductor layer is formed through electroless plating, the lower limit of a thickness of the thin film conductor layer is desirably about 0.3 µm, and the upper limit is desirably about 2.0 µm. A more desirable lower limit is about 0.6 µm, and a more desirable upper limit is about 1.2 µm. In addition, in the case where it is formed through sputtering, at least about 0.1 µm and at most about 1.0 µm is desirable.

In addition, before forming the above described thin film conductor layer, a coarse surface may be formed on the surface of an insulating layer. By forming the coarse surface, the adhesiveness between the insulating layer and the thin film conductor layer can be improved. Especially when the insulating layer is formed using a resin composite for forming a coarse surface, it is desirable to form a coarse surface using acid, an oxidant, and the like.

In addition, in the case where a hole for a through hole is formed in the above described process (4), a through hole may be formed by forming a thin film conductor layer also on the wall surface of the through hole when a thin film conductor layer is formed on an insulating layer.

(6) Next, a plating resist is formed on part of the surface of the thin film conductor layers.

The above described plating resist may be formed, for example, by bonding a photosensitive dry film, tightly mounting a photo mask comprising a glass substrate and the like where a pattern for a plating resist was drawn, and carrying out a process through exposure to light and development.

(7) After that, electrolytic plating is carried out using the thin film conductor layer as a plating lead, and an electrolytic plating layer is formed on the plating resist non-forming portion. As the above described electrolytic plating, a copper plating is desirable. In addition, a thickness of the above described electrolytic plating layer is desirably at least about 5 µm and at most about 20 µm.

After that, a conductor circuit (including via holes) can be formed by removing the above described plating resist and thin film conductor layer under this plating resist.

The above described plating resist may be removed using an etchant, for example, an alkaline solution, and the above described thin film conductor layer may be removed using an etchant, such as a mixed liquid of sulfuric acid and hydrogen peroxide, sodium persulfate, ammonium persulfate, ferric chloride or cupric chloride.

In addition, the catalyst on the insulating layer may be removed using acid or an oxidant if necessary after the formation of the above described conductor circuit. This is in order to prevent deterioration in the electrical properties more easily.

In addition, after forming this plating resist and then forming an electrolytic plating layer on the entirety of the surface of a thin film conductor layer, a conductor circuit may be formed using a method for carrying out an etching process instead of a method for forming an electrolytic plating layer (processes (6) and (7)).

In addition, in the case where a through hole is formed in the above described processes (4) and (5), this through hole may be filled in with a resin filler.

In addition, when a through hole is filled in with a resin filler, a lid plating layer may be formed so as to cover the surface layer portion of a resin filler layer through electroless plating and the like if necessary.

(8) Next, when a lid plating layer is formed, if necessary, a coarsening process is carried out on the surface of this lid plating layer, and then an insulating layers are formed by repeating the above described processes (3) and (4). Here, a through hole may or may not be formed in this process.

(9) In addition, conductor circuits and insulating layers may be formed and layered by repeating the processes (5) to (8) if necessary.

By carrying out these processes (1) to (9), a multilayer circuit board on which conductor circuits and insulating layers are formed and layered on both sides of the substrate can be manufactured.

Here, the method for manufacturing a multilayer circuit board described above in detail is a semi-additive method, but a method for manufacturing this multilayer circuit board is not limited to a semi-additive method, and a full additive method, a subtractive method, a collect layering method, a conformal method and the like can be used.

(10) Next, an optical path for transmitting an optical signal is formed which penetrates through the above described multilayer circuit board. Here, the optical path for transmitting an optical signal which penetrates through the multilayer circuit board formed in this process is also referred to as a through hole for an optical path.

First, a through hole for an optical path is formed in the multilayer circuit board manufactured through the above described process.

The above described through hole for an optical path is formed in accordance with, for example, a drilling process, a laser process or the like.

As the laser used in the above described laser process, the same kinds of laser as used for the creation of the above described openings for via holes, or the like can be cited.

In the above described drilling process, it is desirable to use an apparatus with a function of recognizing recognition marks (alignment marks) which reads recognition marks on a multilayer circuit board, corrects the point to be processed and carries out the drilling process.

The location for formation of the above described through hole for an optical path is not particularly limited, and an appropriate location for formation may be selected taking the design of the conductor circuits, the point where the IC chip and the optical elements are mounted and the like into consideration.

The above described through hole for an optical path is desirably formed in each optical element such as a light receiving element and a light emitting element. In addition, it may be formed at each signal wavelength.

In addition, in the case where a through hole for an optical path in a form where a number of round pillars are aligned in parallel and certain portions on sides of round pillars which are adjacent to each other are connected is formed in this process, the number of round pillars formed is desirably an odd number, and it is desirable to form round pillars which are not adjacent to each other in advance, and afterward, form round pillars between the round pillars which are not adjacent to each other, so that certain portions on the sides are connected.

This is because in the case where a round pillar is attempted to be formed in sequence so as to be adjacent to the previous round pillar with certain portions on the surface connected, the tip of the drill tends to shift in the direction of the already formed round pillar; that is, deviation is caused in the tip of the drill, and thus, the precision at the time of the drilling process may be lowered.

The matching accuracy in the case of first forming round pillars which are not adjacent to each other in advance, and afterward forming round pillars between the round pillars which are not adjacent to each other with certain portions on the sides connected is about 40 µm; while the matching accuracy in the case of forming round pillars in sequence so as to be adjacent to the previous round pillar with certain portions on the surface connected is about 10 µm.

In addition, a desmear process may be carried out on the wall surface of a through hole for an optical path if necessary after the creation of the through hole for an optical path.

A process using a solution of permanganate, a plasma process, a corona process and the like can be used for the above described desmear process. Here, resin residue, burrs and the like may be removed more easily from the inside of a through hole for an optical path by carrying out a desmear process as described above, so that transmission loss of an optical signal due to diffuse reflection of light from the wall surface of the completed optical path for transmitting an optical signal may be lowered more easily.

In addition, a process for forming a coarse surface may be carried out in order to roughen the wall surface of a through hole for an optical path to if necessary after the creation of a through hole for an optical path, before filling the through hole with an uncured resin composite. This is in order to more easily increase the adhesiveness between the wall surface and the conductor layer or the resin composite.

The formation of a coarse surface as described above can be carried out using, for example, acid such as sulfuric acid, hydrochloric acid or nitric acid; oxidant such as chromic acid, a chromate acid mixture or permanganate, or the like, by dissolving the portion exposed when the through hole for an optical path was formed in a substrate, an insulating layer, and the like. In addition, it can also be carried out in accordance with a plasma process, a corona process or the like.

The lower limit of an average roughness (Ra) of the above described coarse surface is desirably about 0.5 µm, and the upper limit thereof is desirably about 5 µm. A more desirable lower limit of the above described average roughness (Ra) is about 1 µm, and a more desirable upper limit thereof is about 3 µm. It is because within this range, it excels in adhesiveness with a conductor layer or a resin composite and it tends not to adversely affect transmission of an optical signal.

After forming the above described through hole for an optical path, conductor layers may be formed on the wall surface of the above described through hole for an optical path if necessary.

The above described conductor layer can be formed through methods such as electroless plating, sputtering, and vacuum deposition, for example.

Specifically, for example, after the formation of the through hole for an optical path, the catalyst nuclei can be imparted on the wall surface of this through hole for an optical path, and afterward, a method for immersing in an electroless plating bath the substrate in which the through hole for an optical path is formed can be used.

Conductor layers comprising two or more layers may be formed combining electroless plating and sputtering, or after carrying out electroless plating or sputtering, conductor layers comprising two or more layers may be formed through electrolysis plating. In addition, when a conductor layer is formed in this process, this conductor layer may be a glossy metal layer.

In forming a conductor layer of this kind, it is desirable to form a conductor layer on the wall surface of the above described through hole for an optical path, and at the same time, to form an outermost conductor circuit on an outermost insulating layer of the above described multilayer circuit board. Specifically, when forming a conductor layer on the wall surface of the through hole for an optical path through electroless plating and the like, conductor layers are first formed also on the entirety of the surface of the insulating layer, for example.

Next, a plating resist is formed on the conductor layer which is formed on the surface of this insulating layer. The plating resist may be formed, for example, by bonding a photosensitive dry film, tightly mounting a photo mask comprising a glass substrate and the like where a pattern for a plating resist was drawn, and carrying out a process through exposure to light and development.

In addition, electrolytic plating is carried out using the conductor circuit which is formed on the above described insulating layer as a plating lead, an electrolytic plating layer is formed on this plating resist non-forming portion, and afterward, independent conductor circuits are formed on outermost insulating layers by removing the above described plating resist and conductor layers under this plating resist.

In addition, after the formation of the above described conductor layer, a coarse surface may be formed on the wall surface of the above described conductor layer. As the formation of the above described coarse surface, a blackening (oxidation)-reduction process, an etching process using an etchant including a cupric complex and an organic acid salt, a process with a Cu—Ni—P needle alloy plating, and the like can be used as examples.

(11) Next, if necessary, the through hole for an optical path which penetrates through the multilayer circuit board formed in the above described process (10) is filled in with a resin composite.

The through hole for an optical path is filled in with an uncured resin composite, and afterward, a hardening process is carried out, and thereby, in an optical path for transmitting an optical signal completed through the following processes, the portion which is formed in a substrate or an insulating layer is to be filled in with a resin composite.

The specific method for filling the through hole with an uncured resin composite is not particularly limited, and a printing method, a potting method or the like, for example, can be used.

Here, in the case where the through hole is filled in with the uncured resin composite through printing, the uncured resin composite may be printed at once or may be printed in two steps or more. In addition, when a through hole for an optical path is filled in with a resin composite, printing may be carried out from both sides of the multilayer circuit board.

In addition, when the through hole is filled in with the uncured resin composite, it may be filled in with the uncured resin composite which is somewhat larger in quantity than the inner product of the above described through hole for an optical path, and extra resin composite which overflowed of the through hole for an optical path may be removed after completion of the resin composite filling.

The above described extra resin composite can be removed by polishing and the like, for example. In addition, in the case where extra resin composite is removed, the resin composite may be in a half-cured state or may be in a completely hardened state, and it is necessary to appropriately choose it in consideration of the material of the resin composite and the like.

Through these process of forming a through hole, and if necessary, the process of forming a coarse surface, the process of forming a conductor layer, and the process of a resin composite filling, part of an optical path for transmitting an optical signal which was filled in with the resin composite can be formed on the above described multilayer circuit board if necessary.

In addition, in carrying out the above described process of forming a conductor layer, a conductor layer may be formed more easily also on the surface of the insulating layer, and an independent conductor circuit may be formed more easily by carrying out the above described process. Of course, even in the case where the above described process of forming a conductor layer is not carried out, a conductor circuit tends to be formed on the surface of the insulating layer with the above described method.

In addition, in this process, it is desirable to carry out a polishing process on the exposed surface of the resin composite exposed from the through hole for an optical path in order to flatten the exposed surface. It is because the risk that transmission of an optical signal is obstructed becomes small by flattening the exposed surface.

The above described polishing process can be carried out through, for example, polishing using a buff, polishing using sandpaper and the like, polishing to a mirror surface, polishing to a clean surface, lapping and the like. In addition, chemical polishing using acid, an oxidant or other chemicals may be carried out. In addition, a polishing process may be carried out combining two or more from among these methods.

(12) Next, the process of forming a solder resist layer is carried out if necessary so as to form the solder resist layer which has openings for optical paths which is communicated with a through hole for an optical path.

Specifically, the solder resist layer can be formed by carrying out the following processes (a) and (b) for example.

(a) First, a layer of a solder resist composition is formed as an outermost layer of the multilayer circuit board in which a through hole for an optical path is formed.

The layer of the above described solder resist composition can be formed using the solder resist composition comprising a polyphenylene ether resin, a polyolefin resin, a fluorine resin, a thermoplastic elastomer, an epoxy resin, a polyimide resin and the like for example.

In addition, as a solder resist composition other than the above described solder resist composition, an (meth)acrylate of a novolak type epoxy resin, an imidazole hardening agent, a bifunctional (meth)acrylic ester monomer, a (meth)acrylic ester polymer with a molecular weight of about 500 to about 5,000, a thermosetting resin comprising a bisphenol type epoxy resin and the like, a photosensitive monomer such as a polyacrylic monomer, and a paste type fluid substance including a glycol ether solvent and the like, can be cited as examples, and the viscosity of this fluid is preferably adjusted to about 1 Pa·s to at most about 10 Pa·s at about 25° C. In addition, a commercially available solder resist composition can also be used.

In addition, a layers of a solder resist composition may be formed by bonding with pressure a film comprising the above described solder resist composition.

(b) Next, the above described through hole for an optical path is communicated with the above described layer of a solder resist composition, openings (hereinafter, also referred to as openings for optical paths) of which the diameter is smaller than the cross-sectional diameter of the above described through hole for an optical path and the like. Specifically, the openings can be formed in a process through exposure to light and development, a laser process or the like, for example.

In the case where the cross-sectional diameter of the portion where an optical path for transmitting an optical signal penetrates through the solder resist layer is to be made smaller than the cross-sectional diameter of the portion where the optical path for transmitting an optical signal penetrates through a substrate and an insulating layer, the cross-sectional diameter of the above described openings for optical paths is desirably at least about 20 μm and at most about 390 μm smaller than that of the above described through hole for an optical path, and more desirably, in the range of about 30 μm to about 100 μm smaller.

In addition, in forming the above described openings for optical paths, it is desirable to form openings for forming solder bumps (opening for mounting an IC chip and an optical element) at the same time. Here, the above described openings for optical paths and the above described openings for forming solder bumps may be formed separately.

In addition, when a solder resist layer is formed, a resin film having openings at desired points is manufactured in advance, and the solder resist layer having openings for optical paths and openings for forming solder bumps may be formed by pasting this resin film to the multilayer circuit board.

Through the processes of (a) and (b), on a multilayer circuit board in which a through hole for an optical path is formed, openings for optical paths which are communicated with this through hole for an optical path can be formed.

In addition, the openings for optical paths which are formed in the above described solder resist layer may be filled in with an uncured resin composite with the same method as in the above described through hole for an optical path.

In addition, a conductor layer may be formed also on the wall surface of the openings for optical paths formed in the solder resist layer in some cases.

In addition, in this process, after the formation of a solder resist layer, a micro lens may be provided on an end portion of the resin composite with which a through hole for an optical path is filled and at the same time in openings for optical paths formed in the solder resist layer.

In addition, in the case where a micro lens is provided, a surface treatment may be carried out in advance on the portion where the micro lens is provided.

The form of the micro lens, in particular the degree of sagging, may easily become uneven, depending on the wettability in the portion where the above described micro lens is provided, but the unevenness in the degree of sagging tends to be reduced by carrying out a surface treatment.

With regard to the above described surface treatment, a process using a water repellent coating agent such as a fluorine based polymer coating agent (surface tension: about 10 mN/m to about 12 mN/m), a water repellent process using $CF_4$ plasma, a hydrophilic process using $O_2$ plasma and the like can be cited as examples.

In addition, the above described micro lens may be provided directly on the above described resin composite or with an adhesive in between.

As the method for providing a micro lens directly on the above described resin composite, a method for dropping an appropriate amount of uncured resin for an optical lens onto the resin composite and carrying out a hardening process on this uncured resin for an optical lens that has been dropped can be cited, for example.

In the above described method, when dropping an appropriate amount of uncured resin for an optical lens onto the resin composite, an apparatus such as a dispenser, an inkjet, a micro pipette, or a micro syringe can be used. In addition, the uncured resin for an optical lens that has been dropped onto the solder resist layer using such an apparatus tends to be spherical, due to its surface tension, and therefore, it becomes of a hemispherical form on the resin composite, and afterward, a hardening process is carried out on the uncured resin for an optical lens in hemispherical form, and thereby, a micro lens in hemispherical form may be formed more easily on the resin composite.

Here, the form of the micro lens that is formed in this manner, including the diameter and the curve, may be controlled more easily by adjusting the viscosity and the like of the uncured resin for an optical lens to an appropriate degree taking the wettability of the resin composite for the uncured resin for an optical lens into consideration.

(13) Next, solder pads and solder bumps are formed. That is, the portions of the conductor circuit that have been exposed from the above described openings for forming solder bumps are coated with an anti-corrosive metal, such as nickel, palladium, gold, silver or platinum, if necessary, so that solder pads are formed. Among these, it is desirable to form a coating layer with metals, such as nickel-gold, nickel-silver, nickel-palladium, and nickel-palladium-gold.

The above described coating layer can be formed through, for example, plating, vapor deposition, electrolytic deposition or the like, and from among these, formation through plating is desirable, in order to gain high uniformity in the coating layer. Here, the solder pads may be formed before the above described process for providing a micro lens.

Furthermore, the space for the above described solder pads is filled in with a solder paste using a mask where openings are formed in portions which correspond to the above described solder pads, and afterward, the solder bumps are formed through reflow. In addition, gold bumps may be formed instead of solder bumps.

Furthermore, an optical element (light receiving element or light emitting element) is mounted on the solder resist layer. The optical element can be mounted with, for example, the above described solder bumps in between. In addition, when the above described solder bumps are formed, for example, an optical element is mounted at the point in time when the space is filled in with the solder paste, and the optical element may be mounted during reflow. In addition, the composition of the solder used here is not particularly limited, and any composition, including Sn/Pb, Sn/Pb/Ag, Sn/Ag/Cu, Sn/Cu and the like, may be used.

In addition, the optical element may be mounted using a conductor adhesive, a metal bump such as Au and Cu, and the like instead of solder.

In addition, a micro lens may be formed in advance in the optical element which is mounted in this process.

(14) Next, an optical element sealing layer is formed so as to make contact with the periphery of the above described optical element.

The formation of the above described optical element sealing layer can be carried out by potting the uncured resin composite, and afterward by carrying out a hardening process and the like, for example.

When forming the above described optical element sealing layer by potting, this optical element sealing layer may be formed so as to cover an optical path as long as it is formed so as to make contact with the periphery of the optical element.

Through this process, a substrate for mounting an IC chip according to the embodiments of the first aspect of the present invention may be manufactured more easily.

Next, a substrate for mounting an IC chip according to the embodiments of the second aspect of the present invention is described.

Since a substrate for mounting an IC chip according to the embodiments of the second aspect of the present invention functions as what is called a package substrate, a conductor circuit is basically formed with a fine pattern, and it may become easier to expand circuits from the IC chip side to the motherboard side.

In addition, since the optical path for transmitting an optical signal is formed while an optical element is mounted thereon, input and output signals of the above described optical element are more likely to be transmitted via the above described optical path for transmitting an optical signal. In addition, in the case where an IC chip is mounted on this substrate for mounting an IC chip, the distance between the IC chip and the optical element is short, resulting in excellent reliability of transmission of an electrical signal.

Here, the substrate for mounting an IC chip according to the second aspect of the present invention may have a substrate as a base and may have a structure where insulating layers and conductor circuits are formed and layered on both sides thereof; or it may not have a substrate as a base and may have a structure (coreless structure) where insulating layers and conductor circuits are formed and layered.

The following description will discuss the substrate for mounting an IC chip according to the embodiments of the second aspect of the present invention citing the embodiment in which insulating layers and conductor circuits are formed and layered on both sides of a substrate.

In addition, also in the a substrate for mounting an IC chip according to the embodiments of the second aspect of the present invention, a solder resist layer is usually formed as an outermost layer of a substrate where conductor circuits and insulating layers are formed and layered on both sides. Accordingly, the substrate for mounting an IC chip according to the embodiments in which the solder resist layer is formed as an outermost layer is described in the following. Here, the above described solder resist layer does not necessarily need to be formed.

Here, the substrate for mounting an IC chip according to the embodiments of the second aspect of the present invention has the same configuration as the substrate for mounting an IC chip according to the embodiments of the first aspect of the present invention, except that instead of the formation of an optical element sealing layer, a cap member is attached so as to cover the entirety of the optical element. Therefore, only the cap member is described in detail here.

Figure 4:
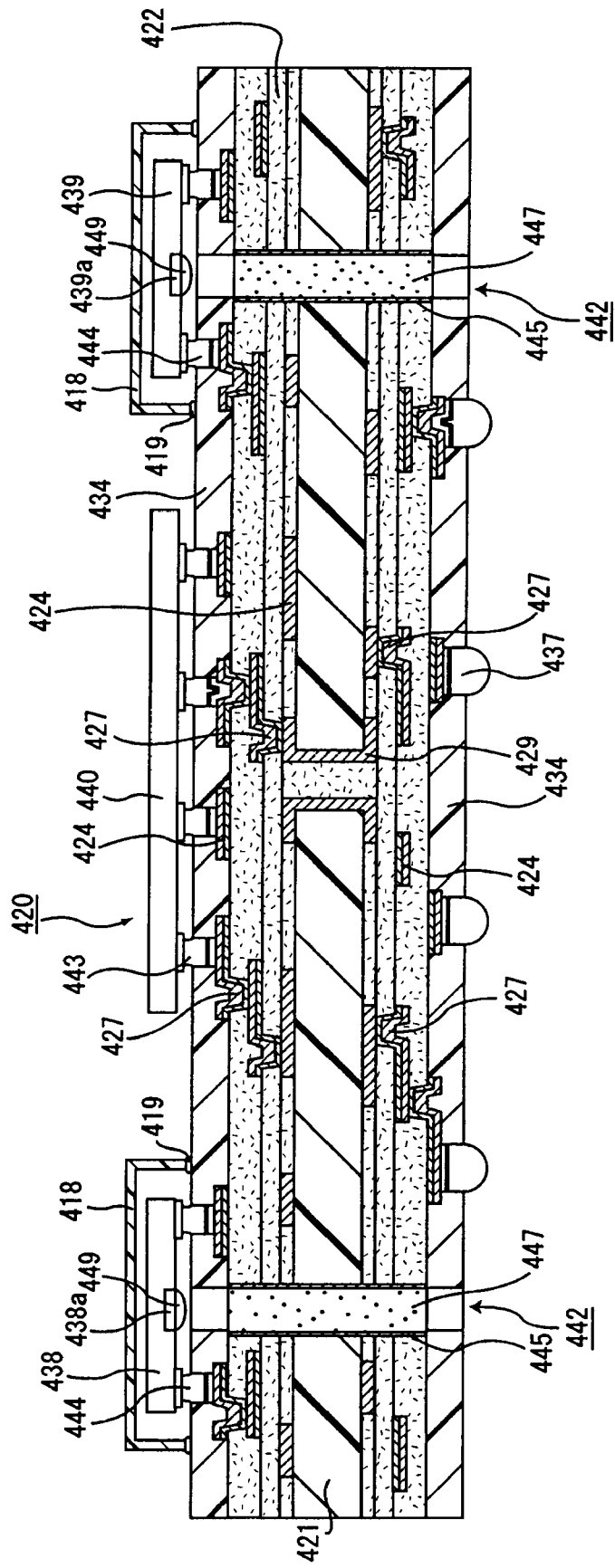
FIG. 4 is a cross-sectional view schematically illustrating an example of a substrate for mounting an IC chip according to one embodiment of the second aspect of the present invention.

FIG. 4 is a cross-sectional view schematically illustrating one embodiment of a substrate for mounting an IC chip according to the embodiments of the second aspect of the present invention. Here, FIG. 4 illustrates a substrate for mounting an IC chip with an IC chip mounted thereon.

As illustrated in FIG. 4, in the substrate for mounting an IC chip according to the embodiments of the second aspect of the present invention 420, a light receiving element 439 and a light emitting element 438 are mounted on the surface by interposing solder connection portions 444 so that each of a light receiving portion 439a and a light emitting portion 438a faces an optical path for transmitting an optical signal 442 on one side, and furthermore, an IC chip 440 is mounted on the surface by interposing solder connection portions 443.

In addition, on one side of the two solder resist layers 434, a cap member 418 is attached by interposing an adhesive 419 so as to cover the light emitting element 438 and the light receiving element 439.

With this cap member 418 attached, dust, foreign matter, or the like tends not to intrude inside or on an optical path for transmitting an optical signal 442, and transmission of an optical signal tends not to be obstructed for lack of this dust, foreign matter, or the like.

Here, the substrate for mounting an IC chip according to one embodiment illustrated in FIG. 4 has approximately the same configuration as the substrate for mounting an IC chip according to one embodiment of the first aspect of the present invention illustrated in FIG. 1A, except that the optical element sealing layer is not formed but the cap member is attached as described above.

However, they are different in that in the substrate for mounting an IC chip 420 illustrated in FIG. 4, each of the micro lenses is provided on the light receiving portion of the light receiving element 439 and the light emitting portions of the light emitting element 438 and micro lenses are not provided on the portion where an optical path for transmitting an optical signal penetrates through the solder resist layer.

Here, as already described in the first aspect of the present invention, a micro lens may be provided on the portion where the optical path for transmitting an optical signal penetrates through the solder resist layer, or in addition, may be provided on the light receiving portion of the mounted light receiving element or the light emitting portion of the light emitting element, or in some cases, may be provided on both thereof, or may not be provided.

The material and shape of the above described cap member are not particularly limited, and as the material thereof, ceramics, resin, metal, glass or the like can be cited as examples. The cap member made of the material is easy to form, and is appropriate for protecting a mounted optical element from the stress and contact from the outside. From among these, resin is desirable. In addition, the shape of the cap member should just be the shape which can cover the above described optical element, such as the U-shaped sectional shape. As complete examples, a ceramic cap with a sealant, a resin cap with an adhesive or the like can be cited.

Here, the cap member comprising resin can be manufactured by carrying out spot facing on a platy material substrate, and furthermore, by carrying out a dicing process. In addition, metal plating (for example, Ni/Au plating) may be carried out at least on the upper face outside the cap member. It is because the reliability thereof is more likely to be improved.

The cap member is attached on the solder resist layer by interposing a adhesive (resin) in the substrate for mounting an IC chip according to one embodiment illustrated in FIG. 4 while the cap member may be attached to the portion in which the solder resist layer is not formed by interposing solder in a substrate for mounting an IC chip according to the embodiments of the second aspect of the present invention. However, in the case where the cap member is attached by interposing solder, since a pad becomes necessary for the outermost layer, the design of a conductor circuit is restricted, and furthermore, the process for sealing solder is needed separately, it is desirable to attach the cap member by interposing an adhesive (resin). Here, also when attaching the cap member via an adhesive (resin), the same degree of reliability as in the case of attaching it by interposing solder tends to be obtained.

In addition, the cap member is attached so that each of the mounted optical elements is covered separately in the substrate for mounting an IC chip according to one embodiment illustrated in FIG. 4 while the embodiment in which the cap member is attached is not limited to this embodiment in a substrate for mounting an IC chip according to the embodiments of the second aspect of the present invention.

Figure 5:
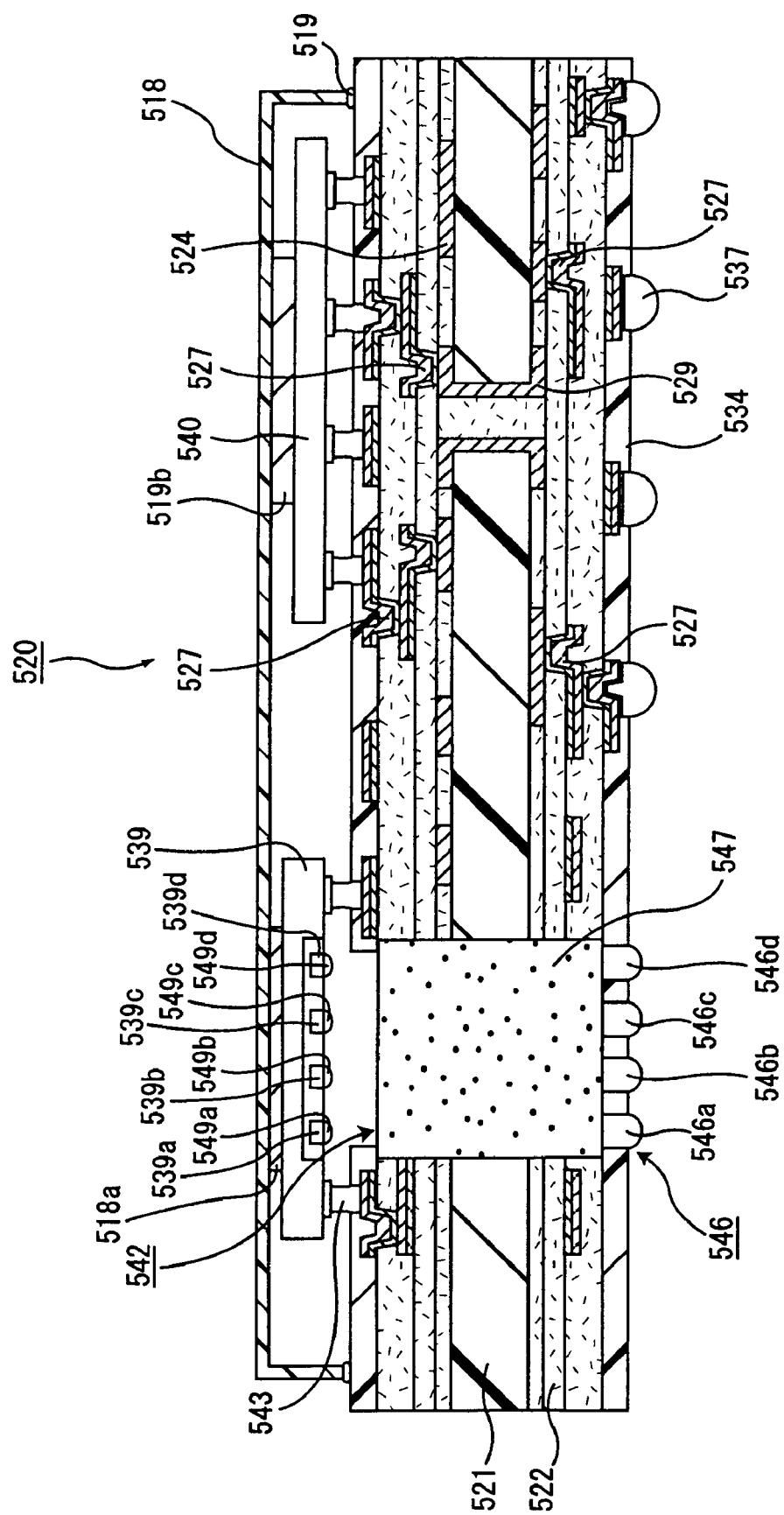
FIG. 5 is a cross-sectional view schematically illustrating an example of a substrate for a motherboard according to one embodiment of the second aspect of the present invention.

FIG. 5 is a cross-sectional view which schematically illustrates another embodiment of a substrate for mounting an IC chip according to the embodiments of the second aspect of the present invention.

As illustrated in FIG. 5, in a substrate for mounting an IC chip 520, a cap member 518 which can cover a light receiving element 539 and an IC chip 540 collectively is attached. In a substrate for mounting an IC chip on which an optical element is mounted, since it becomes necessary to reduce the distance between the optical element and the IC chip as a the signal transmission rate becomes fast, and since the space where the cap member is placed between the optical element and the IC chip becomes small, it is more desirable in some cases to attach the cap member so as to collectively cover the light receiving element and the IC chip.

In addition, the cap member may be attached so as to collectively cover a surface mount device such as a resistance and a capacitor in addition to an optical element.

Here, the substrate for mounting an IC chip 520 has approximately the same configuration as the substrate for mounting an IC chip 120 illustrated in FIG. 2, except that the optical element sealing layer is not formed and the cap member 518 is attached so as to collectively cover the light receiving element 539 and the IC chip 540.

However, they are different in that in the substrate for mounting an IC chip 520 illustrated in FIG. 5, each of the micro lenses are provided on the light receiving portion of the light receiving element 539 and the light emitting portion of the light emitting element 538 and micro lenses are not provided on the portion where an optical path for transmitting an optical signal penetrates through the solder resist layer.

In addition, in the substrate for mounting an IC chip according to one embodiment illustrated in FIG. 5, heat sink portions 519a, 519b for radiating heat in an optical element or an IC chip are provided in the cap member 518. The IC chip and the optical element generate heat when operating, especially the heating value of the IC chip is large, and the heat of the IC chip sometimes shortens the life of the optical element mounted in the vicinity and stops the operation of the optical element. However, provision of a heat sink portion inside a cap member tends to prevent such inconveniences more certainly.

A cap member provided with the above described heat sink portion is not particularly limited if heat can be radiated. As illustrated in FIG. 5, heat sink portions 519a, 519b may be provided inside a cap member, a cap member may comprise metal, ceramics or the like, and the cap member itself may function as a heat sink portion. In addition, when the cap member comprises resin, the cap member in which the heat sink portion comprising metal, ceramics, and the like is formed can be used. That is, the heat sink portions may be formed separately from the cap member, or may be formed integrally with the cap member.

Here, when the above described cap member comprises ceramics, the material is desirably alumina, aluminum nitride, and the like which have excellent thermal conductivity.

The shape of the above described heat sink portion may be any shape such as a quadrangular pillar.

In addition, it is necessary for the cap member provided with the heat sink portion to be attached so that an adhesive and resin having excellent thermal conductivity are applied onto the surface of an IC chip and an optical element, and so that the heat of an IC chip and the like is more likely to be radiated via this adhesive and the like from the heat sink portion.

The substrate for mounting an IC chip according to the embodiments of the second aspect of the present invention is not necessarily limited to the embodiments illustrated in FIGS. 4 and 5. A cap member which integrally covers a plurality of optical elements may be attached thereon, and furthermore, the cap member which integrally covers a plurality of optical elements and IC chips may be attached thereon. It is because a low parts count can be achieved and a substrate for mounting an IC chip may be manufactured more easily.

In an a substrate for mounting an IC chip according to the embodiments of the second aspect of the present invention, as well as a substrate for mounting an IC chip according to the embodiments of the first aspect of the present invention, a gap part is desirably formed in the portion between the above described optical path for transmitting an optical and the bottom surface of the above described optical element.

In addition, in the substrate for mounting an IC chip according to the embodiments of the second aspect of the present invention, as well as the substrate for mounting an IC chip according to the first aspect of the embodiments of the present invention, the optical element mounted on an outermost layer is desirably a light receiving element and/or a light emitting element.

Here, as described above, the substrate for mounting an IC chip according to the embodiments of the second aspect of the present invention has approximately the same configuration as the substrate for mounting an IC chip according to the embodiments of the first aspect of the present invention, except that the cap member is attached instead of the optical element sealing layer. Accordingly, also in the substrate for mounting an IC chip according to the embodiments of the second aspect of the present invention, a multi-channel optical element may be mounted as an optical element, an optical path for transmitting an optical signal in a collective through hole structure and an optical path for transmitting an optical signal in an individual through hole structure may be formed, and/or a micro lens may be formed.

In addition, when an optical element and a surface mount device to which other cap members are attached are of a wire bonding type, since an optical element and the like are protected by attaching a cap member thereto, after wire bonding is carried out, sealing is not necessarily necessary; however, in the case where wire bonding is not sealed, since it becomes difficult to handle wire bonding until attaching a cap member, it is desirable to seal wire bonding.

Next, a method for manufacturing a substrate for mounting an IC chip according to the embodiments of the second aspect of the present invention is described.

Here, the substrate for mounting an IC chip according to the embodiments of the second aspect of the present invention can be manufactured with approximately the same method as the method for manufacturing a substrate for mounting an IC chip according to the embodiments of the first aspect of the present invention, except that in the process (14) for manufacturing a substrate for mounting an IC chip according to the first aspect of the present invention, an optical element sealing layer is not formed and a cap member is attached so as to cover the optical element which is disposed on an outermost layer.

As a method for attaching the above described cap member so as to cover the above described optical element, for example, after applying an uncured resin composite onto a predetermined portion of a cap member or a predetermined portion of a solder resist layer in advance, the cap member is placed thereon, and furthermore, the cap member is temporarily fastened by hardening this uncured resin composite through the B-stage. After that, a load of at least about 1 g/cm$^2$ and at most about 1000 g/cm$^2$ can be applied by putting weight on the cap member or fixing the cap member with a jig such as a clip, and the cap member can be attached by hardening the resin composite in this state in an oven.

In addition, after adhering the resin film made in the B-stage on the predetermined portion of the cap member or the predetermined portion of the solder resist layer in advance, the cap member can be placed, and furthermore, the cap member can be temporarily fastened by hardening this resin film. After that, a load of at least about 1 g/cm$^2$ and at most about 1000 g/cm$^2$ can be applied by putting weight on the cap member or fixing the cap member with a jig such as a clip, and the cap member can be attached by hardening the resin film in this state in an oven.

In addition, by applying a solder paste on the predetermined portion of the cap member or the predetermined portion on an outermost insulating layer in advance, placing a cap member on a predetermined position, carrying out reflow processing, a method for attaching a cap member can be used.

In addition, in attaching a cap member using this method, the cap member may be attached so as to cover one optical element, integrally cover a plurality of optical elements, or in some cases, integrally cover one or a plurality of cap member (s) and a surface mount device such as an IC chip.

In addition, from a viewpoint of reliability, it is desirable for an adhesive used when attaching a cap member not to spread at the time of hardening. Accordingly, in a substrate for mounting an IC chip according to the embodiments of the second aspect of the present invention, it is desirable to use a resin composite which has the same property as resin used when forming an optical element sealing layer.

In addition, in the manufacture of a substrate for mounting an IC chip according to the embodiments of the second aspect of the present invention, when various kinds of surface mount devices are mounted inside the cap member by interposing solder bumps, flux cleaning is desirably carried out after mounting the above described surface mount devices. It is because in the case where flux cleaning is not carried out after mounting surface mount devices, after manufacturing a substrate for mounting an IC chip, flux component is solidified and peeled, and intrudes inside an optical path for transmitting an optical signal as foreign matter, and in some cases, transmission loss of an optical signal increases and it becomes impossible to transmit an optical signal. For the above described reason, it is not desirable to use flux in order to solder a cap member.

By using such a method, the substrate for mounting an IC chip according to the embodiments of the second aspect of the present invention can be manufactured.

In a substrate for mounting an IC chip according to the embodiments of the second aspect of the present invention described so far, a substrate and an insulating layer comprise a resin material.

However, also in the case where the substrate, the insulating layer, and the like comprise materials other than resin, for example, glass, ceramics, etc., the same effect as in the substrate for mounting an IC chip according to the embodiments of the second aspect of the present invention may be obtained.

That is, in a substrate for mounting an IC chip on which an optical element is mounted on the circuit board comprising glass or ceramics, and to which a cap member is attached so as to cover at least this optical element, the same effects as in the above described substrate for mounting an IC chip according to the embodiments of the second aspect of the present invention tend to be obtained.

Next, a device for optical communication according to the embodiments of the third aspect of the present invention is described.

Here, a substrate for a motherboard in the device for optical communication according to the third aspect of the present invention may have a substrate as a base and may have a structure where insulating layers and conductor circuits are formed and layered on at least one side thereof; or it may not have a substrate as a base and may have a structure (coreless structure) where insulating layers and conductor circuits are formed and layered.

The following description will discuss the substrate for a motherboard in the device for optical communication according to the embodiments of the third aspect of the present invention citing the embodiment in which insulating layers and conductor circuits are formed and layered on at least one side of a substrate.

In the device for optical communication according to the embodiments of the third aspect of the present invention, a substrate for mounting an IC chip is mounted on a substrate for a motherboard.

As the above described substrate for mounting an IC chip, the above described substrate for mounting an IC chip according to the embodiments of the first aspect of the present invention and the above described substrate for mounting an IC chip according to the embodiments of the second aspect of the present invention can be cited as examples. In addition, besides these substrates for mounting an IC chip, for example, the below described substrate for mounting an IC chip having an optical path for transmitting an optical signal in recess form (hereinafter, also referred to as the substrate for mounting an IC chip according to the third embodiment) and the like can be cited as examples.

The above described substrate for mounting an IC chip according to the third embodiment is described.

Figure 6:
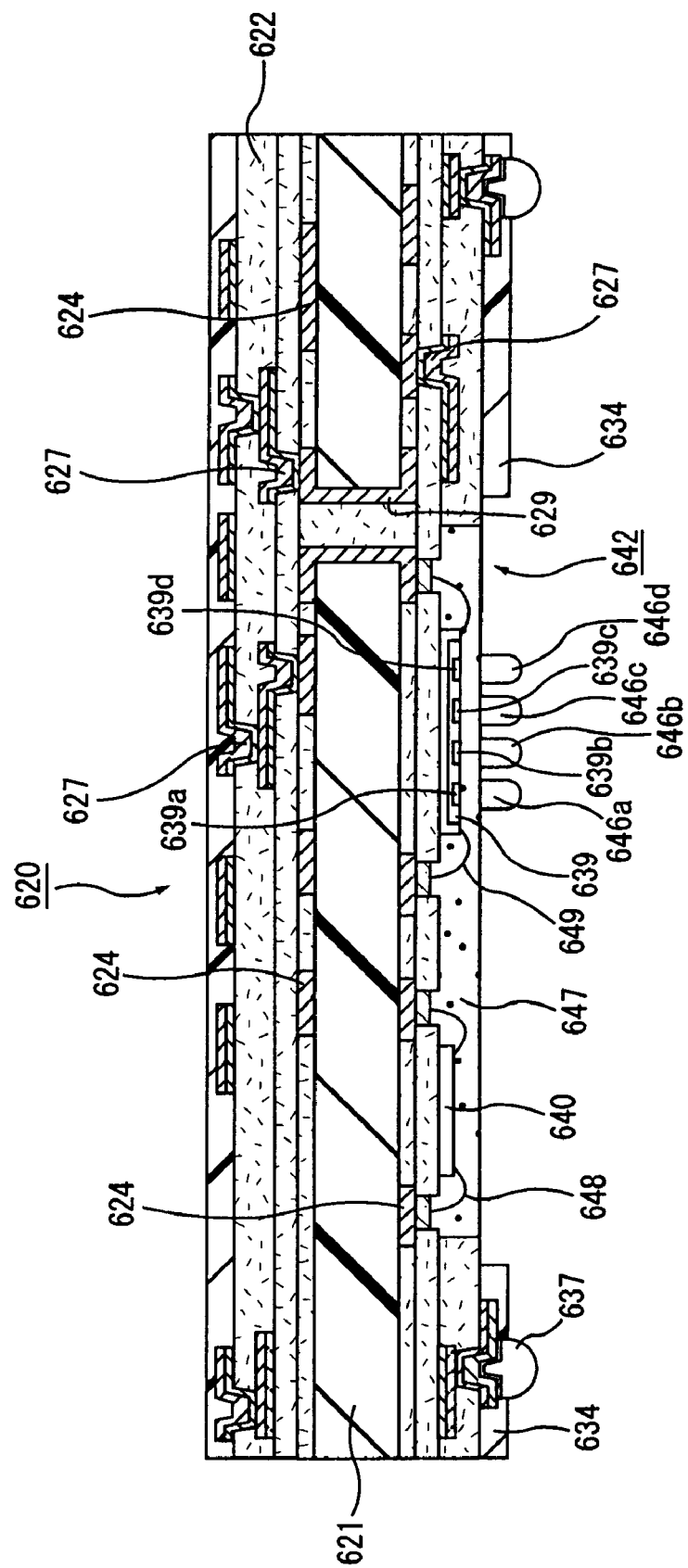
FIG. 6 is a cross-sectional view schematically illustrating an example of embodiment of a substrate for mounting an IC chip which is mounted on a device for optical communication according to the present invention.

FIG. 6 is a sectional view schematically illustrating an example of a substrate for mounting an IC chip according to the third embodiment.

In a substrate for mounting an IC chip 620 according to the third embodiment illustrated in FIG. 6, conductor circuits 624 and insulating layers 622 are formed and layered on both sides of a substrate 621, and conductor circuits which sandwich the substrate 621 and conductor circuits which sandwich the insulating layers 622 are electrically connected to each other through holes 629 or via holes 627. In addition, solder resist layers 634 are formed as outermost layers. Furthermore, an optical path for transmitting an optical signal 642 in recess form is formed in a substrate for mounting an IC chip 620. Inside this optical path for transmitting an optical signal 642, a four-channel light receiving element 639 and an IC chip 640 are mounted and connected through wire bonding 648, and furthermore, part of the optical path for transmitting an optical signal 642 is filled in with a resin composite 647.

In addition, solder bumps 637 are formed in the solder resist layer 634 on the side where the optical path for transmitting an optical signal in recess form is formed.

Here, an IC chip may be mounted on the surface of the side opposite to the side on which the optical path for transmitting an optical signal is formed.

Therefore, an input signal to a four-channel light receiving element 639 is to be transmitted via an optical path for transmitting an optical signal 642. Here, the optical path for transmitting an optical signal 642 is large in size enough to transmit an optical signal for four channels and is formed in part of an insulating layer 623 and a solder resist layer 634 in recess form.

Four micro lenses 646a to 646d are provided on an end portion of a resin composite 647 on the side opposite to the side where an optical element 639 is mounted in this optical path for transmitting an optical signal 642. Here, each of the micro lenses 646a to 646d are provided on the positions corresponding to each of the channels 639a to 639d of the light receiving element 639.

Accordingly, an optical signal to the light receiving element 639 passes through the micro lenses 646a to 646d. As thus described, by providing the micro lenses 646a to 646d, the transmission loss of an optical signal tends to be suppressed. In the substrate for mounting an IC chip according to the third embodiment, it is necessary for a micro lens to be provided according to need, and a portion where an optical path for transmitting an optical signal penetrates through a solder resist layer may be filled in with a resin composite or it may be formed of a gap.

Here, with regard to the size of the openings in a plan view in a portion where an optical path for transmitting an optical signal penetrates through a solder resist layer and the portion which is formed in an insulating layer, as illustrated in FIG. 6, the portion where the optical path for transmitting an optical signal penetrates through a solder resist layer may be larger, both may be approximately the same, or the portion which is formed in the insulating layer may be larger. In addition, in this case, a formed layer (lens marker) for providing a micro lens may be manufactured in advance.

In the following, the above described formed layer is briefly described.

In manufacturing the above described formed layer, before providing a micro lens, the resin layers for formed layers are formed by applying resin for forming a micro lens on the periphery including the portion on which a micro lens is formed, and furthermore, by carrying out a process through exposure to light and development, a formed layer (lens marker) in a round pillar shape which is to be a foundation of a micro lens is formed in the portion where a micro lens is provided.

Thus, by forming a formed layer, when the resin composite for forming a micro lens is dropped in the subsequent processes, while the resin composite spherically spreads on the formed layer due to a surface tension, this resin composite does not spread to a region larger than the formed layer. Therefore, it becomes unlikely for the unevenness of a lens diameter or height to occur. Here, with regard to the above described lens markers, the lens markers disclosed in JP-A 2002-331532 can be cited as an example. In addition, the optical path for transmitting an optical signal may be formed only in the portion on which a micro lens is provided on a solder resist layer.

The contents of JP-A 2002-331532 are incorporated herein by reference in their entirety.

In the substrate for mounting an IC chip 620 comprising such a configuration, the electrical signal transmitted via external optical parts (an optical fiber, an optical waveguide, and the like) will be transmitted to the light receiving element 639 (light receiving portion 639*a*) via micro lenses 646*a* to 646*d* and the optical path for transmitting an optical signal 642, and will be sent to an IC chip 640 via the wire bonding 649, the conductor circuit 624, via holes 627, and the like and be processed after being converted to electrical signals in this light receiving element 639.

In addition, in the substrate for mounting an IC chip 620, since solder bumps 637 are formed on a metal plating layer at a solder resist layer 634, electrical signals between an IC chip 640, an external substrate, and the like can be transmitted via the solder bumps 637.

In the case where the solder bumps are formed in such a manner, the above described substrate for mounting an IC chip tends to be connected to an external substrate such as a substrate for a motherboard by interposing the solder bumps and in this case the above described package substrate may be placed more easily at a predetermined position by the self-alignment function of the solder.

In addition, as the shape of the optical path for transmitting an optical signal in the above described recess form, besides the portion of the above described optical path for transmitting an optical signal which is formed in the insulating layer and the portion where the above described optical path for transmitting an optical signal penetrates through a solder resist layer, a round pillar, a rectangular pillar, a cylindroid shape, a form where a number of round pillars are aligned in parallel and portions of sides of adjacent round pillars are connected to each other, pillar form where the bottom is surrounded by a line and an arc, and the like can be cited as examples. Here, the portion formed in the above described insulating layer and the portion formed in the above described solder resist layer do not necessarily have the same shape.

In addition, with regard to the above described optical path for transmitting an optical signal in recess form, the cross-sectional area thereof is desirably about 100 mm$^2$ or more. A more desirable cross-sectional area thereof is about 200 mm$^2$ or more. This value, regardless of a value of the wavelength and the like, enables optical signals to be transmitted and received.

The substrate for mounting an IC chip on which a light receiving element and a light emitting element are mounted is described in the description of the substrate for mounting an IC chip according to the third embodiment illustrated in FIG. 6. In the substrate for mounting an IC chip according to the above described embodiment, a light emitting element may be mounted as an optical element instead of a light receiving element, and in this case, it is necessary for the configuration of this substrate for mounting an IC chip to be the same as the above described one, except that a light receiving element is replaced with a light emitting element. In addition, both the light receiving element and the light emitting element may be mounted thereon.

In the device for optical communication according to the embodiments of the third aspect of the present invention, a substrate for mounting an IC chip of this kind is mounted on a substrate for a motherboard.

In the above described substrate for a motherboard, conductor circuits and insulating layers are formed and layered at least on one side of a substrate, an optical waveguide is formed thereon, and furthermore, an optical path for transmitting an optical signal is formed.

The optical waveguide is formed on the above described substrate for a motherboard, and optical signals may be transmitted more easily via this optical waveguide. In addition, in the above described substrate for a motherboard, in general, solder resist layers are formed on outermost layers so as to protect conductor circuits.

An organic based optical waveguide comprising a polymer material or the like, silica glass, an inorganic based optical waveguide comprising a compound semiconductor or the like can be cited as the above described optical waveguide. From among these, an organic based optical waveguide comprising a polymer material is desirable. This is because such an optical waveguide has high adhesiveness to an insulating layer and processing is easy.

The above described polymer material is not particularly limited, as long as it has little absorption for a wavelength band for communication, and a thermosetting resin, a thermoplastic resin, a photosensitive resin, a resin where a portion of a thermosetting resin is made photosensitive, a resin compound of a thermosetting resin and a thermoplastic resin, a compound of a photosensitive resin and a thermoplastic resin, and the like can be cited.

Specifically, polymers manufactured from an acrylic resin such as PMMA (polymethyl methacrylate), deuterated PMMA or deuterated PMMA fluoride, a polyimide resin such as polyimide fluoride, an epoxy resin, a UV curing epoxy resin, a polyolefin based resin, a silicone resin such as deuterated silicone resin, a siloxane resin, benzocyclobutene or the like can be cited.

In addition, in the case where the above described optical waveguide is an optical waveguide having multiple modes, the material is desirably an acrylic resin, an epoxy resin or a UV curing epoxy resin, and in the case where the above described optical waveguide is an optical waveguide having a single mode, the material is desirably a polyimide resin, a silicone resin or a siloxane resin.

In addition, the thickness of the core portion of the above described optical waveguide is desirably at least about 1 μm and at most about 100 μm, and the width thereof is desirably at least about 1 μm and at most about 100 μm. In the case where the above described width is about 1 μm or more, the optical waveguide may be formed more easily. Meanwhile, in the case where the above described width is less than about 100 µm, this tends not to hinder the freedom in design of the conductor circuit and the like which form the multilayer printed circuit board.

In addition, the ratio of the thickness to the width in the core portion of the above described optical waveguide is desirably about (1:1). This is because the form in the light receiving portion of the above described light receiving element and the form in the light emitting portion of the above described light emitting element are circular in a plan view. Here, the above described ratio of the thickness to the width is not particularly limited, and usually, it is necessary for it to fall in the range of about (1:2) to about (2:1).

Furthermore, in the case where the above described optical waveguide is an optical waveguide having a single mode with a wavelength for communication of 1.31 µm or 1.55 µm, the thickness and the width in this core portion are desirably at least about 5 µm and at most about 15 µm, and most desirably about 10 µm. In addition, in the case where the above described optical waveguide is an optical waveguide having multiple modes with a wavelength for communication of 0.85 µm, the thickness and the width in this core portion are more desirably at least about 20 µm and at most about 80 µm, and most desirably about 50 µm.

In addition, particles may be mixed in within the optical waveguide. This is because it becomes unlikely for cracks to occur in the optical waveguide when particles are mixed in. That is, in the case where no particles are mixed in within the optical waveguide, cracks may sometimes occur in the optical waveguide due to the difference in the coefficient of thermal expansion between the optical waveguide and the other layer (substrate, insulating layer or the like), but in the case where the difference in the coefficient of thermal expansion between the optical waveguide and the above described other layer is made small by adjusting the coefficient of thermal expansion when mixing particles into the optical waveguide, it becomes unlikely for cracks to occur in the optical waveguide.

In addition, the above described optical waveguide may include particles, for example, resin particles, inorganic particles, metal particles or the like in addition to the above described resin component. This is because the matching of the coefficient of thermal expansion or an index of refraction may be achieved more easily between the above described optical waveguide and the insulating layer, the solder resist layer or the like by including these particles.

As the above described resin particles, a thermosetting resin, a thermoplastic resin, a photosensitive resin, a resin where a portion of a thermosetting resin is made photosensitive, a resin compound of a thermosetting resin and a thermoplastic resin, a compound of a photosensitive resin and a thermoplastic resin, and the like can be cited.

Specifically, for example, a thermosetting resin such as an epoxy resin, a phenolic resin, a polyimide resin, a bismaleimide resin, a polyphenylene resin, a polyolefin resin, a fluorine resin; a resin in which the thermosetting group of such a thermosetting resin (for example, the epoxy group in an epoxy resin) is reacted with methacrylic acid, acrylic acid, or the like, and which is added to the acrylic group; a thermoplastic resin such as a phenoxy resin, polyether sulfone (PES), polysulfone (PSF), polyphenylene sulfone (PPS), a polyphenylene sulfide (PPES), polyphenylene ether (PPE), and polyether imido (PI); a photosensitive resin such as an acrylic resin, and the like can be cited.

In addition, a resin compound of the above described thermosetting resin and the above described thermoplastic resin, a resin having the above described acrylic group, or a resin compound of the above described photosensitive resin and the above described thermoplastic resin can also be used.

With regard to the above described resin particles, resin particles comprising rubber can also be used.

In addition, with regard to the above described inorganic particles, particles comprising aluminum compounds such as alumina and aluminum hydroxide, calcium compounds such as calcium carbonate and calcium hydroxide, potassium compounds such as potassium carbonate, magnesium compounds such as magnesia, dolomite and basic magnesium carbonate, silicon compounds such as silica and zeolite, titanium compounds such as titania, and the like can be cited as examples. In addition, particles having a mixed component where at least two kinds of inorganic materials are mixed or melted together may be used. Particles which are gained by mixing at a given rate, melting, and homogenizing silica and titania may be used.

In addition, phosphorus or phosphorus compounds can be used as the above described inorganic particles.

With regard to the above described metal particles, gold, silver, copper, palladium, nickel, platinum, iron, zinc, lead, aluminum, magnesium, calcium, and the like can be cited as examples.

These resin particles, inorganic particles or metal particles may be solely used or two or more kinds may be used together.

As the above described particles, the same particles as those included in the above described optical path for transmitting an optical signal can be cited as examples. These particles may be used alone, or two or more kinds may be used together.

As the above described particles, inorganic particles are desirable, and particles comprising silica, titania or alumina are desirable. In addition, particles having a mixed component where at least two from among silica, titania and alumina are mixed and fused are also desirable.

In addition, the form of the above described resin particles is not particularly limited, and sphere, elliptical sphere, rubble, polyhedron and the like can be cited.

In addition, the particle diameter of the above described particles is desirably smaller than the wavelength for communication. This is because in the case where the particle diameter is smaller than the wavelength for communication, transmission of an optical signal tends not to be obstructed.

The lower limit of the above described particle diameter is more desirably about 0.01 µm and the upper limit is more desirably about 0.8 µm. This is because in the case where particles within this range are included, distribution in the particle diameter tends not to be too wide, and inconsistency of the viscosity of the resin composite tends not to occur when the particles are mixed into the resin composite, and thus, reproducibility in preparing the resin composite tends to be good, and a resin composite having a predetermined viscosity tends to be prepared.

More desirably, the lower limit of the above described particle diameter is about 0.1 µm and the upper limit is about 0.8 µm. In the case where the particle diameter is within this range, it is appropriate for the resin composite to be applied using a spin coat method, a roll coating or the like, and it may become easier to prepare a resin composite having a predetermined viscosity when the resin composite is prepared by mixing in particles.

Particularly desirably, the lower limit of the above described particle diameter is about 0.2 µm and the upper limit thereof is about 0.6 µm. This range is particularly appropriate for the application of the resin composite and formation of the core portion of the optical waveguide. Furthermore, inconsistency in the formed optical waveguides, in particular, inconsistency in the core portion, becomes very small, and the properties of the substrate for a motherboard become particularly excellent.

In addition, particles of two or more different particle diameters may be included, as long as the particles have a particle diameter within this range.

A desirable lower limit of the amount of particles mixed in as described above is about 10% by weight, and a more desirable lower limit is about 20% by weight. Meanwhile, a desirable upper limit of the above described particles is about 80% by weight, and a more desirable upper limit is about 70% by weight. This is because in the case where the amount of particles mixed in is about 10% by weight or more, the effects of mixing particles may be gained more easily, and in the case where the amount of particles mixed in is about 80% by weight or less, transmission of an optical signal tends not to be obstructed.

In addition, though the form of the above described optical waveguide is not particularly limited, sheet form is preferable, because this makes formation easy.

In addition, in the case where the above described optical waveguide is formed of a core portion and a clad portion, though the above described particles may be mixed into both the core portion and the clad portion, it is desirable for the core portion not to have particles mixed in, and for only the clad portion that covers the surrounding of this core portion to have particles mixed in. The reason for this is as follows.

That is, in the case where particles are mixed in within an optical waveguide, an air layer or a void may be formed in the interface between the particles and the resin component, depending on the adhesiveness between these particles and the resin component of the optical waveguide. In such a case, the direction of refraction of light is changed by this air layer or a void, increasing the transmission loss of the optical waveguide, while in the case where particles are mixed only in the clad portion, problems that the transmission loss of the optical waveguide increases tend not to arise when particles are mixed in as described above, and it may become difficult for cracks to occur in the optical waveguide.

In addition, an optical path conversion mirror is desirably formed in the above described optical waveguide. This is because it becomes possible to change the optical path by a desired angle by forming an optical path conversion mirror.

The above described optical path conversion mirror can be formed by cutting an end portion of the optical waveguide as described below. In addition, a member having an optical path converting portion may be placed at the end of an end portion of the optical waveguide instead of forming an optical path conversion mirror in the optical waveguide.

In addition, in the above described substrate for a motherboard, the optical path for transmitting an optical signal is desirably formed at least in the insulating layer and one side of the two solder resist layers, and the portions other than the portion where the above described optical path for transmitting an optical signal penetrates through the above described solder resist layer are preferably filled in with the resin composite. In addition, the optical path for transmitting an optical signal is desirably formed so as to penetrate through a substrate, insulating layers, and one side of the two solder resist layers, and a resin composite is desirably filled in with portions other than the portion where the above described optical path transmitting an optical signal penetrates through the above described solder resist layer. Of course, the portion where the above described optical path transmitting an optical signal penetrates through the above described solder resist layer may also be filled in with the resin composite.

Here, as a resin composite with which they are filled in, the same resin composite as the resin composite with which an optical path for transmitting an optical signal is filled in and the like can be cited in the above described substrate for mounting an IC chip according to the embodiments of the first aspect of the present invention.

In addition, in the above described device for optical communication according to the embodiments, the cross-sectional diameter of the portion where the above described optical path for transmitting an optical signal penetrates through the above described optical solder resist layer may be smaller than that of the portion of the above described optical paths for transmitting optical signals which is formed in the above described insulating layer. In this case, when the portion where the optical path for transmitting an optical signal penetrates through an insulating layer is filled in with a resin composite, and the portion where the optical path for transmitting an optical signal penetrates through the solder resist layer is formed of a gap, the boundary portion between the portion where the optical path for transmitting an optical signal penetrates through the insulating layer and the resin composite gets covered up with part of the above described solder resist layer, and the above described boundary portion and the outer periphery of the above described resin composite are adhered to by the above described solder resist layers, and as a result, it may become unlikely for separations (peeling) and cracks to occur, leading to excellent reliability.

Here, a specific value of the cross-sectional diameter of the above described portion where an optical path for transmitting an optical signal penetrates through a solder resist layer may be appropriately chosen according to the design of a substrate for mounting an IC chip, but it is usually desirably at least about 50 µm and at most about 490 µm.

In addition, in the above described substrate for a motherboard, micro lenses may be provided on an end portion of the resin composite with which portions other than the portion where the above described optical path for transmitting an optical signal penetrates through the above described solder resist layer are filled in, which corresponds to the portion where the above described optical path for transmitting an optical signal penetrates through a solder resist layer. It is because an optical signal tends to be certainly transmitted by providing a micro lens.

Here, with regard to the features and the like such as the material and transmittance of the above described micro lens, the same features and the like as in the micro lens which is provided on the above described substrate for mounting an IC chip according to the embodiments of the first aspect of the present invention can be cited.

In the above described substrate for a motherboard, just as the substrate for mounting an IC chip according to the embodiments of the first aspect of the present invention, a surface treatment may be carried out on the region on which the above described micro lens is provided.

In addition, conductor layers may be formed on the wall surface of the above described optical path for transmitting an optical signal.

The formation of the above described conductor layer tends to reduce diffused reflection of light from the wall surface of the optical path for transmitting an optical signal and increase the transmissivity of the optical signal. The above described conductor layer may be formed of one layer, or may comprise two or more layers.

As the above described conductor layer, the same conductor layer as the one formed on the wall surface of the optical path for transmitting an optical signal can be cited.

In addition, in the above described substrate for a motherboard, when the solder resist layer is formed as an outermost layer, the lower limit of the thickness of this solder resist layer is desirably about 10 μm, and more desirably about 15 μm. On the other hand, the upper limit thereof is desirably about 40 μm, and more desirably about 30 μm.

In addition, in the above described substrate for a motherboard, conductor circuits which sandwich the above described substrate to be connected via through holes and for conductor circuits which sandwich the above described insulating layer are desirably connected through via holes. This is because miniaturization of the substrate for mounting an IC chip can be achieved while increasing the density of wires (circuits) of the substrate for mounting an IC chip.

In addition, in the above described device for optical communication, sealing layers of a substrate for mounting an IC chip are formed so as to make contact with the periphery of the substrate for mounting an IC chip, and as the material of the sealing layers of a substrate for mounting an IC chip, the same material as used in the optical element sealing layer concerning the above described substrate for mounting an IC chip according to the embodiments of the first aspect of the present invention can be cited as examples.

Accordingly, the above described sealing layers of a substrate for mounting an IC chip desirably comprise resin composite. Of course, the above described sealing layers of a substrate for mounting an IC chip may comprise solder.

In addition, as described in reference to the drawings in the following, in the above described device for optical communication according to the embodiments, a gap part is desirably formed in the portion between the bottom surface of the above described substrate for mounting an IC chip and the above described optical path for transmitting an optical signal. The reason for this is that just as the gap part is desirably formed in the portion between an optical path for transmitting an optical signal and the bottom surface of an optical element in a substrate for mounting an IC chip according to the embodiments of the first aspect of the present invention, it has an excellent optical transmissivity.

In the following, the embodiments of a device for optical communication according to the third aspect of the present invention are described in reference to the drawings.

Figure 7:
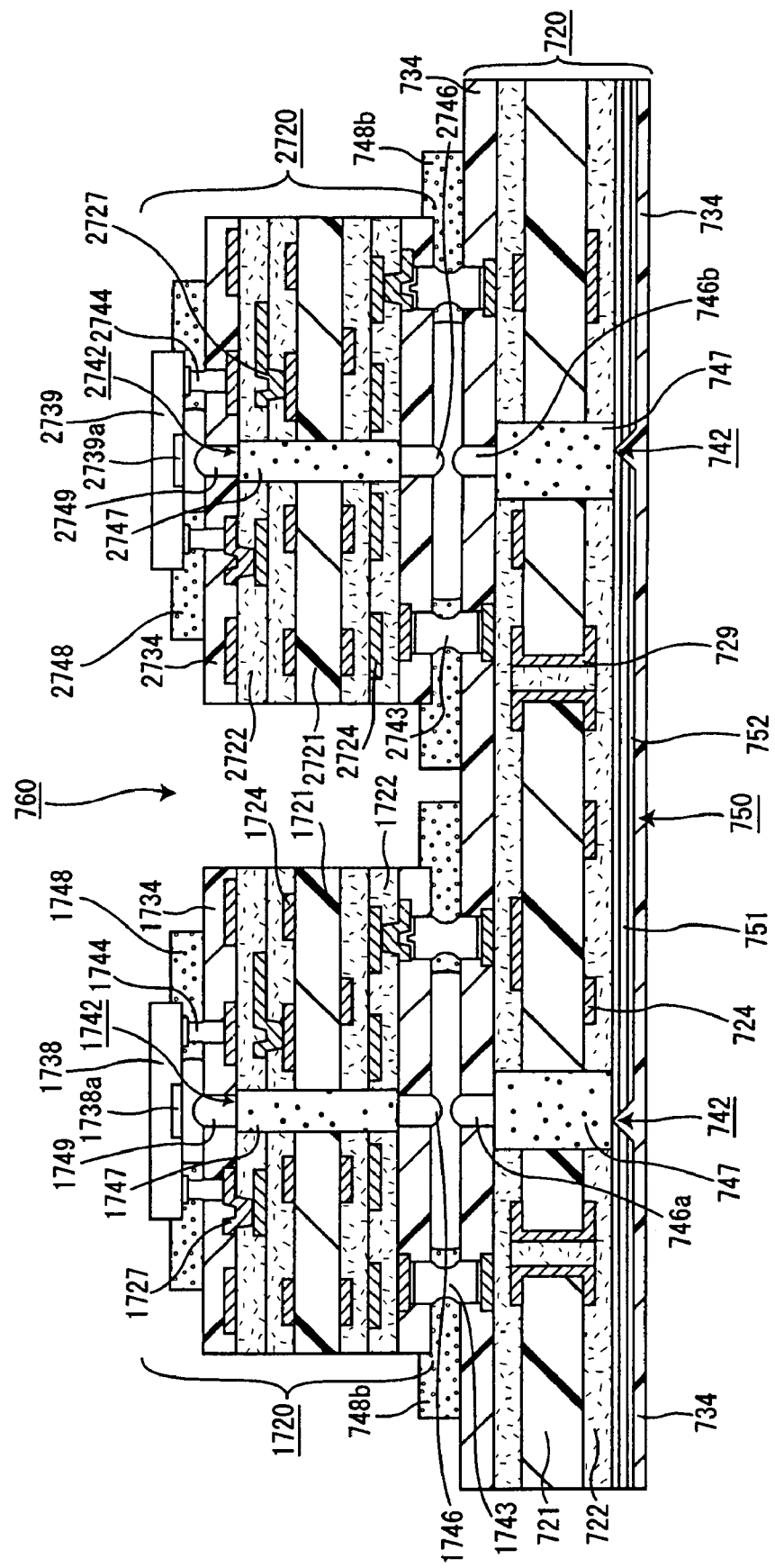
FIG. 7 is a cross-sectional view schematically illustrating an example of embodiment of a device for optical communication according to the third aspect of the present invention.

FIG. 7 is a cross-sectional view which schematically illustrates an example of embodiments of the device for optical communication according to the third aspect of the present invention.

In a substrate for a motherboard 720, a device for optical communication 760 on which a substrate for mounting an IC chip 2720 on which a light receiving element 2739 is mounted and a substrate for mounting an IC chip 1720 on which a light emitting element 1738 is mounted are mounted is illustrated in FIG. 7. Here, as substrates for mounting an IC chip 1720, 2720, a substrate for mounting an IC chip according to the embodiments of the first aspect of the present invention with an IC chip mounted thereon is mounted.

In the substrate for mounting an IC chip 1720, conductor circuits 1724 and insulating layers 1722 are formed and layered on both sides of a substrate 1721, and conductor circuits which sandwich the substrate 1721 are electrically connected to each other through a through hole (not illustrated), and conductor circuits which sandwich the insulating layer 1722 are electrically connected to each other through via holes 1727. In addition, solder resist layers 1734 are formed as outermost layers.

In this substrate for mounting an IC chip 1720, an optical path for transmitting an optical signal 1742 is provided so as to penetrate through the substrate 1721, the insulating layers 1722, and the solder resist layers 1734.

In this optical path for transmitting an optical signal 1742, the portion where the optical path for transmitting an optical signal penetrates through the substrate 1721 and the insulating layers 1722 is filled in with a resin composite 1747. In addition, a micro lens 1749 is provided on the side on which the light emitting element 1738 is mounted on the resin composite 1747, and a micro lens 1746 is provided on an end portion of the opposite side thereof and at the same time on the portion where the optical path for transmitting an optical signal 1742 penetrates through the solder resist layer.

On one side of a substrate for mounting an IC chip 1720, a light emitting element 1738 is mounted on the surface by interposing solder connection portions 1744 so that the light emitting portion 1738a face optical paths for transmitting optical signals 1742. Then, in the substrate for mounting an IC chip 1720, an optical element sealing layer 1748 is formed so as to make contact with the periphery of light emitting element 1738.

In addition, as is not illustrated, an IC chip is mounted on the surface mounted by interposing the solder connection portions on the same side as the side on which the light emitting element 1738 is mounted in the substrate for mounting an IC chip 1720.

In the substrate for mounting an IC chip 2720, conductor circuits 2724 and insulating layers 2722 are formed and layered on both sides of a substrate 2721, and conductor circuits which sandwich the substrate 2721 are electrically connected to each other through a through hole (not illustrated), and conductor circuits which sandwich the insulating layers 2722 are electrically connected to each other through via holes 2727. In addition, solder resist layers 2734 are formed as outermost layers.

In this substrate for mounting an IC chip 2720, an optical path for transmitting an optical signal 2742 is provided so as to penetrate through the substrate 2721, the insulating layer 2722, and the solder resist layer 2734.

In this optical path for transmitting an optical signal 2742, the portion where the optical path for transmitting an optical signal penetrates through the substrate 2721 and the insulating layer 2722 is filled in with a resin composite 2747. In addition, a micro lens 2749 is provided on the side on which the light receiving element 2739 is mounted on the resin composite 2747, and a micro lens 2746 is provided on an end portion of the opposite side thereof and at the same time on the portion where the optical path for transmitting an optical signal 2742 penetrates through the solder resist layer.

On one side of a substrate for mounting an IC chip 2720, a light receiving element 2739a is mounted on the surface by interposing solder connection portions 2744 so that each of the light receiving portion 2739 face an optical paths for transmitting optical signals 2742. Then, in the substrate for mounting an IC chip 2720, an optical element sealing layer is formed so as to make contact with the periphery of light receiving element 2739.

In addition, as is not illustrated, an IC chip is mounted on the surface mounted by interposing the solder connection portions on the same side as the side on which the light receiving element 2739 is mounted in the substrate for mounting an IC chip 2720.

In a substrate for a motherboard 720, conductor circuits 724 and insulating layers 722 are formed and layered on both sides of a substrate 721, and conductor circuits which sandwich the substrate 721 are electrically connected via through holes 729, and conductor circuits which sandwich the insulating layers 722 are electrically connected through via holes (not illustrated). In addition, solder resist layers 734 are formed as outermost layers.

In this substrate for a motherboard 720, an optical path for transmitting an optical signal 742 is provided so as to penetrate through the substrate 721, the insulating layers 722, and the solder resist layers 734.

In this optical path for transmitting an optical signal 742, the cross-sectional diameter of the portion where the optical path for transmitting an optical signal penetrates through the solder resist layer 734 is smaller than that of the portion where the optical path for transmitting an optical signal penetrates through the substrate 721 and the insulating layer 722. Here, in the substrate for a motherboard 720 which forms a device for optical communication according to the embodiments of the third aspect of the present invention, the cross-sectional diameter of the portion where the optical path for transmitting an optical signal penetrates through the solder resist layer 734 does not necessarily need to be smaller than that of the portion where the optical path for transmitting an optical signal penetrates through the substrate 721 and the insulating layer 722.

On the outermost insulating layer 722 on the side opposite to the side on which substrates for mounting an IC chip 1720 and 2720 are mounted on a substrate for a motherboard 720, an optical waveguide 750 comprising a core 751 and a clad 752 is formed.

In addition, optical path conversion mirrors are formed in each end portion of an optical waveguide 750, and it is formed so that an optical signal can be transmitted between the optical waveguide 750 and the optical path for transmitting an optical signal 742.

Here, as described below, the optical waveguide 750 is formed by cutting a predetermined portion using a diamond saw of which the edge is in a V shape at about 90 degrees and the like after layering a resin composite on the entirety or part of the outermost insulating layer. Here, in the substrate for a motherboard 720, the portion both sides of which are optically connected with the optical path for transmitting an optical signal 742 is to actually function as an optical waveguide.

In addition, micro lenses 746a, 746b are provided on the side opposite to the side where the optical waveguide 750 is formed on the optical path for transmitting an optical signal 742, and at the same time on the portion which this optical path for transmitting an optical signal 742 penetrates through a solder resist layer. Here, each of the micro lenses 746a and 746b is provided in such a position so as to correspond to each end portion of the core 751 on which end portion the optical path conversion mirrors are formed.

Then, in a device for optical communication 760, substrates for mounting an IC chip 1720 and 2720 are mounted by interposing solder connection portions 1743 and 2743 on the side opposite to the side where the optical waveguide 750 is formed in the substrate for a motherboard 720.

Here, each of the substrates for mounting an IC chip 1720 and 2720 is mounted on a predetermined position by the self-alignment function.

Furthermore, on one side of the solder resist layer 734, sealing layers of a substrate for mounting an IC chip 748a, 748b are formed so as to make contact with the periphery of substrates for mounting an IC chip 1720, 2720, and a gap part is formed right under the optical paths for transmitting optical signals which are formed in each of the sealing layers of a substrate for mounting an IC chip 748a, 748b. Accordingly, the sealing layers of a substrate for mounting an IC chip 748a, 748b are not formed in the portion where the optical paths for transmitting optical signals make contact with the substrates for mounting an IC chip 1720, 2720.

By forming such sealing layers of a substrate for mounting an IC chip 748a, 748b, dust, foreign matter, or the like tends not to intrude inside or on the optical path for transmitting an optical signal which is formed in the substrates for mounting an IC chip 1720, 2720 and an optical path for transmitting an optical signal 742 which is formed in a substrate for a motherboard, and thereby transmission of an optical signal tends not to be obstructed for lack of this dust or the like.

In addition, an optical signal is more likely to be efficiently condensed with a micro lens.

In the device for optical communication 760 comprising such a configuration, an electrical signal from an IC chip (not illustrated) which is mounted on the substrate for mounting an IC chip 1720 will be converted to an optical signal in a light emitting element 1738, the optical signal which is emitted from the light emitting element 1738 (light emitting portion 1738a) will be transmitted to a light receiving element 2739 (light receiving portion 2739a) via a micro lens 1749, an optical path for transmitting an optical signal 1742, a micro lens 1746, a micro lens 746a, an optical path for transmitting an optical signal 742, an optical waveguide 750, the optical path for transmitting an optical signal 742, a micro lens 746b, a micro lens 746, an optical path for transmitting an optical signal 2742, and a micro lens 2749, and furthermore, will be transmitted to an IC chip (not illustrated) which is mounted on a substrate for mounting an IC chip 2720 after being converted to an electric signal in a light receiving element 2739, and be processed.

In a device for optical communication of this kind, since dust, foreign matter, or the like tends not to intrude inside or on the optical path for transmitting an optical signal, an optical signal tends to be transmitted certainly.

Figure 8:
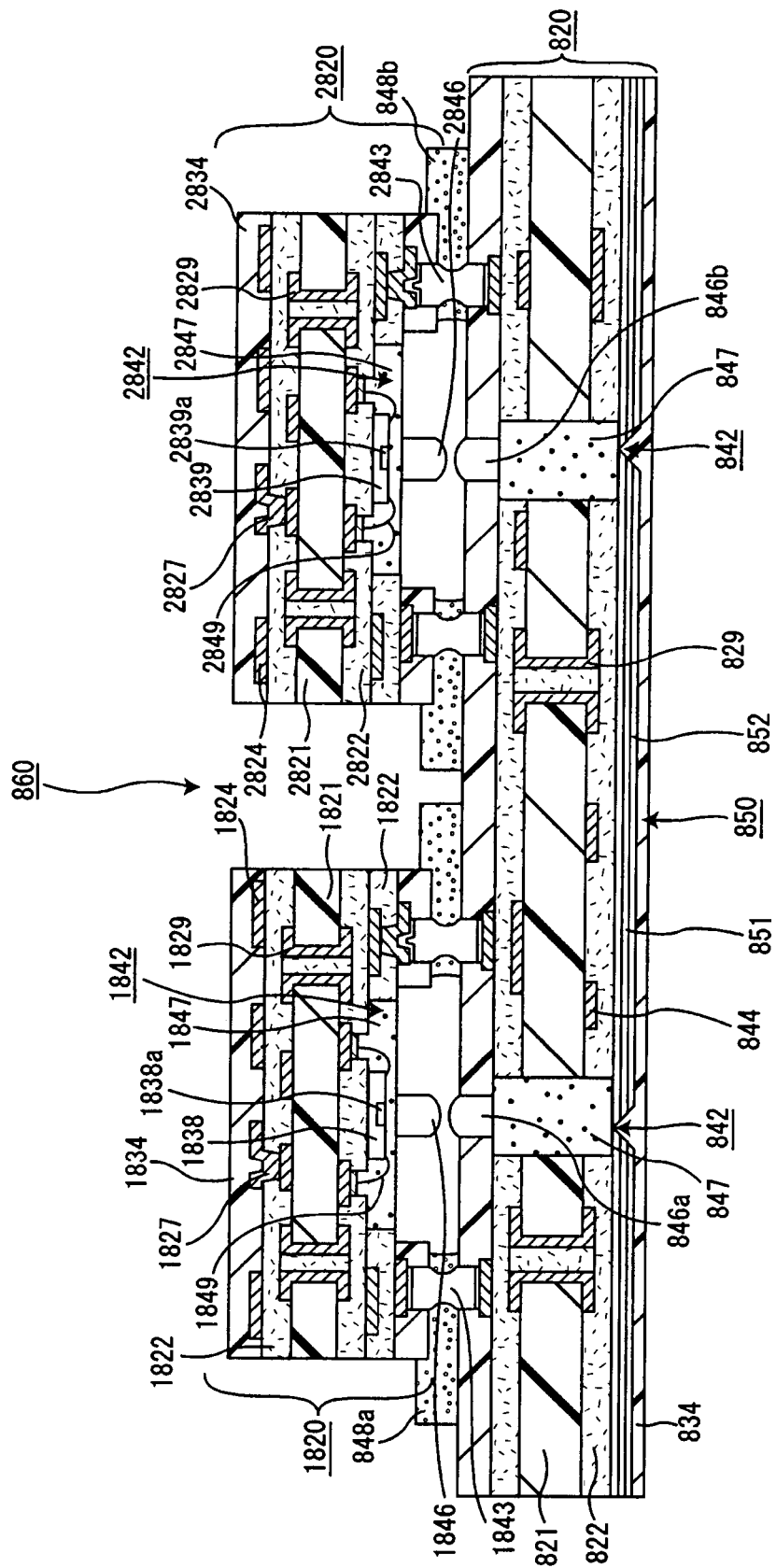
FIG. 8 is a cross-sectional view schematically illustrating another example of an embodiment of a device for optical communication according to the third aspect of the present invention.

In addition, the embodiments of the device for optical communication according to the embodiments of the third aspect of the present invention are not limited to an embodiment illustrated in FIG. 7, and for example, may be an embodiment illustrated in FIG. 8.

FIG. 8 is a cross-sectional view which schematically illustrates another example of embodiment of the device for optical communication according to the third aspect of the present invention. In a substrate for a motherboard 820, a device for optical communication 860 on which a substrate for mounting an IC chip 1820 on which a light emitting element 1838 is mounted and a substrate for mounting an IC chip 2820 on which a light receiving element 2839 is mounted are mounted is illustrated in FIG. 8. As the substrates for mounting an IC chip 1820, 2820, substrates for mounting an IC chip according to the third embodiment are mounted.

The device for optical communication 860 differs from the device for optical communication 760 illustrated in FIG. 7 in the structures of the substrates for mounting an IC chip 1820, 2820, but the substrate for a motherboard 820 has the same structure as the substrate for a motherboard 720.

Therefore, the embodiments of the device for optical communication 860 are described herein focusing on the structures of the substrates for mounting an IC chip 1820 and 2820.

In the substrate for mounting an IC chip 1820, conductor circuits 1824 and insulating layers 1822 are formed and layered on both sides of a substrate 1821, and conductor circuits which sandwich the substrate 1821 are electrically connected to each other through a through hole 1829, and conductor circuits which sandwich the insulating layer 1822 are electrically connected to each other through via holes 1827. In addition, solder resist layers 1834 are formed as outermost layers.

In this substrate for mounting an IC chip 1820, an optical path for transmitting an optical signal 1842 in recess form is provided.

In this optical path for transmitting an optical signal 1842, a light emitting element 1838 and an IC chip (not illustrated) are mounted through a wire bonding 1849, and furthermore, the portion where the optical path for transmitting an optical signal 1842 is formed in the insulating layer 1822 is filled in with a resin composite 1847.

In addition, a micro lens 1846 is provided on an end portion of the side opposite to the side on which the light emitting element 1838 is mounted on the resin composite 1847 and at the same time on the portion where the optical path for transmitting an optical signal 1842 penetrates through the solder resist layer 1834.

In addition, in the substrate for mounting an IC chip 2820, conductor circuits 2824 and insulating layers 2822 are formed and layered on both sides of a substrate 2821, and conductor circuits which sandwich the substrate 2821 are electrically connected to each other through a through hole 2829, and conductor circuits which sandwich the insulating layer 2822 are electrically connected to each other through via holes 2827. In addition, solder resist layers 2834 are formed as outermost layers.

In this substrate for mounting an IC chip 2820, an optical path for transmitting an optical signal 2842 in recess form is provided.

In this optical path for transmitting an optical signal 2842, a light receiving element 2839 and an IC chip (not illustrated) are mounted through a wire bonding 2849, and furthermore, the portion where the optical path for transmitting an optical signal 2842 is formed in the insulating layer 2822 is filled in with a resin composite 2847.

In addition, a micro lens 2846 is provided on an end portion of the side opposite to the side on which the light receiving element 2839 is mounted on the resin composite 2847 and at the same time on part of the portion where the optical path for transmitting an optical signal 2842 penetrates through the solder resist layer 2834.

In addition, the substrate for a motherboard 820 has the same configuration as the above described substrate for a motherboard illustrated in FIG. 7.

Then, in a device for optical communication 860, substrates for mounting an IC chip 1820, 2820 are mounted by interposing solder connection portions 1843, 2843 on the side opposite to the side where the optical waveguide 850 is formed in the substrate for a motherboard 820.

Here, each of the substrates for mounting an IC chip 1820, 2820 is mounted on a predetermined position by the self-alignment function.

Furthermore, on one side of the solder resist layer 834 in a substrate for a motherboard 820, sealing layers of a substrate for mounting an IC chip 848a, 848b are formed so as to make contact with the periphery of substrates for mounting an IC chip 1820, 2820, and a gap part is formed right under the optical paths for transmitting optical signals which are formed in each of the sealing layers of a substrate for mounting an IC chip 848a, 848b. Accordingly, the sealing layers of a substrate for mounting an IC chip 848a, 848b are not formed in the portion where the optical paths for transmitting optical signals make contact with the substrates for mounting an IC chip 1820, 2820.

By forming such sealing layers of a substrate for mounting an IC chip 848a, 848b, dust, foreign matter, or the like tends not to intrude inside or on the optical path for transmitting an optical signal which is formed in the substrates for mounting an IC chip 1820, 2820 and an optical path for transmitting an optical signal which is formed in a substrate for a motherboard, and thereby transmission of an optical signal tends not to be obstructed for lack of this dust or the like.

In addition, an optical signal is more likely to be efficiently condensed with a micro lens.

In the device for optical communication 860 comprising such a configuration, an electrical signal from an IC chip (not illustrated) which is mounted on the substrate for mounting an IC chip 1820 will be converted to the optical signal in the light emitting element 1838, an optical signal which is emitted from a light emitting element 1838 (light emitting portion 1838a) will be transmitted to a light receiving element 2839 (light receiving portion 2839a) via an optical path for transmitting an optical signal 1842, a micro lens 1846, a micro lens 846a, an optical path for transmitting an optical signal 842, an optical waveguide 850, the optical path for transmitting an optical signal 842, a micro lens 846b, a micro lens 2846, an optical path for transmitting an optical signal 2842, and furthermore, will be transmitted to an IC chip (not illustrated) which is mounted on a substrate for mounting an IC chip 2820 after being converted to an electric signal in a light receiving element 2839, and be processed.

In a device for optical communication of this kind according to the embodiments, since dust, foreign matter, or the like tends not to intrude inside or on the optical path for transmitting an optical signal, an optical signal is more likely to be transmitted certainly.

In addition, in the device for optical communication according to the embodiments illustrated in FIGS. 7 and 8, a one-channel optical element (a light emitting element and a light receiving element) is mounted in the substrate for mounting an IC chip while an optical path for transmitting an optical signal to transmit a one-channel optical signal is formed in each of the substrate for mounting an IC chip and the substrate for a motherboard.

However, the embodiments of the device for optical communication according to the third aspect of the present invention is not particularly limited to an embodiment illustrated in FIGS. 7 and 8, and the embodiment may be that in which a substrate for mounting an IC chip according to the embodiments of the first or the second aspect of the present invention or a substrate for mounting an IC chip according to the embodiments of the third embodiment are mounted in the above described substrate for a motherboard.

Accordingly, a multi-channel optical element may be mounted on the substrate for mounting an IC chip, and in addition, an optical path for transmitting an optical signal in a collective through hole structure, optical path for transmitting an optical signal in an individual through hole structure, and the like may be formed in each of the substrate for mounting an IC chip and the substrate for a motherboard so as to transmit an optical signal of the multi-channel optical element.

In addition, when a plurality of substrates for mounting an IC chip are mounted on the substrate for a motherboard, substrates for mounting an IC chip in which the structure of the optical path for transmitting an optical signal is different, such as a substrate for mounting an IC chip in which the optical path for transmitting an optical signal in a collective through hole structure is formed, a substrate for mounting an IC chip on which an optical path for transmitting an optical signal in recess form is formed, and the like may be mounted on one substrate for a motherboard.

In addition, the device for optical communication according to one embodiment illustrated in FIG. 7, when providing a micro lens, it is desirable to provide a micro lens on all of the six locations illustrated in the embodiment of FIG. 7. It is because of the excellent reliability of the transmission performance of the optical signal from a light emitting element to a light receiving element. Here, the same is also in the case of the device for optical communication according to one embodiment illustrated in FIG. 8.

In addition, the micro lens may be provided by the optical element mounted in the substrate for mounting an IC chip.

It is also desirable for the micro lens to be provided on the portions (four locations) where a substrate for mounting an IC chip and a substrate for a motherboard at least face each other.

In addition, in a device for optical communication according to the embodiments of the third aspect of the present invention, a dam may be formed on the surface of the solder resist layer for the motherboard between a substrate for mounting an IC chip and solder resist layer of a substrate for a motherboard.

It is because by forming the dam, sealing layers of a substrate for mounting an IC chip may be formed more easily in a desired position on the solder resist layer in the substrate for a motherboard.

Especially in forming sealing layers of a substrate for mounting an IC chip by potting, since the inflow of the sealing layers of a substrate for mounting an IC chip into between the optical path for transmitting an optical signal of a substrate for mounting an IC chip and the optical path for transmitting an optical signal in a substrate for a motherboard may be prevented more easily, the dam is preferably formed.

Here, a method for forming the above described dam, the same method as the method for forming a dam in the substrate for mounting an IC chip according to the embodiments of the first aspect of the present invention can be cited.

In addition, with regard to the a device for optical communication according to the embodiments of the third aspect of the present invention, in the embodiment illustrated in FIG. 7, a substrate for mounting an IC chip in which an optical element sealing layer is not formed on the portion where an optical path for transmitting an optical signal makes contact with an optical element is mounted on a substrate for a motherboard, and furthermore, sealing layers of a substrate for mounting an IC chip are not formed on the portion where the optical path for transmitting an optical signal formed in the substrate for a motherboard makes contact with the substrate for mounting an IC chip, but of course, the embodiments according to the device for optical communication according to the third aspect of the present invention are not particularly limited to this embodiment.

Specifically, as possible combinations of the embodiments of the device for optical communication according to the third aspect of the present invention, the following four embodiments including the embodiment illustrated in FIG. 7 are conceivable.

That is, there are four embodiments conceivable: (1) an embodiment (embodiment of FIG. 7) in which a substrate for mounting an IC chip on which an optical element sealing layer is not formed in the portion where an optical element makes contact with an optical path for transmitting an optical signal is mounted on a substrate for a motherboard, and furthermore, sealing layers of a substrate for mounting an IC chip is not formed on the portion where an optical path for transmitting an optical signal which is formed in the substrate for a motherboard makes contact with a substrate for mounting an IC chip;

(2) an embodiment in which a substrate for mounting an IC chip on which an optical element sealing layer is formed in the portion where an optical element makes contact with an optical path for transmitting an optical signal is mounted on a substrate for a motherboard, and furthermore, sealing layers of a substrate for mounting an IC chip is not formed on the portion where an optical path for transmitting an optical signal which is formed in the substrate for a motherboard makes contact with a substrate for mounting an IC chip;

(3) an embodiment in which a substrate for mounting an IC chip on which an optical element sealing layer is not formed in the portion where an optical element makes contact with an optical path for transmitting an optical signal is mounted on a substrate for a motherboard, and furthermore, sealing layers of a substrate for mounting an IC chip is formed on the portion where an optical path for transmitting an optical signal which is formed in the substrate for a motherboard makes contact with a substrate for mounting an IC chip; and (4) an embodiment in which a substrate for mounting an IC chip on which an optical element sealing layer is formed in the portion where an optical element makes contact with an optical path for transmitting an optical signal is mounted on a substrate for a motherboard, and furthermore, sealing layers of a substrate for mounting an IC chip is formed on the portion where an optical path for transmitting an optical signal which is formed in the substrate for a motherboard makes contact with a substrate for mounting an IC chip.

All of these embodiments facilitate the achievement of the purposes according to the embodiments of the third aspect of the present invention, namely making it easier to prevent dust, foreign matter, or the like from intruding inside or on the optical path for transmitting an optical signal and to secure excellent optical signal transmission performance. Among these, the above described embodiment (2) is particularly desirable. The reasons are as follows.

When the distance of the gap between an optical element and a substrate for mounting an IC chip is compared with the distance of the gap between a substrate for mounting an IC chip and a substrate for a motherboard, in general, the former is short, about 50 μm or less (at most about 100 μm) while the latter is somewhat large, about 300 μm (at least about 100 μm and at most about 800 μm).

Here, formation of each of the optical element sealing layer and sealing layers of a substrate for mounting an IC chip is examined. In forming the optical element sealing layer, since the distance of the gap between an optical element and a substrate for mounting an IC chip is short, when attempts are made to achieve an embodiment in which the optical element sealing layer is not formed on the portion where an optical path for transmitting an optical signal makes contact with the optical element, freedom of choice of a resin composite for forming an optical element sealing layer is reduced, and extreme precision is required for achieving control of a formation process thereof. On the other hand, in forming sealing layers of a substrate for mounting an IC chip, due to a certain distance of the gap between a substrate for mounting an IC chip and a substrate for a motherboard, without forming sealing layers of a substrate for mounting an IC chip in the portion where the optical path for transmitting an optical signal which is formed in the substrate for a motherboard makes contact with the substrate for mounting an IC chip, only locations around the periphery may be sealed more easily, and the resin composite for forming the sealing layers of a substrate for mounting an IC chip for forming a substrate for mounting an IC chip also tends to be chosen somewhat freely.

From this viewpoint, as an embodiment of the device for optical communication according to the third aspect of the present invention, the above described embodiment (2) is desirable.

In the substrate for mounting an IC chip according to the embodiments of the third aspect of the present invention described so far, a substrate and an insulating layer comprise a resin material.

However, also in the case where the substrate, the insulating layer, and the like comprise materials other than resin, for example, glass, ceramics, etc., the same effects as in the device for optical communication according to the embodiments of the third aspect of the present invention can be obtained.

That is, also in the device for optical communication in which the substrate for mounting an IC chip on which an optical element is mounted is mounted on the circuit board comprising glass or ceramics, a substrate for a motherboard on which an optical waveguide is formed is mounted on the circuit board comprising glass or ceramics, and sealing layers of a substrate for mounting an IC chip are formed so as to make contact with the periphery of this substrate for mounting an IC chip, the same effects as in the above described device for optical communication according to the embodiments of the third aspect of the present invention can be obtained. Here, the same can be said about the case where only either one of the substrate for mounting an IC chip and the substrate for a motherboard is formed by glass, ceramics, and the like.

In addition, in the case where a circuit board comprising glass or ceramics is used, this optical element sealing layer desirably comprises solder.

Next, a method for manufacturing a device for optical communication according to the embodiments of the third aspect of the present invention is described. The device for optical communication according to the embodiments of the third aspect of the present invention can be manufactured by separately manufacturing a substrate for mounting an IC chip and a substrate for a motherboard and then connecting both by interposing solder and the like.

A method for manufacturing the above described substrate for mounting an IC chip are described in detail in the description of a substrate for mounting an IC chip according to the embodiments of the first and second aspects of the present invention.

In the following, a method for manufacturing the substrate for mounting an IC chip according to the embodiments of the third embodiment is briefly described.

(1) In manufacturing the substrate for mounting an IC chip according to the third embodiment, a multilayer circuit board is first manufactured on which conductor circuits and insulating layers are formed and layered on both sides of a substrate using the same method as a method for manufacturing a substrate for mounting an IC chip according to the embodiments of the first aspect of the present invention in the processes (1) to (9).

(2) Next, a recess form for an optical path is formed in the above described multilayer circuit board.

The above described recess form for an optical path can be formed with the same method as a method for forming the above described through hole for an optical path, namely, a drilling process, or a laser process, for example.

In addition, when the above described recess form for an optical path is formed, it is desirably formed so that an IC chip as well as optical elements such as a light receiving element and a light emitting element may be mounted more easily on the inside of the recess form for an optical path.

In addition, when the above described recess form for an optical path is formed, in a process of manufacturing the above described multilayer circuit board, openings which penetrate through each insulating layer may be formed when an insulating layer is formed, and the recess form for an optical path may be formed when lamination of the insulating layer is completed.

In addition, after forming the above described recess form for an optical path, a desmear process and a process of forming a coarse surface which roughens a wall surface may be carried out on the wall surface just as the case where the above described through hole for an optical path etc. is formed.

After forming the above described recess form for an optical path, just as the case where the above described through hole for an optical path and the like are formed, the process of forming a conductor layer in which a conductor layer is formed on the wall surface of the above described recess form for an optical path may be carried out if necessary, and furthermore, in performing this process of forming a conductor layer, it is desirable to form an conductor circuit on an outermost insulating layer as an outermost layer.

In addition, after forming the above described conductor layer, a coarse surface may be formed on the wall surface of this conductor layer just as the case where a conductor layer is formed on the wall surface of a through hole for an optical path.

(3) Next, the process of resin composite filling is carried out in which an optical path for transmitting an optical signal in recess form (recess form for an optical path) which is formed in a multiplayer circuit board is filled in with a resin composite.

The recess form for an optical path is filled in with an uncured resin composite, and afterward, a hardening process is carried out, and thereby, the portion which has been formed in a substrate or an insulating layer is filled in with a resin composite in an optical path for transmitting an optical signal which is to be completed in the below described process.

The specific method for filling the through hole with an uncured resin composite is not particularly limited, and a printing method, a potting method, or the like which is the same method as the method for filling in the above described through hole for an optical path with the resin composite can be used.

Furthermore, in the case of the resin composite filling, a polishing process is desirably carried out on the exposed surface of the resin composite so that the exposed surface thereof is flattened. This is because the risk that transmission of an optical signal is blocked becomes small by flattening the exposed surface. The above described polishing process can be carried out with the same method as the method which is performed after filling in a through hole for an optical path with a resin composite.

Here, in performing the process of the above-mentioned resin composite filling, it is necessary to mount an optical element before that, and furthermore, it is also necessary to mount an IC chip to mount an IC chip in recess form for a optical path. Here, it is necessary to mount an IC chip according to the design thereof, and it is not always necessary to mount it inside a recess form for an optical path.

Then, a method for mounting an optical element and an IC chip inside a recess form for an optical path is described in the following.

First, part of the conductive circuit is exposed on the bottom of a recess form for an optical path so as to be a connecting terminal with an optical element etc. After that, a plating layer may be formed on the exposed portion of this conductive circuit if necessary.

Next, after mounting an optical element and an IC chip to the bottom of the recess form for an optical path, the above described optical element and the above-mentioned IC chip are electrically connected with the above-mentioned conductive circuit of the multilayer circuit board.

The above described optical element and the above described IC chip can be mounted by a eutectic bonding method, a solder bonding method, a resin bonding method or the like, for example. In addition, an optical element etc. may be mounted using silver paste or gold paste.

In the above described resin bonding method, a thermosetting resin such as an epoxy based resin and a polyimide based resin, is used as a base resin, after applying a paste comprising a curing agent, a filler, a solvent, etc. besides these resin components on a multilayer circuit board, and subsequently, placing an optical element etc. on paste, an optical element etc. are mounted by heat-hardening this paste. Here, the above described paste can be applied by a dispense method, a stamping method, a screen printing method or the like, for example.

In addition, in using silver paste, after applying silver paste on a multilayer circuit board and then placing an optical element etc. on paste, the optical element is mounted by firing this silver paste.

A wire bonding method is desirably used as a method for electrically connecting the above described optical element and the above described IC chip with the above described conductor circuit of the multilayer circuit board. This is because it has an economical advantage and a large flexibility in terms of design when mounting an optical element etc.

As the above described wire bonding, a conventionally known method, namely a nail head bonding method or a wedge bonding method can be used.

Here, an optical element etc. may be mounted through tape automated bonding, flip chip bonding, or the like.

(4) Next, a process of forming a solder resist layer is carried out to form a solder resist layer having openings (openings for optical paths) which are communicated with an optical path for transmitting an optical signal (recess form for an optical path) which has been formed in the above described process (3).

Specifically, for example, this process can be carried out by the same method as the method used in the process (12) for manufacturing a substrate for mounting an IC chip according to the embodiments of the first aspect of the present invention.

Here, in this case as well, the shape of the openings for optical paths is not particularly limited, and the size of the openings in a plan view may be larger than, approximately the same as, or smaller than that of a recess form for an optical path.

In addition, the openings for optical paths may be formed for every optical signal.

In addition, the openings for optical paths which are formed in the above described solder resist layer may be filled in with an uncured resin composite with the same method as the method used in the above described recess form for an optical path. In addition, a conductor layer may be formed also on the wall surface of the openings for optical paths which are formed in the solder resist layer, depending on the case.

In addition, in this process, after forming a solder resist layer, a micro lens may be provided on an end portion of the resin composite with which the through hole for an optical path is filled in and at the same time in the openings for optical paths formed in the solder resist layer. The above described micro lens can be provided in the same manner as in the method for manufacturing a substrate for mounting an IC chip according to the embodiments of the first aspect of the present invention.

(5) After that, the substrate for mounting an IC chip according to the embodiments of the third embodiment may be manufactured more easily by forming a solder pad or solder bumps just as a method for manufacturing a substrate for mounting an IC chip according to the embodiments of the first aspect of the present invention.

Next, the method for manufacturing the above described substrate for a motherboard is described in the order of the processes.

(1) First, conductor circuits are formed on both sides or on one side of a substrate in the same manner as in the processes (1) and (2) in the method for manufacturing a substrate for mounting an IC chip according to the embodiments of the first aspect of the present invention, and if necessary, through holes for connecting conductor circuits which sandwich the substrate with each other are formed. In addition, in this process as well, if necessary, a coarse surface is formed on the surface of the conductor circuit or on the wall surface of the through holes.

(2) Next, if necessary, insulating layers and conductor layers are formed and layered on the substrate on which the conductor circuits are formed.

Specifically, the insulating layers and the conductor layers may be formed and layered in accordance with the same method as that which includes the processes (3) and (8) in the method for manufacturing a substrate for mounting an IC chip according to the embodiments of the first aspect of the present invention.

In this process as well, a through hole which penetrates through a substrate and an insulating layer may be formed as in the case where a substrate for mounting an IC chip according to the embodiments is manufactured, or a lid plating layer may be formed.

Here, this process of layering an insulating layer and a conductor circuit may be carried out only once or may be repeated a number of times.

In addition, as a method for forming conductor circuits on an insulating layer, a subtractive method can be used in the same manner as in the case of manufacturing the above described substrate for mounting an IC chip.

In addition, in forming an optical waveguide as described below, when the optical waveguide is formed on the opposite side across a substrate which faces a substrate for mounting an IC chip, etc. and on the insulating layer, etc., in this process, a through hole for an optical path is filled in with a resin composite if necessary, and/or a through hole for an optical path with a conductor layer formed on the wall surface thereof is formed if necessary. Here, this through hole for an optical path functions as an optical path for transmitting an optical signal.

Here, formation of the through hole for an optical path (optical path for transmitting an optical signal) which penetrates through this substrate and the like may be performed after forming an optical waveguide in the following process (3).

In addition, a through hole for an optical path can be formed by carrying out a drilling process, a laser process and the like.

In addition, with regard to a laser used in the above described laser process, the same laser as used for forming openings for via holes can be cited as examples.

In addition, a through hole for an optical path may be either a collective through hole or an individual through hole.

(3) Next, an optical waveguide is formed in a predetermined location on the substrate and/or the insulating layer in accordance with the design.

In the case where the above described optical waveguide is formed using an inorganic material such as silica glass as the material thereof, an optical waveguide that has been formed in a predetermined form can be attached by interposing an adhesive.

In addition, the above described optical waveguide comprising an inorganic material can be formed through film formation of an inorganic material such as $LiNbO_3$ or $LiTaO_3$ in accordance with a liquid phase epitaxial method, a chemical deposition method (CVD), a molecular beam epitaxial method or the like.

In addition, as the method for forming an optical waveguide comprising a polymer material (organic based optical waveguide), (1) a method for pasting a film for forming an optical waveguide, which has been formed in film form on a mold release film in advance, on the insulating layer, and (2) a method for forming an optical waveguide directly on an insulating layer by sequentially forming and layering a lower clad, a core and an upper clad on the above described insulating layer can be cited.

Here, the same method can be used as the method for forming an optical waveguide in the case where an optical waveguide is formed on a mold release film and in the case where an optical waveguide is formed on the insulating layer.

Specifically, a method using reactive ion etching, a process including exposure to light and development, a die forming method, a resist forming method, a method where these are combined or the like can be used.

In the above described method using reactive ion etching, (i) first, a lower clad is formed on a mold release film or an insulating layer (hereinafter, simply referred to as a mold release film or the like), and (ii) next, a resin composite for a core is applied to the top of this lower clad, and furthermore, a hardening process is carried out, if necessary, and thereby, a resin layer for forming a core is provided. (iii) Next, a resin layer for forming a mask is formed on the above described resin layer for forming a core, and then a process including exposure to light and development is carried out on this resin layer for forming a mask, and thereby, a mask (etching resist) is formed on the resin layer for forming a core.

(iv) Next, reactive ion etching is carried out on the resin layer for forming a core, and thereby, the resin layer for forming a core on the mask non-forming is removed, and thus, a core is formed on the lower clad. (v) Finally, an upper clad is formed on the lower clad so as to cover the above described core, and thus, an optical waveguide is provided.

According to this method using reactive ion etching, an optical waveguide having excellent reliability in the dimension may be formed more easily. In addition, this method is also excellent in reproducibility.

In addition, in the process including exposure to light and development, (i) first, a lower clad is formed on a mold release film or the like, and (ii) next, a resin composite for a core is applied to the top of this lower clad, and furthermore, a hardening process is carried out, if necessary, and thereby, a layer of a resin composite for forming a core is formed.

(iii) Next, a mask where a pattern is drawn corresponding to the portion where the core is to be formed is placed on the layer of the above described resin composite for forming a core, and afterward, a process including exposure to light and development is carried out, and thereby, a core is formed on the lower clad. (iv) Finally, an upper clad is formed on the lower clad so as to cover the above described core, and thus, an optical waveguide is provided.

This process, including exposure to light and development, has a small number of processes, and therefore, can be appropriately used when an optical waveguide is mass produced, and in addition, this process has a small number of heating processes, and therefore, it may become unlikely for stress to occur in the optical waveguide.

In addition, in the above described die forming method, (i) first, a lower clad is formed on a mold release film, and (ii) next, a trench for forming a core is formed in the lower clad through die formation. (iii) Furthermore, the above described trench is filled in with a resin composite for a core through printing, and afterward, a core is formed by carrying out a hardening process. (iv) Finally, an upper clad is formed on the lower clad so as to cover the above described core, and thus, an optical waveguide is provided.

This die forming method can be appropriately used when an optical waveguide is mass produced, and an optical waveguide having excellent reliability in the dimension may be formed more easily. In addition, this method is excellent in reproducibility.

In addition, according to the above described resist forming method, (i) first, a lower clad is formed on a mold release film or the like, and (ii) furthermore, a resin composite for a resist is applied to the top of this lower clad, and afterward, a process including exposure to light and development is carried out, and thereby, a resist for forming a core is formed in the core non-forming portion on the above described lower clad.

(iii) Next, a resin composite for a core is applied to the resist non-forming on the lower clad, and (iv) furthermore, the resin composite for a core is hardened, and afterward, the above described resist for forming a core is peeled off, and thereby, a core is formed on the lower clad. (v) Finally, an upper clad is formed on the lower clad so as to cover the above described core, and thus, an optical waveguide is provided.

This resist forming method can be appropriately used when an optical waveguide is mass produced, and an optical waveguide having excellent reliability in the dimension may be formed more easily. In addition, this method is also excellent in reproducibility.

In the case where an optical waveguide is formed of a polymer material using these methods, and an optical waveguide where particles are mixed into the core is formed, a mold forming method is desirable in comparison with a process including exposure to light and development. The reason for this is as follows.

That is, this is because in the case where a trench for forming a core is formed in the lower clad through die formation, and afterward, a core is formed within this trench in accordance with a die forming method for forming a core, all of the particles that are to be mixed into the core exist in the core, and therefore, the surface of the core becomes flat, providing excellent transmissivity of an optical signal, whereas in the case where the core is formed in a process including exposure to light and development, portions of the particles may extrude from the surface of the core or recesses, from which particles may be removed are formed on the surface of the core, and thus, the surface of the core may sometimes become uneven, and this unevenness prevents light from being reflected in a desired direction, and as a result, the transmissivity of an optical signal may drop.

In addition, in the case where an optical waveguide is formed on an insulating layer and the like, the optical waveguide may be formed on part or the entirety of the insulating layer and the like by sequentially forming and layering a lower clad, a core and an upper clad, and afterward, optical conversion mirrors may be formed in predetermined locations with the below described method, and thereby, only part of the optical waveguide thus formed and layered may function as an optical waveguide.

In addition, optical path conversion mirrors are formed in the above described optical waveguide.

Though the above described optical path conversion mirrors may be formed before the optical waveguide is formed to the insulating layer or may be formed after the optical waveguide has been attached to the insulating layer, it is desirable to form the optical path conversion mirrors in advance, aside from the case where the optical waveguide is directly formed on the insulating layer. This is because the process can be easily carried out, and the risk becomes less that other members which form the multilayer printed circuit board, the substrate, the conductor circuits and the insulating layers may be scratched or damaged during the process.

The above described method for forming an optical path conversion mirror is not particularly limited, and conventionally well-known methods for formation can be used. Specifically, a physical process using a diamond saw or a blade, of which the edge is in a V shape at about 90 degrees, a process using reactive ion etching and laser aberration can be used. In addition, optical path converting members may be embedded instead of the formation of optical path conversion mirrors.

In addition, in the case where optical path conversion mirrors at about 90 degrees are formed in the optical waveguide, the angle formed between the surface where the lower clad makes contact with the substrate or the insulating layer and the optical path converting surface may be about 45 degrees or about 135 degrees.

Here, though a method for forming an optical waveguide on the substrate or an outermost insulating layer is described, in the case where the above described multilayer printed circuit board is manufactured, an optical waveguide as described above may sometimes be formed between the substrate and the insulating layer or between the insulating layers.

In the case where an optical waveguide is formed between the substrate and the insulating layer, a substrate where conductor circuits are formed on both sides thereof is manufactured in the above described process (1), and afterward, an optical waveguide is formed in a conductor circuit non-forming portion on the substrate in accordance with the same method as in the above described process (3), and subsequently, an insulating layer is formed in accordance with the same method as in the above described process (2), and thereby, an optical waveguide may be formed more easily in the above described location.

In addition, in the case where an optical waveguide is formed between insulating layers, at least one insulating layer is formed and layered on a substrate where conductor circuits are formed in the same manner as in the above described processes (1) and (2), and afterward, an optical waveguide is formed on the insulating layer in the same manner as in the above described process (3), and subsequently, the same process as the above described process (2) is additionally repeated, and thereby, an optical waveguide can be formed between the insulating layers.

(4) Next, a solder resist layer is formed if necessary. A solder resist layer can be formed in the following processes (a) and (b), for example.

(a) First, layers of a solder resist composition are formed as outermost layers of a multilayer circuit board in which a through hole for an optical path is formed which is filled in with a resin composite.

The above described layers of the solder resist composition can be formed using the same method as the method for manufacturing a substrate for mounting an IC chip.

(b) Next, the openings which are communicated with the through hole for an optical path which has been formed in the above described process (2) (hereinafter, also referred to as openings for optical paths) are formed in the layers of above described solder resist composition.

The above described openings for optical paths can be formed using the same method as the method for manufacturing a substrate for mounting an IC chip.

In addition, when forming the above described openings for optical paths, it is desirable to form openings for forming solder bumps (openings for mounting an IC chip and an optical element) at the same time. Here, formation of the above described openings for optical paths and formation of the above described openings for forming solder bumps may be carried out separately.

In addition, in forming a solder resist layer, the solder resist layer with openings for optical paths and openings for forming solder bumps may be formed by manufacturing a resin film in a desired position in advance and attaching this resin film.

Through such processes (a) and (b), openings for optical paths which are communicated with this optical path for transmitting an optical signal can be formed on a multilayer circuit board in which the optical path for transmitting an optical signal (through hole for an optical path) can be formed.

In addition, openings for optical paths which have been formed in the above described solder resist layer may be filled in with an uncured resin composite with the same method as used in the above described through hole for an optical path.

In addition, conductor layers may be formed also on the wall surface of the openings for optical paths which have been formed in the solder resist layer, depending on the case.

In addition, the process of providing a micro lens, in which a micro lens is provided on an end portion of the resin composite with which a through hole for an optical path has been filled in and at the same time in openings for optical paths formed in the solder resist layer after the formation of a solder resist layer, may be carried out in this process.

In addition, when carrying out the process of providing a micro lens, a surface treatment such as a water repellent process (including a process by a water repellent coating agent) and a hydrophilic process may be carried out in advance. It is because the micro lens in a desired form is more likely to be provided by carrying out a surface treatment.

Here, the above described surface treatment and the above described process of providing a micro lens can be performed using the same method as the method for manufacturing a substrate for mounting an IC chip according to the embodiments of the first aspect of the present invention.

(5) After that, a substrate for a motherboard can be manufactured by forming solder pads and solder bumps.

Here, solder pads and solder bumps can be formed with the same method as the method used for manufacturing a substrate for mounting an IC chip according to the embodiments of the first aspect of the present invention.

In addition, in some cases, by forming an optical waveguide on the entirety of the outermost layer of a substrate in the above described process (3), the optical waveguide may function as a solder resist layer.

In addition, the above described solder bumps may be formed if necessary. Even in the case where the solder bumps are not formed, these solder bumps can be mounted by interposing bumps of a substrate for mounting an IC chip to be mounted or bumps of various surface mount device.

In addition, especially in the solder resist layer on the side opposite to the side which faces a substrate for mounting an IC chip, an external connection terminal may not be formed, or PGA or BGA may be formed respectively by providing a pin or forming a solder ball if necessary.

A device for optical communication according to the third aspect of the present invention can be manufactured by connecting a substrate for mounting an IC chip and a substrate for a motherboard by interposing solder and the like after manufacturing both thereof using the above described method, and furthermore, forming sealing layers of a substrate for mounting an IC chip so as to make contact with the periphery of the substrate for mounting an IC chip.

Specifically, by first placing a substrate for mounting an IC chip in which solder bumps are formed and a substrate for a motherboard, so as to face each other in a predetermined position in a predetermined direction, and then by carrying out reflow, both can be connected. Here, the solder bumps may be formed only on either side of the respective opposing sides of the above described substrate for mounting an IC chip and the substrate for a motherboard. It is because both tend to be electrically connected in this case as well.

Next, sealing layers of a substrate for mounting an IC chip is formed on the periphery of a substrate for mounting an IC chip.

The formation of the above described sealing layers of a substrate for mounting an IC chip can be carried out by potting a uncured resin composite, and then carrying out a hardening process, for example.

When forming the above described sealing layers of a substrate for mounting an IC chip by potting, this substrate for mounting an IC chip may be formed so as to cover a substrate for mounting an IC chip, as long as formed so as to make contact with the periphery of the substrate for mounting an IC chip.

In addition, when forming a dam on the solder resist layer on a substrate for a motherboard, the dame is formed, for example, by printing an epoxy resin, a silicone resin and the like, joining the glass epoxy substrate and the like which have been punched in a frame shape with a punching press machine or cut down in a frame shape in a router process, by interposing an adhesive, and the like. Considering the gap between a substrate for mounting an IC chip and an outermost solder resist layer in a substrate for a motherboard is usually about 300 μm (at least about 100 μm and at most about 800 μm), it is desirable to form the dam by printing an epoxy resin, a silicone resin and the like, or attaching a dam material by interposing an adhesive made of a epoxy resin, etc.

Through such a process, the device for optical communication according to the embodiments of the third aspect of the present invention can be manufactured.

Next, a device for optical communication according to the embodiments of the fourth aspect of the present invention is described.

Here, a substrate for a motherboard in the device for optical communication according to the fourth aspect of the present invention may have a substrate as a base and may have a structure where insulating layers and conductor circuits are formed and layered on at least one side thereof; or it may not have a substrate as a base and may have a structure (coreless structure) where insulating layers and conductor circuits are formed and layered.

The following description will discuss the substrate for a motherboard in the device for optical communication according to the embodiments of the fourth aspect of the present invention citing the embodiment in which insulating layers and conductor circuits are formed and layered on at least one side of a substrate.

In addition, a device for optical communication according to the embodiments of the fourth aspect of the present invention has the same configuration as a device for optical communication according to the embodiments of the third aspect of the present invention, except that in the device for optical communication according to the embodiments of the third aspect of the present invention, a cap member is attached so as to cover the entirety of the substrate for mounting an IC chip instead of sealing layers of a substrate for mounting an IC chip. Therefore, only a cap member is described herein in detail.

Figure 9:
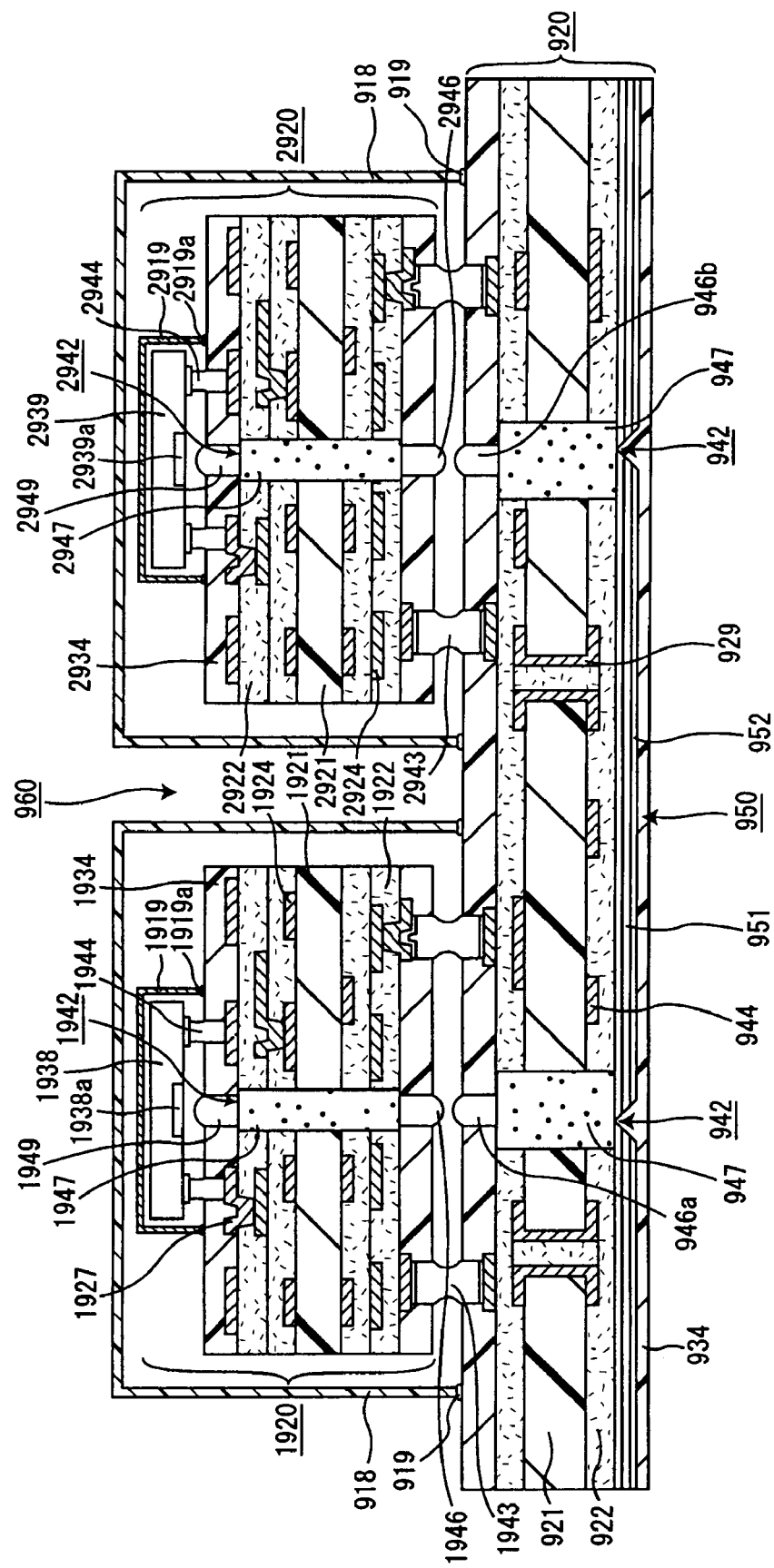
FIG. 9 is a cross-sectional view schematically illustrating an example of an embodiment of a device for optical communication according to the fourth aspect of the present invention.

FIG. 9 is a cross-sectional view which schematically illustrates one embodiment of a device for optical communication according to the fourth aspect of the present invention.

In a substrate for a motherboard 920, a device for optical communication 960 on which a substrate for mounting an IC chip 2920 on which a light receiving element 2939 is mounted and a substrate for mounting an IC chip 1920 on which a light emitting element 1938 is mounted are mounted is illustrated in FIG. 9. Here, as the substrates for mounting an IC chip 1920, 2920, a substrate for mounting an IC chip according to the embodiments of the second aspect of the present invention with an IC chip mounted thereon is mounted.

In addition, the structure of the substrate for a motherboard 920 is the same as that of the substrate for a motherboard 720 already described. Therefore, the description thereof is omitted here.

In the substrate for mounting an IC chip 1920, conductor circuits 1924 and insulating layers 1922 are formed and layered on both sides of a substrate 1921, and conductor circuits which sandwich the substrate 1921 are electrically connected to each other through a through hole (not illustrated), and conductor circuits which sandwich the insulating layer 1922 are electrically connected to each other through via holes 1927. In addition, solder resist layers 1934 are formed as outermost layers.

In this substrate for mounting an IC chip 1920, an optical path for transmitting an optical signal 1942 is provided so as to penetrate through the substrate 1921, the insulating layer 1922, and one of the two solder resist layers 1934. In this optical path for transmitting an optical signal 1942, the portion where the optical path for transmitting an optical signal penetrates through the substrate 1921 and the insulating layer 1922 is filled in with a resin composite 1947. In addition, a micro lens 1949 is provided on the side on which the light emitting element 1938 is mounted on the resin composite 1947, and a micro lens 1946 is provided on an end portion of the opposite side thereof and at the same time on the portion where the optical path for transmitting an optical signal 1942 penetrates through the solder resist layer.

On one side of a substrate for mounting an IC chip 1920, a light emitting element 1938 is mounted on the surface by interposing solder connection portions 1944 so that a light emitting portion 1938a faces an optical path for transmitting an optical signal 1942.

In the substrate for mounting an IC chip 1920, a cap member 918 is attached by interposing an adhesive 1919 so as to cover the light emitting element 1938 on one side of the solder resist layer. In addition, as is not illustrated, an IC chip is mounted on the surface by interposing the solder connection portions on the same side as the side on which the light emitting element 1938 is mounted in the substrate for mounting an IC chip 1920.

In the substrate for mounting an IC chip 2920, conductor circuits 2924 and insulating layers 2922 are formed and layered on both sides of a substrate 2921, and conductor circuits which sandwich the substrate 2921 are electrically connected to each other through a through hole (not illustrated), and conductor circuits which sandwich the insulating layer 2922 are electrically connected to each other through via holes 2927. In addition, solder resist layers 2934 are formed as outermost layers.

In this substrate for mounting an IC chip 2920, an optical path for transmitting an optical signal 2942 is provided so as to penetrate through the substrate 2921, the insulating layer 2922, and the solder resist layer 2934.

In this optical path for transmitting an optical signal 2942, the portion where the optical path for transmitting an optical signal penetrates through the substrate 2921 and the insulating layer 2922 is filled in with a resin composite 2947. In addition, a micro lens 2949 is provided on the side on which the light receiving element 2939 is mounted on the resin composite 2947, and a micro lens 2946 is provided on an end portion of the opposite side thereof and at the same time on the portion where the optical path for transmitting an optical signal 2942 penetrates through the solder resist layer.

On one side of a substrate for mounting an IC chip 2920, a light receiving element 2939 is mounted on the surface by interposing solder connection portions 2944 so that a light receiving portion 2939a faces an optical path for transmitting an optical signal 2942.

Then, in the substrate for mounting an IC chip 2920, a cap member 2918 is attached by interposing an adhesive 2919 so as to cover the light emitting element 2938 on one side of the solder resist layer. In addition, as is not illustrated, an IC chip is mounted on the surface by interposing the solder connection portions on the same side as the side on which the light emitting element 2938 is mounted in the substrate for mounting an IC chip 2920.

Here, the configuration of a substrate for a motherboard 920 is the same as that of a substrate for a motherboard 720.

In a device for optical communication 960, substrates for mounting an IC chip 1920, 2920 are mounted by interposing solder connection portions 1943 and 2943 on the side opposite to the side where the optical waveguide 950 is formed in the substrate for a motherboard 920. Here, each of the substrates for mounting an IC chip 1920, 2920 is mounted on a predetermined position by the self-alignment function.

Furthermore, on one side of a solder resist layer 734, a cap member 918 is attached by interposing an adhesive 919 so as to cover each of the substrates for mounting an IC chip 1920, 2920. A gap part is formed right under optical paths for transmitting optical signals 1942, 2942 which are formed in each of the substrates for mounting an IC chip 1920, 2920.

Thus, by attaching a cap member 918, a dust, foreign matter, or the like tends not to intrude inside or on an optical path for transmitting an optical signal which is formed in substrates for mounting an IC chip 1920, 2920 and an optical path for transmitting an optical signal 742 which is formed in a substrate for a motherboard, and thereby transmission of an optical signal tends not to be obstructed by this dust, foreign matter, or the like.

In the device for optical communication 960 comprising such a configuration, an electrical signal from an IC chip (not illustrated) which is mounted on the substrate for mounting an IC chip 1920 will be converted to an optical signal in the light emitting element 1938, the optical signal which is emitted from a light emitting element 1938 (light emitting portion 1938a) will be transmitted to a light receiving element 2939 (light receiving portion 2939a) via a micro lens 1949, an optical path for transmitting an optical signal 1942, a micro lens 1946, a micro lens 946a, an optical path for transmitting an optical signal 942, an optical waveguide 950, the optical path for transmitting an optical signal 942, a micro lens 946b, a micro lens 946, an optical path for transmitting an optical signal 2942, and a micro lens 2949, and furthermore, will be transmitted to an IC chip (not illustrated) which is mounted on a substrate for mounting an IC chip 2920 after being converted to an electric signal in a light receiving element 2939, and be processed.

In a device for optical communication of this kind, since an optical signal is to be transmitted via a micro lens which is provided on an end portion of a resin composite, an optical signal is more likely to be transmitted certainly.

The material and shape etc. of the above described cap member are not particularly limited, and as the material thereof, ceramics, resin, metal, glass or the like can be cited as examples. It is because the cap member made of the material is easy to form, and is appropriate for protecting a mounted substrate for mounting an IC chip from the stress and contact from the outside. Among these, resin is desirable. In addition, it is necessary for the shape of the cap member to be the shape which can cover the above described optical element, such as the U-shaped sectional shape. As specific examples, a ceramic cap with a sealant or a resin cap with an adhesive can be cited.

Here, the cap member comprising resin can be manufactured by carrying out spot facing on a platy material substrate, and furthermore, by carrying out a dicing process. In addition, metal plating (for example, Ni/Au plating) may be carried out at least on the upper face outside the cap member. It is because the reliability thereof may be improved more easily.

The cap member is attached on the solder resist layer by interposing an adhesive (resin) in the device for optical communication according to one embodiment illustrated in FIG. 9 while the cap member may be attached to the portion in which the solder resist layer is not formed by interposing solder in a substrate for mounting an IC chip according to the embodiments of the fourth aspect of the present invention. However, in the case where the cap member is attached by interposing solder, since a pad becomes necessary for the outermost layer, the design of a conductor circuit is restricted, and furthermore, the process for sealing solder is needed separately, it is desirable to attach a cap member by interposing an adhesive (resin). Here, also when attaching the cap member by interposing an adhesive (resin), the same degree of reliability as in the case of attaching it by interposing solder is more likely to be obtained.

In addition, in the device for optical communication illustrated in FIG. 9, the cap member is attached so as to separately cover each of the mounted substrates for mounting an IC chip according to one embodiment, but in the device for optical communication according to the embodiments of the fourth aspect of the present invention, the embodiment in which the cap member is attached is not limited to this embodiment.

Specifically, the cap member may be attached so that all of the plurality of substrates for mounting an IC chip is covered with one cap member. In addition, the cap member may be attached so that various surface mount devices other than the substrate for mounting an IC chip which is mounted on a substrate for a motherboard are also covered at the same time.

In addition, the device for optical communication according to one embodiment illustrated in FIG. 9, as a substrate for mounting an IC chip, a substrate for mounting an IC chip according to the embodiments of the second aspect of the present invention to which a cap member is attached so as to cover an optical element is mounted; while in the device for optical communication according to the embodiments of the fourth aspect of the present invention, a substrate for mounting an IC chip which is mounted in a substrate for a motherboard is not particularly limited to a substrate for mounting an IC chip according to the embodiments of the second aspect of the present invention, may be a substrate for mounting an IC chip according to the embodiments of the first aspect of the present invention in which optical element sealing layers are formed so as to make contact with the periphery of an optical element, or may be a substrate for mounting an IC chip according to the third embodiment.

Furthermore, formation of a conventionally well-known optical element sealing layer may be a substrate for mounting an IC chip to which even the cap member is not attached. That is, it may be a configuration in which the entirety of the substrate for mounting an IC chip is covered with one cap member on which an optical element is mounted.

In general, it is desirable for a driving IC which is adjacently connected with an optical element to be mounted in a position as close as possible to the optical element, and in addition, it is necessary to mount a resistance, a capacitor, and the like on a substrate for mounting an IC chip. Furthermore, the miniaturization of the substrate for mounting an IC chip is also required. Considering these points as well, the configuration of covering the entirety of the substrate for mounting an IC chip with one cap member without covering an optical element with a cap member is sometimes more desirable than that of covering only an optical element with a cap member and furthermore covering again a substrate for mounting an IC chip with the cap member.

In addition, the above described cap member may comprise a heat sink portion, or the cap member itself may function as a heat sink. As the above described heat sink portion, the same heat sink portion as the one comprising a cap member in the substrate for mounting an IC chip according to the second aspect of the present invention can be cited.

In addition, metal plating may be carried out at least on the upper face outside the cap member.

Here, since structural members other than the above described cap member which forms a device for optical communication according to the embodiments are the same as those of a device for optical communication according to the embodiments of the third aspect of the present invention, the description thereof is omitted.

With regard to the device for optical communication according to the embodiments of the fourth aspect of the present invention described so far, a substrate and an insulating layer comprise a resin material.

However, also in the case where the substrate, the insulating layer, and the like comprise materials other than resin, for example, glass, ceramics, etc., the same effects as in the fourth aspect of the present invention can be obtained.

That is, also in a device for optical communication on which a substrate for mounting an IC chip where an optical element is mounted on a circuit board comprising glass or ceramics is mounted on a substrate for a motherboard where an optical waveguide is formed on a circuit board comprising glass or ceramics, and to which a cap member is attached so as to at least cover this substrate for mounting an IC chip, the same effects as in the above described device for optical communication according to the embodiments of the fourth aspect of the present invention can be obtained. Here, the same can be said about the case where only either one of the substrate for mounting an IC chip or the substrate for a motherboard comprises glass, ceramics, and the like.

Next, a method for manufacturing a device for optical communication according to the embodiments of the fourth aspect of the present invention is described.

A device for optical communication according to the fourth aspect of the present invention can be manufactured using the same method for manufacturing a device for optical communication according to the embodiments of the third aspect of the present invention, except that in the process for manufacturing a device for optical communication according to the embodiments of the third aspect of the present invention, sealing layers of a substrate for mounting an IC chip are not formed and a cap member is attached so as to cover the substrate for mounting an IC chip which is mounted in the substrate for a motherboard with the following method.

As a method for attaching the above described cap member so as to cover the above described substrate for mounting an IC chip, for example, after applying an uncured resin composite to a predetermined portion of a cap member or a predetermined portion of a substrate for a motherboard in advance, the cap member is temporarily fastened by hardening this uncured resin composite until B-stage, and then, a load of at least about 1 $g/cm^2$ and at most about 1000 $g/cm^2$ can be applied by putting weight on the cap member or fixing the cap member with a jig such as a clip, and the cap member can be attached by hardening the resin composite in an oven in this state.

In addition, after adhering the resin film in B-stage to the predetermined portion of the cap member or the predetermined portion of the solder resist layer in advance, the cap member can be temporarily fastened by hardening this resin film. After that, a load of at least about 1 $g/cm^2$ and at most about 1000 $g/cm^2$ can be applied by putting weight on the cap member or fixing the cap member with a jig such as a clip, and the cap member can be attached by hardening the resin film in an oven in this state.

In addition, by applying a solder paste on the predetermined portion of the cap member or the predetermined portion on an outermost insulating layer in advance, placing a cap member on a predetermined position, and carrying out reflow processing, a method for attaching a cap member can be used.

In attaching a cap member using this method, the cap member may be attached so as to cover one substrate for mounting an IC chip, integrally cover a plurality of substrates for mounting an IC chip, or in some cases, integrally cover one or a plurality of substrate(s) for mounting an IC chip and other surface mounting components.

It is because, in the case where the cap member is attached so as to integrally cover a plurality of substrates for mounting an IC chip, or in some cases, integrally cover one or a plurality of (a) substrate(s) for mounting an IC chip and other surface mount devices, a low parts count can be achieved and a device for optical communication may be manufactured more easily.

In addition, from a viewpoint of reliability, it is desirable for an adhesive used when attaching a cap member not to spread at the time of hardening. Accordingly, in a device for optical communication according to the embodiments of the third aspect of the present invention, it is desirable to use a resin composite which has the same property as a resin used when forming sealing layers of a substrate for mounting an IC chip.

In addition, in the manufacture of a device for optical communication according to the embodiments of the fourth aspect of the present invention, when a substrate for mounting an IC chip and various kinds of surface mount devices which are inside the cap member are mounted by interposing solder bumps, flux cleaning is desirably carried out after mounting the above described substrate for mounting an IC chip. It is because in the case where flux cleaning is not carried out after mounting the substrate for mounting an IC chip, after manufacturing a device for optical communication, a flux component is solidified and peeled, and intrudes inside or on an optical path for transmitting an optical signal as foreign matter, and in some cases, transmission loss of an optical signal increases and it becomes impossible to transmit an optical signal. For the above described reason, also in soldering a cap member, it is desirable not to use flux.

By using such a method, the substrate for mounting an IC chip according to the embodiments of the fourth aspect of the present invention can be manufactured.

In addition, instead of attaching the cap member which forms a device for optical communication according to the embodiments of the fourth aspect of the present invention, a device for optical communication in which a dam frame is formed on the bottom surface (the side which faces a substrate for a motherboard) of a substrate for mounting an IC chip in advance and the substrate for mounting an IC chip on which this dam frame is mounted on the substrate for a motherboard also has the same effect as in the device for optical communication according to the embodiments of the fourth aspect of the present invention.

That is, with regard to a device for optical communication, where conductor circuits and insulating layers are formed and layered on at least one side of a substrate, an optical waveguide is formed thereon, and furthermore, an optical element is mounted on a substrate for a motherboard on which an optical path for transmitting an optical signal is formed, and on which the dam frame is formed on the bottom surface of the above described substrate for mounting an IC chip, as well, dust, foreign matter or the like tends not to intrude inside or on an optical path for transmitting an optical signal, and transmission of an optical signal tends not to be obstructed for lack of this dust or the like, just as a device for optical communication according to the embodiments of the fourth aspect of the present invention. Accordingly, the device for optical communication in such a configuration has excellent reliability.

The device for optical communication according to the embodiments in such a configuration can be manufactured with the following method.

That is, the above described dam frame can be manufactured by first attaching a dam frame comprising a glass-epoxy resin and the like as materials by interposing an adhesive on the bottom surface of a substrate for mounting an IC chip after manufacturing a substrate for mounting an IC chip, then mounting this substrate for mounting an IC chip with a dam frame on a substrate for a motherboard, and afterward, carrying out flux cleaning, and sealing the above described dam frame with a resin.

Here, resin sealing can be carried out with methods such as applying a resin onto the periphery of the dam frame with a dispenser, then hardening this resin until B-stage, and afterward, permanently hardening the resin with a load exerted from the upper side of a substrate for mounting an IC chip.

With regard to a method for mounting a substrate for mounting an IC chip, a solder paste printing, mounting by reflow using a bond flux, mounting by a heat tool method using a high-precision flip chip mounting machine and the like can be cited as examples.

Here, mounting by a reflow method requires flux cleaning; on the other hand, since fluxless mounting is possible with a heat tool method, then transmissivity of an optical signal tends not to be obstructed by a solidified flux, and it is desirable in that mounting of a substrate for mounting an IC chip and sealing of a dam can be carried out at the same time.

EXAMPLES

In the following, the present invention is described in further detail.

Example 1

A. Manufacture of Resin Film for Insulating Layer 30 parts by weight of bisphenol A type epoxy resin (equivalent of epoxy 469, Epikote 1001, made by Yuka Shell Epoxy K.K.), 40 parts by weight of cresol novolac type epoxy resin (equivalent of epoxy 215, Epiclon N-673, made by Dainippon Ink and Chemicals, Incorporated) and 30 parts by weight of phenol novolac resin containing triazine structure (equivalent of phenolic hydroxy group 120, Phenolite KA-7052, made by Dainippon Ink and Chemicals, Incorporated) were heated and melted in 20 parts by weight of ethyl diglycol acetate and 20 parts by weight of a naphtha solvent while stirring, to which 15 parts by weight of polybutadiene rubber with a terminal converted to epoxy (DENAREX R-45EPT, made by Nagase Chemicals Ltd.), 1.5 parts by weight of crushed 2-phenyl-4, 5-bis(hydroxymethyl)imidazole, 2 parts by weight of finely crushed silica and 0.5 parts by weight of a silicone based antifoaming agent were added, and thus, an epoxy resin composite was prepared.

The gained epoxy resin composite was applied to the top of a PET film having a thickness of 38 μm using a roll coater, so that the thickness after drying became 50 μm, was dried for ten minutes at 80° C. to 120° C. and thereby, a resin film for an insulating layer was manufactured.

B. Preparation of Resin Composite with which Through Hole is Filled 100 parts by weight of a bisphenol F type epoxy monomer (YL983U, made by Yuka Shell Epoxy K.K., molecular weight: 310), 170 parts by weight of $SiO_2$ particles in spherical form (CRS 1101-CE, made by ADTEC Corporation) of which the surface is coated with a silane coupling agent, the average particle diameter is 1.6 μm and the diameter of the largest particles is 15 μm or less, and 1.5 parts by weight of a leveling agent (Perenol S4, made by San Nopco Limited) were put in a container and mixed through stirring, and thereby, a resin filler of which the viscosity is 45 Pa·s to 49 Pa·s at 23±1° C. was prepared. Here, 6.5 parts by weight of an imidazole hardening agent (2E4MZ-CN, made by Shikoku Chemicals Corporation) were used as a hardening agent.

Figure 10A:
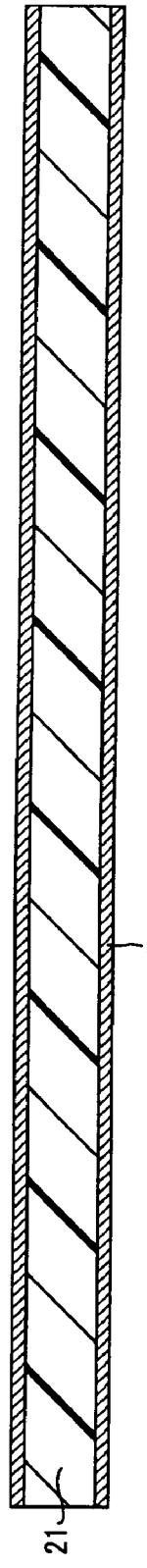
FIGS. 10A to 10E are cross-sectional views schematically illustrating part of a method for manufacturing a substrate for mounting an IC chip according to one embodiment of the present invention.

C. Manufacture of Substrate for Mounting IC Chip (1) A copper pasted multilayer plate where copper foil 28 having a thickness of 18 μm is laminated on both sides of an insulating substrate 21 made of a glass epoxy resin or a BT (bismaleimide triazine) resin having a thickness of 0.8 mm was used as a starting material (see FIG. 10A). First, holes were drilled in this copper pasted multilayer plate, an electroless plating process was carried out, and etching was carried out so as to form a pattern, and thus, conductor circuits 24 and a through hole 29 were formed on both sides of the substrate 21.

Figure 10B:
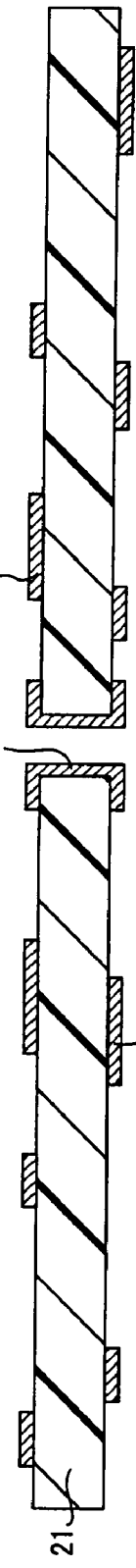

(2) The substrate where the through hole 29 and the conductor circuits 24 were formed washed with water and dried, and afterward, a blackening process using a solution including NaOH (10 g/l), NaClO$_2$ (40 g/l) and Na$_3$PO$_4$ (6 g/l) for a blackening bath (oxidation bath) and a reduction process using a solution including NaOH (10 g/l) and NaBH$_4$ (6 g/l) for a reduction bath were carried out, and a coarse surface (not illustrated) was formed on the surface of the conductor circuits 24, including the through hole 29 (see FIG. 10B).

(3) After the preparation of the resin filler described in the above B, a layer of a resin film 30' was formed in conductor circuit non-forming portions within the through hole 29 and on one side of the substrate 21, as well as on the outer periphery portion of the conductor circuits 24 within 24 hours.

Figure 10C:
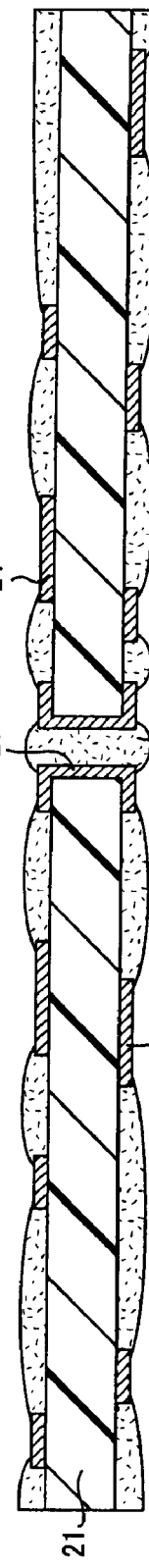

That is, first, a squeegee was used to push the resin filler into the through hole, and afterward, the resin filler was dried under conditions of 100° C. for 20 minutes. Next, a mask having openings in portions corresponding to the conductor circuits non-forming portions are formed was placed on the substrate and conductor circuit non-forming portions in recess form were filled in with a resin filler using a squeegee, and the resin filler was dried under conditions of 100° C. for 20 minutes, and thereby, a layer of the resin filler 30' was formed (see FIG. 10C).

(4) One side of the substrate after the above described process (3) was polished through belt sander polishing using belt polishing paper #600 (made by Sankyo Rikagaku Co., Ltd.), so that no resin filler 30' was left on the surface of the conductor circuits 24 or the land surface of the through hole 29, and then, buff polishing was carried out in order to remove scratches formed as a result of the above described belt sander polishing. This polishing sequence was carried out in the same manner on the other side of the substrate.

Next, heat treatment was carried out for one hour at 100° C., three hours at 120° C., one hour at 150° C. and seven hours at 180° C., and thereby, a resin filler layer 30 was formed.

Figure 10D:
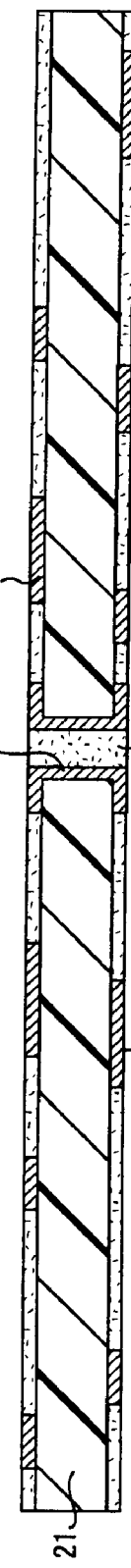

In this manner, an insulating substrate was gained, where the surface layer portion of the resin filler layer 30 formed in the through hole 29 and in conductor circuit non-forming portions, and the surface of the conductor circuits 24 are flattened, the resin filler layer 30 and the sides of the conductor circuits 24 adhered firmly to each other via the coarse surface (not illustrated), and the inner wall surface of the through hole 29 and the resin filler layer 30 adhered firmly to each other via the coarse surface (not illustrated) (see FIG. 10D). In this process, the surface of the resin filler layer 30 and the surface of the conductor circuits 24 were made in the same plane.

(5) The above described substrate washed with water and the fat was removed with acid, and afterward, soft etching was carried out, and then, an etchant was sprayed onto both sides of the substrate so that the surface of the conductor circuit 24, and the land surface and inner wall of the through hole 29 were etched, and thereby, a coarse surface (not illustrated) was formed on the entirety of the surface of the conductor circuit 24. As the etchant, an etchant including 10 parts by weight of a imidazole copper (II) complex, 7 parts by weight of glycolic acid and 5 parts by weight of potassium chloride (MECetchBOND, made by MEC Co., Ltd.).

Figure 10E:
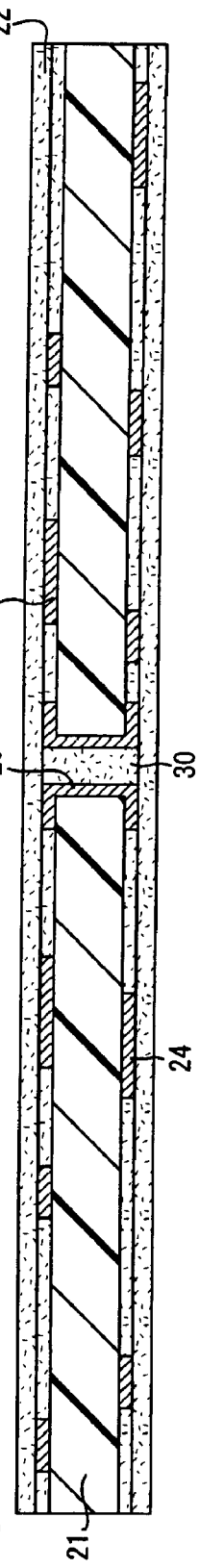

(6) Next, resin films for an insulating layer which are a little larger than the substrate prepared in the above described A were placed on the substrate and temporarily bonded thereto under pressure under such conditions that the pressure was 0.4 MPa, the temperature was 80° C. and the time for pressing was 10 seconds, and the edges were trimmed, and afterward, two other films were pasted using a vacuum laminating apparatus in accordance with the following method, and thereby, insulating layers 22 were formed (see FIG. 10E).

That is, resin films for an insulating layer were permanently bonded to the substrate under pressure under such conditions that the degree of vacuum was 65 Pa, the pressure was 0.4 MPa, the temperature was 80° C. and the time for pressing was 60 seconds, and afterward, thermosetting was carried out at 170° C. for 30 minutes.

(7) Next, openings for via holes 26 having a diameter of 80 μm were formed in the insulating layers 22 using a CO$_2$ gas laser having a wavelength of 10.4 μm through a mask which was placed on the insulating layers 22 and had a thickness of 1.2 mm of through holes formed therein, under such conditions that the beam had a diameter of 4.0 mm, was in a top hat mode, had a pulse width of 8.0 μsecond, and was of a one-shot type, and the diameter of through holes in the mask was 1.0 mm (see FIG. 11A).

(8) The substrate where the openings for via holes 26 were formed was immersed in a solution including 60 g/l of permanganic acid at 80° C. for 10 minutes, so that the epoxy resin particles on the surface of the insulating layers 22 dissolved and were removed, and thereby, a coarse surface (not illustrated) was formed on the surface of the substrate, including the inner wall surface of the openings for via holes 26.

(9) Next, the substrate after the above described process was immersed in a neutral solution (made by Shipley Company L.L.C.) and then washed with water.

Furthermore, a palladium catalyst was provided on the surface of this substrate on which a process for coarsening the surface (depth of coarseness: 3 μm) was carried out, and thus, catalyst nuclei were attached to the surface of the insulating layers 22 (including the inner wall surface of the openings for via holes 26) (not illustrated). That is, the above described substrate was immersed in a catalyst solution including palladium chloride (PdCl$_2$) and stannous chloride (SnCl$_2$) so that a palladium metal was deposited, and thus, a catalyst was provided.

(10) Next, the substrate was immersed in an electroless copper plating solution having the following composition, and thin film conductor layers (electroless copper plating films) 32 having a thickness of 0.6 μm to 3.0 μm were formed on the surface of the insulating layers 22 (including the inner wall surface of the openings for via holes 26) (see FIG. 11B).

[Electroless Plating Solution]

| | |
|---|---|
| NiSO$_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| a,a'-bipyridyl | 100 mg/l |
| Polyethylene glycol (PEG) | 0.10 g/l |

[Conditions for Electroless Plating]

Solution Temperature of 30° C. for 40 Minutes

(11) Next, commercially available photosensitive dry films were pasted to the substrate on which thin film conductor layers (electroless copper plating films) 32 were formed, and the substrate was exposed to light of 100 mJ/cm$^2$ with a mask placed thereon, and then, a development process was carried out in a solution of 0.8% sodium carbonate, and thereby, plating resists 23 having a thickness of 20 μm were provided (see FIG. 11C).

(12) Subsequently, the substrate washed with water at 50° C., the fat was removed, the substrate washed with water at 25° C., and afterward, further washed with sulfuric acid, electrolytic plating was carried out under the following conditions, and electrolytic copper plating films 33 having a thickness of 20 μm were formed in plating resist non-forming portions 23 were formed (see FIG. 11D).

[Electrolytic Plating Solution]

| Sulfuric acid | 2.24 mol/l |
|---|---|
| Copper sulfate | 0.26 mol/l |
| Additive | 19.5 ml/l |
| (KAPARACID HL, made by Atotech Japan K.K.) | |

[Conditions for Electrolytic Plating]

| Current density | 1 A/dm$^2$ |
|---|---|
| Time | 65 minutes |
| Temperature | 22 ± 2° C. |

Figure 12A:
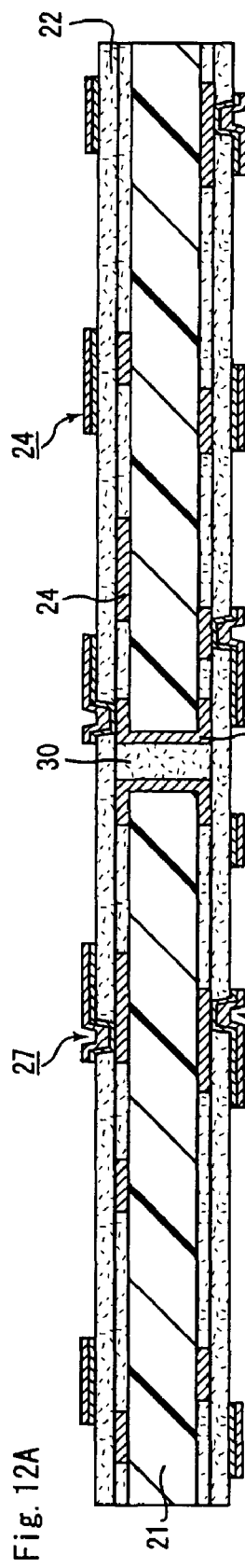
FIGS. 12A to 12C are cross-sectional views schematically illustrating part of a method for manufacturing a substrate for mounting an IC chip according to one embodiment of the present invention.

(13) Furthermore, the plating resists 23 were removed through separations (peeling) with 5% NaOH, and afterward, the thin film conductor layers beneath these plating resists 23 were dissolved and removed through an etching process using a mixed solution of sulfuric acid and hydrogen peroxide, and thus, conductor circuits 24 (including via holes 27) having a thickness of 18 μm were formed of thin film conductor layers (electroless copper plating films) 32 and electrolytic copper plating films 33 (see FIG. 12A).

Figure 12B:
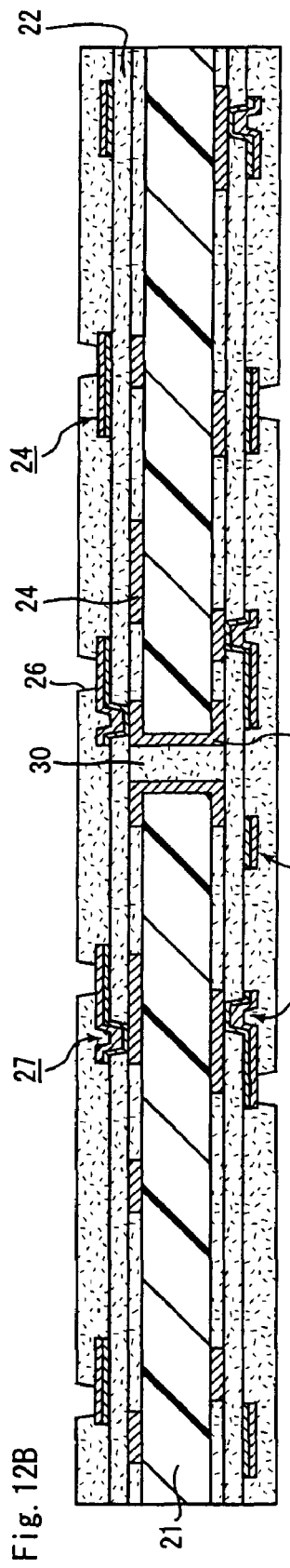

(14) Furthermore, the same kind of etchant as the etchant used in the above described process (5) was used to form a coarse surface (not illustrated) on the surface of the conductor circuits 24, and then, insulating layers 22 having openings for via holes 26 where a coarse surface (not illustrated) was formed on the surface were formed and layered in the same manner as in the above described processes (6) to (8) (see FIG. 12B).

Figure 12C:
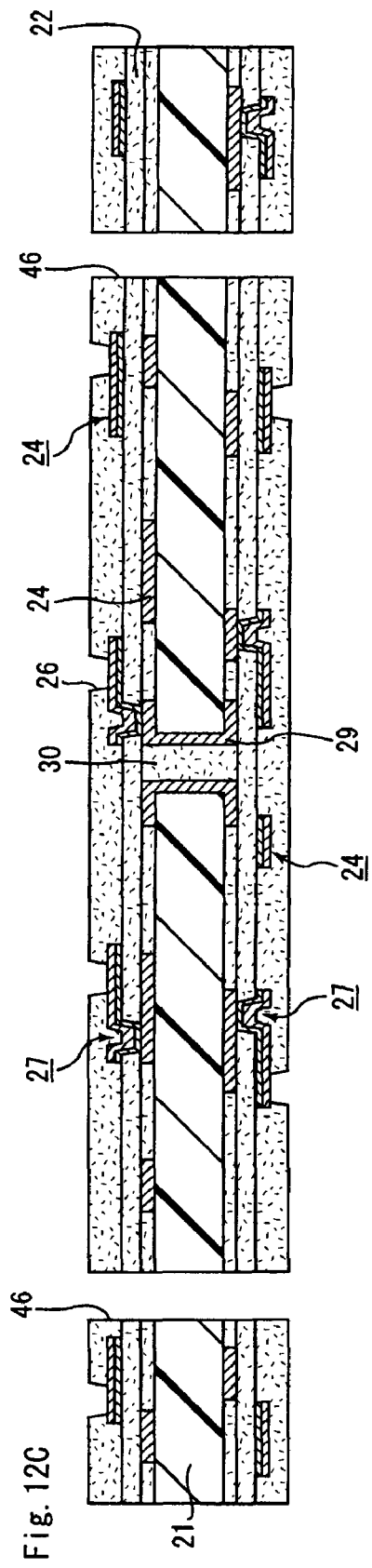

After that, a through hole 46 which penetrates through a substrate 21 and an insulating layer 22 was formed, and furthermore, a desmear process was carried out on the wall surface of the through hole 46 (see FIG. 12C).

Figure 13A:
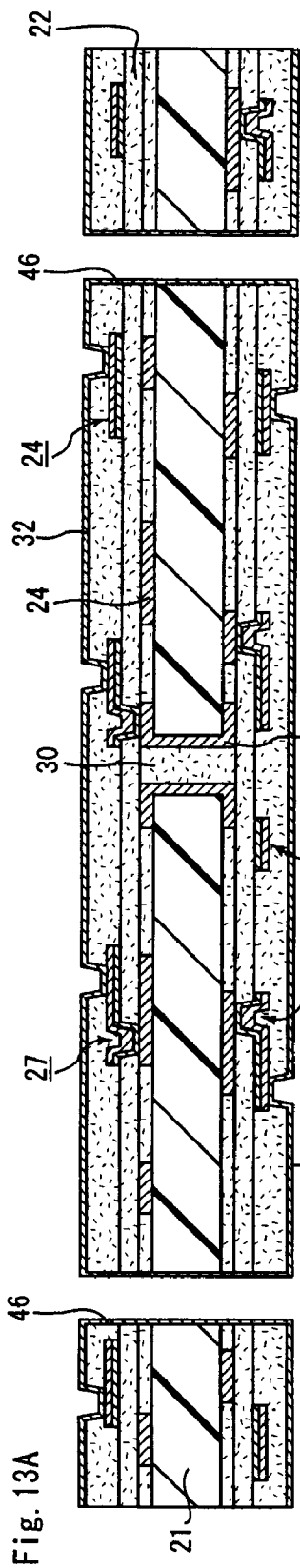
FIGS. 13A to 13C are cross-sectional views schematically illustrating part of a method for manufacturing a substrate for mounting an IC chip according to one embodiment of the present invention.

(15) Next, a catalyst was added to the wall surface of the through hole 46 and the surface of the insulating layers 22 (including the inner wall surface of the openings for via holes 26) in accordance with the same method as the method used in the above described process (9), and furthermore, the substrate was immersed in the same electroless copper plating solution as the electroless plating liquid used in the above described process (10), so that thin film conductor layers (electroless copper plating films) 32 were formed on the surface of the insulating layers 22 (including the inner wall surface of the openings for via holes 26) and the wall surface of the through hole 46 (see FIG. 13A).

Figure 13B:
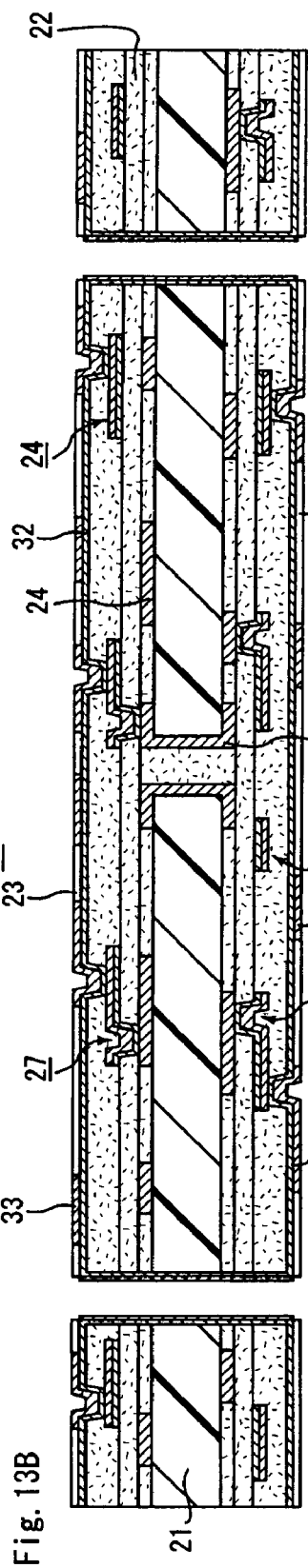

(16) Next, plating resists 23 were provided in accordance with the same method as the method used in the above described process (11), and furthermore, electrolytic copper plating films 33 having a thickness of 20 μm were formed in plating resist non-forming portions 23 were formed in accordance with the same method as the method used in the above described process (12) (see FIG. 13B).

(17) Next, in the same manner as in the process (13), the plating resists 23 were peeled off, thin film conductor layers were removed beneath the plating resists 23, and conductor circuits 24 (including via holes 27) and conductor layers 45 were formed.

Figure 13C:
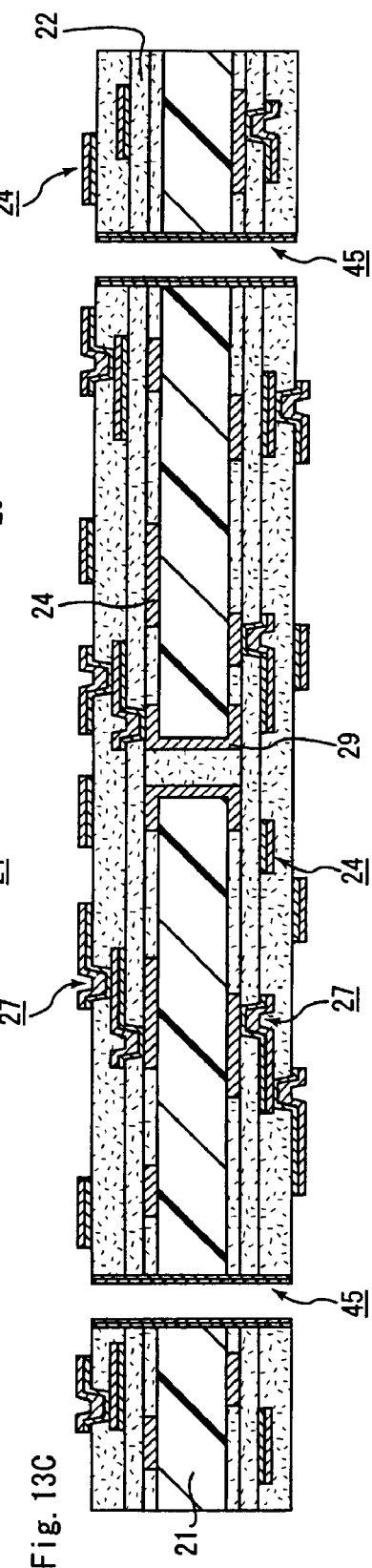

Furthermore, in the same manner as in the process (2), an oxidation-reduction process was carried out, and the surface of the conductor circuit 24 and the surface of the conductor layer 45 were roughened (not illustrated) (see FIG. 13C).

(18) Next, a resin composite was placed on a mask for filling a hole in a printing machine, and screen printing was carried out, and thereby, the through hole for an optical path was filled in with the resin, and afterward, a hardening process was carried out under conditions of 120° C. for one hour and 150° C. for one hour, and subsequently, the resin that protruded from the through hole for an optical path was polished using polishing paper #3000, and furthermore, the surface was polished using alumina particles having a diameter of 0.05 μm so as to be flattened, and the resin composite 47 was formed.

As the resin composite in this process, an epoxy resin (transmittance: 91%/mm, CTE: 82 ppm) to which 40% by weight of crushed silica having a distribution in particle diameter from 0.1 μm to 0.8 μm was added so that the transmittance became 82%/mm, the CTE became 42 ppm and the viscosity became 200000 cps was used (see FIG. 14A).

(19) Next, a solder resist composition (RPZ-1, made by Hitachi Chemical Co., Ltd.) was applied on both sides of the substrate on which the resin composite layer 47 was formed so as to have a thickness of 30 μm, and a drying process was carried out under conditions of 70° C. for 20 minutes and 70° C. for 30 minutes, and thus, layers of a solder resist compound 34' were formed (see FIG. 14B).

(20) Next, a photo mask having a thickness of 5 mm where a pattern for openings for forming solder bumps and openings for optical paths was drawn was made to make contact with the layer of a solder resist composition 34' on the side where an IC chip was mounted, and the substrate was exposed to ultraviolet rays of 1000 mJ/cm$^2$ and a development process was carried out using a DMTG solution, and thus, openings with a diameter of 200 μm were formed.

Figures 15A, 15B:
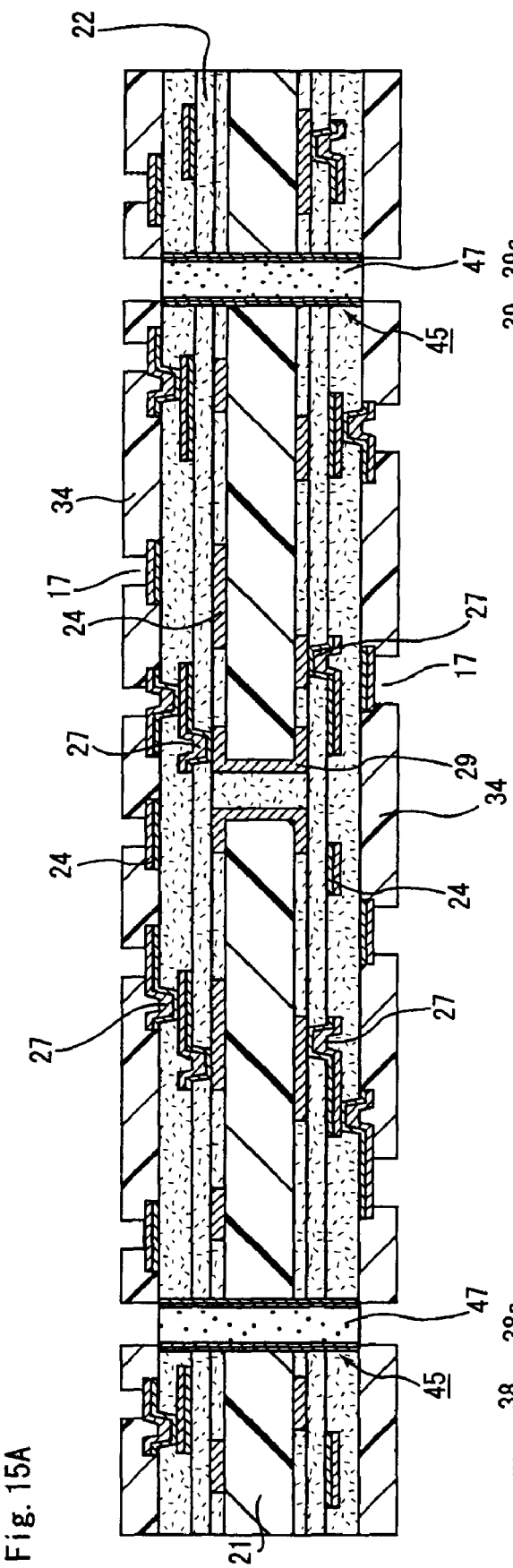
FIGS. 15A and 15B are cross-sectional views schematically illustrating part of a method for manufacturing a substrate for mounting an IC chip according to one embodiment of the present invention.

Furthermore, heat treatment was carried out under conditions of 80° C. for one hour, 100° C. for one hour, 120° C. for one hour and 150° C. for three hours, respectively, so that the layers of a solder resist composition were hardened, and thus, solder resist layers 34 having openings for forming solder bumps 47 and openings for optical paths 42b and having a thickness of 20 μm were formed (see FIG. 15A).

Now, as the above described solder resist composition, a commercially available solder resist composition can be used.

(21) Next, the substrate on which the solder resist layers 34 were formed was immersed in an electroless nickel plating solution having a pH of 4.5 and including nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes, and thus, nickel plating layers having a thickness of 5 μm were formed in the openings for forming solder bumps 47. Furthermore, this substrate was immersed in an electroless gold plating solution including gold potassium cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) under conditions of 80° C. for 7.5 minutes, and thus, gold plating layers having a thickness of 0.03 μm were formed on the nickel plating layers for forming solder pads 36.

(22) Next, a fluorine based polymer coating agent (EGC-1700, made by Sumitomo 3M Co., Ltd.) is applied on the entirety of the surface of the solder resist layer on the side on which micro lenses are provided, air blow was carried out thereon, and a surface treatment was carried out by air drying.

Furthermore, an inkjet apparatus was used to provide a micro lens 46 inside openings for optical paths formed on an end portion of the side opposite to the side where an optical element of a resin composite 47 was formed on the solder resist layer 34 in accordance with the following method.

That is, a UV curing epoxy based resin (transmittance: 94%/mm, index of refraction: 1.53) was prepared so as to have a viscosity of 20 cps at room temperature (25° C.), and afterward, this resin was prepared within the resin container of the inkjet apparatus so as to have a viscosity of 8 cps at a temperature of 40° C., and subsequently, the resin was applied in predetermined places on an end portion of the resin composite layer 47 in hemispherical form with a diameter of 220 µm and a degree of sagging of 10 µm, and furthermore, irradiated with UV light (500 mW/min) so that the resin hardened, and thus, micro lenses 46 were provided.

(23) Next, a solder paste was printed on the openings for forming solder bumps 47 which were formed in the solder resist layers 34, and furthermore, a light receiving element 39 and a light emitting element 38 was mounted while positioning a light receiving portion 38a and a light emitting portion 39a, and reflow was carried out at 200° C., and thus, the light receiving element 39 and the light emitting element 38 was mounted, and at the same time, solder bumps 37 were formed in the openings for forming solder bumps 47 (see FIG. 15B).

Here, flip chip VCSEL was used as the light emitting element 38, and flip chip PINPD was used as the light receiving element 39.

Figure 16:
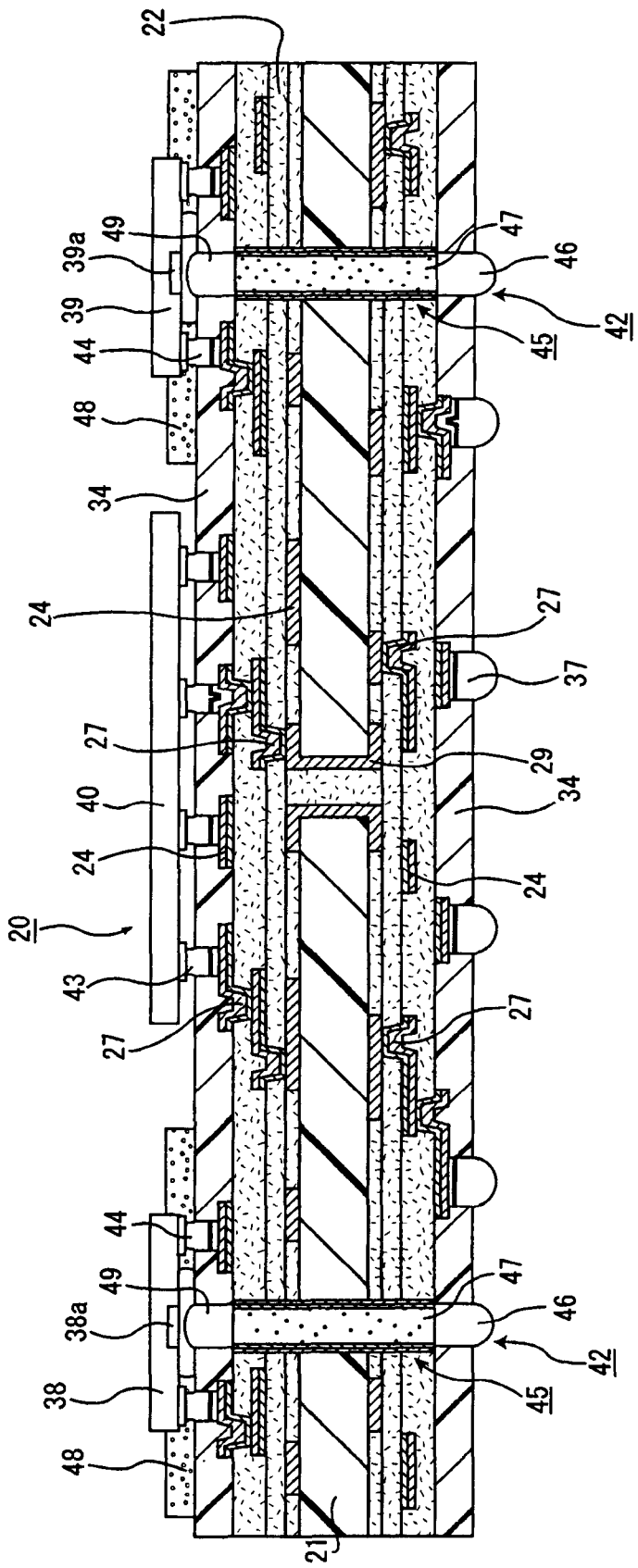
FIG. 16 is a cross-sectional view schematically illustrating part of a method for manufacturing a substrate for mounting an IC chip according to one embodiment of the present invention.

(24) Next, the optical element sealing layer was formed using the following method so as to make contact with each of the periphery of the light receiving element 39 and the light emitting element 38, and the substrate for mounting an IC chip was manufactured (see FIG. 16). That is, after adding to an epoxy based resin 75% by weight of spherical silica having a distribution in particle diameter from 1 µm to 100 µm and having an average particle diameter of 25 µm, and applying the resin composite with a CTE of 20 ppm, a viscosity of 250 Pa·s, and a thixotropy ratio of 1.7 by potting so as to make contact with each of the periphery of the substrate for mounting an IC chip, sealing layers of a substrate for mounting an IC chip were formed by carrying out a hardening process under the conditions of 2 hours at 150° C.

Here, the distance between the bottom of an optical element and the surface of a solder resist layer in the substrate for mounting an IC chip manufactured in the present example is 50 µm.

In addition, in the substrate for mounting an IC chip according to the present example, a gap part is formed in the portion where an optical path for transmitting an optical signal makes contact with an optical element. Therefore, an optical element sealing layer is not formed on the portion where an optical path for transmitting an optical signal makes contact with an optical element.

Example 2

Before carrying out the process (23) after the process (22) of Example 1, the substrate for mounting an IC chip was manufactured in the same manner as in Example 1, except that with the following method, a dam for stopping the flow of an uncured resin for sealing an optical element was formed in a predetermined position on a solder resist layer (on the periphery of an optical element sealing layer formed later), then a commercially available resin for an underfill (CCN800D, made by Kyushu Matsushita Electric Co., Ltd.) was applied onto the periphery of an optical element with a dispenser, and afterward, the optical element sealing layer was formed by carrying out a hardening process.

Formation of the dam was carried out by silk-printing an epoxy resin and then carrying out a hardening process.

Example 3

The substrate for mounting an IC chip was manufactured in the same manner as in Example 1, except that after carrying out up to the process (23) of Example 1 without carrying out the process (24), a cap member was attached so as to cover each of the light receiving element and the light emitting element.

First, the cap member was manufactured by forming the electrolysis Ni/Au layer (Ni: 5 µm, Au: 0.5 µm) on the copper side after completely carrying out etching on one side of a double-sided copper pasted glass epoxy substrate, and carrying out a dicing process after carrying out spot facing on the plate-shaped substrate (opposite side of Ni/Au layer).

Next, a resin composite (viscosity: 200 Pa·s, thixotropy ratio: 1.8, CTE: 30 ppm) to which 70% by weight of spherical silica having a distribution in particle diameter from 1 µm to 30 µm and having an average particle diameter of 4 µm was added was applied with a dispenser in the position to which a cap member was attached, and was hardened in an oven until B-stage.

After that, the above described cap member was temporarily secured on a substrate with a flip chip mounting machine by performing alignment, a 2 g/mm$^2$ weight was put on the above described cap member, and the cap member was attached by hardening a resin composite in an oven.

Comparative Example 1

A substrate for mounting an IC chip was manufactured in the same manner as in Example 1, except that a sealing layer of an optical element was not formed in the process (24) of Example 1.

With regard to the substrate for mounting an IC chip concerning Examples 1 to 3 and Comparative Example 1, the optical signal transmission performance was evaluated with the following method.

First, an IC chip was mounted on the substrate for mounting an IC chip (see FIG. 16), and afterward, a detector was attached to an end portion of the optical path for transmitting an optical signal in a substrate for mounting an IC chip on the side opposite to the side on which the light emitting element was mounted, an optical signal was transmitted from the light emitting element, and the optical signal was detected by the detector. As a result, a desired optical signal of 1.25 Gbps and 2.5 Gbps was able to be detected.

Next, after leaving standing a substrate for mounting an IC chip regarding Examples 1 to 3 and Comparative Example 1 on which an IC chip is mounted in the environment where dust is produced comparatively often, it was put into a box and carried. After that, the optical signal transmission performance of the substrate for mounting an IC chip was evaluated using the above described method. As a result, in the substrate for mounting an IC chip concerning Examples 1 to 3, an optical signal was able to be transmitted similarly to the case before leaving it standing in the environment where dust is produced. On the other hand, some of the substrates for mounting an IC chip concerning Comparative Example 1 were not able to transmit an optical signal. This is presumably because dust has intruded inside or on an optical path for transmitting an optical signal.

In addition, in Example 3, when a cap member comprising ceramics was used instead of a cap member comprising a resin material, and also when a cap member was attached by interposing solder instead of an adhesive, the same results as in Example 3 were obtained. Here, in order to attach the cap member by interposing solder, in addition to forming a pad (pattern for soldering) on the outermost insulating layer in advance, a solder resist layer was not formed in this portion.

In addition, each of a one-channel light emitting element and a one-channel light receiving element was mounted as an optical element in the substrate for mounting an IC chip according to Examples 1 to 3. A four-channel light emitting element and a four-channel light receiving element were mounted instead of these optical elements, and in accordance with this, the same results were obtained also in the substrate for mounting an IC chip in which the cross-sectional size of an optical path for transmitting an optical signal was made large.

In addition, a substrate for mounting an IC chip according to the first aspect of the present invention, since a gap part can exist between an optical element and a solder resist layer, there is a risk that thermal expansion of air present in this gap part may cause cracks in solder connection portions, an optical element sealing layer, and the like. Then, by carrying out the following Test Examples 1 to 5, the influence by the difference in the portion which forms an optical element sealing layer, was evaluated on the basis of such indicators as whether cracks occur or not in an optical waveguide, solder connection portions, a solder resist layer, an insulating layer, etc. after a liquid phase temperature cycle.

Test Example 1

Basically, the substrate for mounting an IC chip was manufactured with the same method as in Example 1. However, when forming an optical element sealing layer, the optical element sealing layer was formed so that a sealing resin layer was present only outside solder bumps.

Test Example 2

Basically, the substrate for mounting an IC chip was manufactured with the same method as in Example 1. However, an optical element sealing layer was formed so that when forming the optical element sealing layer, a sealing resin layer existed also inside solder bumps and solder bumps were buried inside the sealing resin layer.

Test Example 3

Basically, the substrate for mounting an IC chip was manufactured with the same method as in Example 1. However, the optical element sealing layer was formed so that when forming an optical element sealing layer, the sealing resin layer existed also inside the solder bumps, and so that the portion where solder bumps were buried inside a sealing resin layer and the portion where the sealing resin layer was formed only outside solder bumps were mixed.

Test Example 4

The substrate for mounting an IC chip was manufactured with the same method as in Comparative Example 1. That is, an optical element sealing layer was not formed.

Test Example 5

Basically, the substrate for mounting an IC chip was manufactured with the same method as in Example 1. However, underfill was formed on the entirety of the portion between the optical element and the solder resist layer, instead of the optical element sealing layer.

With regard to the substrate for mounting an IC chip concerning these Test Examples 1 to 5, a liquid phase temperature cycle test in which one cycle consists of three minutes at $-55°$ C. and three minutes at $125°$ C. was carried out concerning each of five substrates for mounting an IC chip in 0 cycle, 250 cycles, 500 cycles, and 1000 cycles. After that, a substrate for mounting an IC chip was cut crosswise (to observe the cross section), and furthermore, whether or not cracks occur was observed under a microscope in the cross sections of solder connection portions, of a sealing resin layer, of a substrate, of an insulating layer, of a solder resist layer, and of an optical element.

As a result, cracks were not observed in any substrate for mounting an IC chip.

This shows that in the substrate for mounting an IC chip according to the first aspect of the present invention, even when a gap part is formed between the optical element and the solder resist layer (portion between an optical path for transmitting an optical signal and the bottom side of an optical element), it does not adversely affect a substrate for mounting an IC chip.

Example 4

A. Manufacture of Resin Film for Insulating Layer

A resin film for an insulating layer was manufactured in the same manner as in the process A in Example 1.

B. Preparation of Resin Composite for Filling Through Hole

A resin composite for filling a through hole was prepared in the same manner as in the process B in Example 1.

Figure 17A:
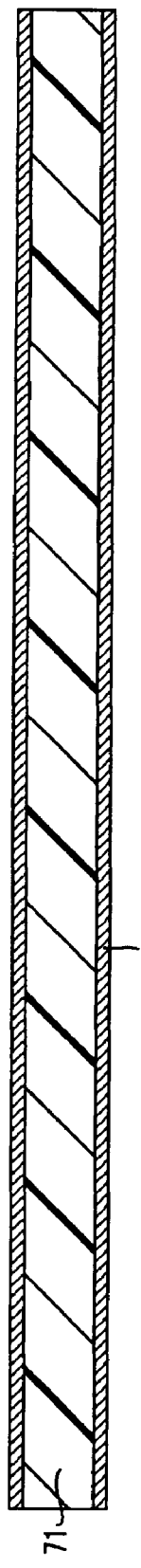
FIG. 17 is a cross-sectional view schematically illustrating part of a method for manufacturing a substrate for a motherboard which forms a device for optical communication according to one embodiment of the present invention.

C. Manufacture of Substrate for Motherboard (1) A copper pasted multilayer plate where copper foils 78 having a thickness of 18 μm were laminated on both sides of an insulating substrate 71 made of a glass epoxy resin or BT (bismaleimide triazine) having a thickness of 0.8 mm was used as a starting material (see FIG. 17A). First, holes were drilled in this copper pasted multilayer plate, an electroless plating process was carried out, and etching was carried out to form a pattern, and thereby, conductor circuits 74 and through holes 79 were formed on both sides of the substrate 71.

Figure 17B:
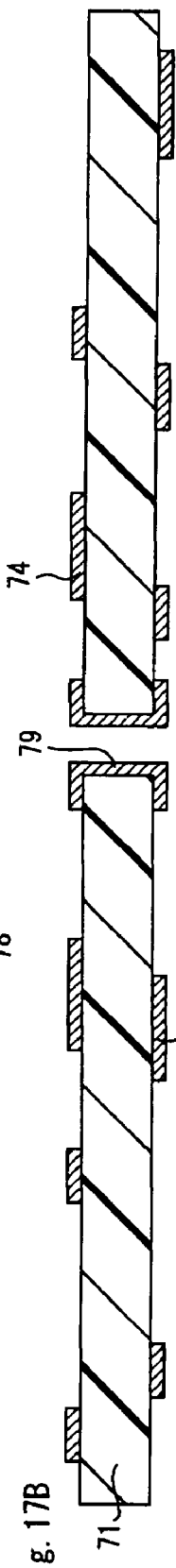

(2) The substrate where through holes 79 were formed and conductor circuits 74 were formed washed with water and dried, and afterward a blackening process was carried out using a solution including NaOH (10 g/l), $NaClO_2$ (40 g/l) and $Na_3PO_4$ (6 g/l) as a blackening bath (oxidation bath) and a reduction process was carried out using a solution including NaOH (10 g/l) and $NaBH_4$ (6 g/l) as a reduction bath so that a coarse surface (not illustrated) was formed on the surface of the conductor circuits 74 including through holes 79 (see FIG. 17B).

(3) A layer of a resin filler 80' was formed in accordance with the following method in the portion where no conductor circuits were formed within the through holes 79 and on one side of the substrate 71 and in the outer peripheral portion of the conductor circuit 74 within 24 hours after a resin filler was prepared as described in the above B.

Figure 17C:
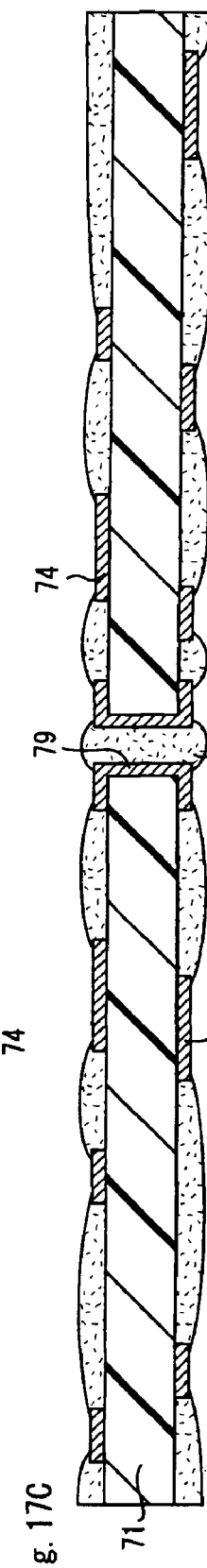

That is, first, the resin filler was pushed into the through holes using a squeegee, and afterward, was dried under the condition of $100°$ C. for 20 minutes. Next, a mask having openings in portions corresponding to the portions where no conductor circuits were formed was placed on the substrate and the portions where no conductor circuits were formed in recess form was filled in with a resin filler using a squeegee and were dried under the condition of 100° C. for 20 minutes, and thereby, a layer of the resin filler 80' was formed (see FIG. 17C).

(4) One side of the substrate after the above described process (3) was finished was polished through belt sander polishing using belt polishing paper of #600 (made by Sankyo Rikagaku Co., Ltd.), so that no resin filler 80' was left on the surface of the conductor circuits 74 or the land surface of the through hole 79, and then, buff polishing was carried out in order to remove scratches formed as a result of the above described belt sander polishing. This polishing sequence was carried out in the same manner on the other side of the substrate.

Next, heat treatment was carried out for one hour at 100° C., three hours at 120° C., one hour at 150° C. and seven hours at 180° C., and thereby, a resin filler layer 80 was formed.

Figure 17D:
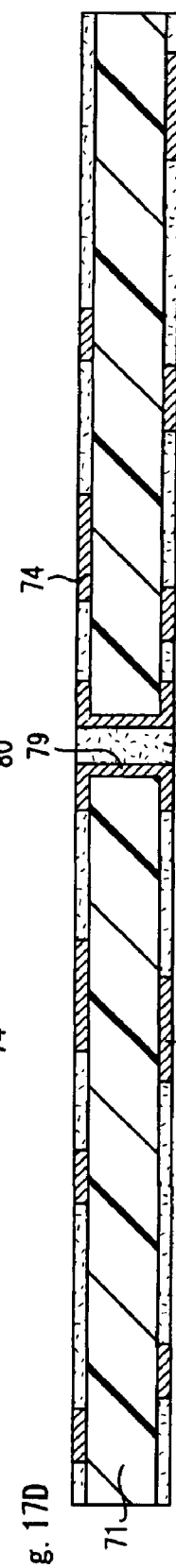

In this manner, an insulating substrate was gained, where the surface layer portion of the resin filler layer 80 formed in the through hole 79 and in portions where no conductor circuits are formed, and the surface of the conductor circuits 74 are flattened, the resin filler layer 80 and the sides of the conductor circuits 74 adhered firmly to each other via the coarse surface (not illustrated), and the inner wall surface of the through hole 79 and the resin filler layer 80 adhered firmly to each other via the coarse surface (not illustrated) (see FIG. 17D). In this process, the surface of the resin filler layer 80 and the surface of the conductor circuits 74 were made in the same plane.

(5) The above described substrate washed with water and the fat was removed with acid, and afterward, soft etching was carried out, and then, an etchant was sprayed onto both sides of the substrate so that the surface of the conductor circuit 74, and the land surface and inner wall of the through hole 79 were etched, and thereby, a coarse surface (not illustrated) was formed on the entirety of the surface of the conductor circuit 74. As the etchant, an etchant including 10 parts by weight of a imidazole copper (II) complex, 7 parts by weight of glycolic acid and 5 parts by weight of potassium chloride (MECetchBOND, made by MEC Co., Ltd.).

Figure 17E:
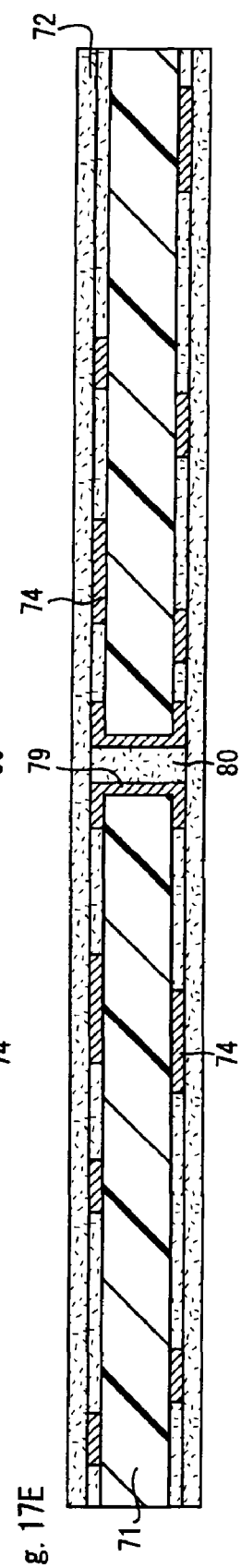

(6) Next, resin films for an insulating layer which are a little larger than the substrate prepared in the above described A were placed on the substrate and temporarily bonded thereto under pressure under such conditions that the pressure was 0.4 MPa, the temperature was 80° C. and the time for pressing was 10 seconds, and the edges were trimmed, and afterward, two other films were pasted using a vacuum laminating apparatus in accordance with the following method, and thereby, insulating layers 72 were formed (see FIG. 17E).

That is, resin films for an insulating layer were permanently bonded to the substrate under pressure under such conditions that the degree of vacuum was 65 Pa, the pressure was 0.4 MPa, the temperature was 80° C. and the time for pressing was 60 seconds, and afterward, thermosetting was carried out at 170° C. for 30 minutes.

Figure 18A:
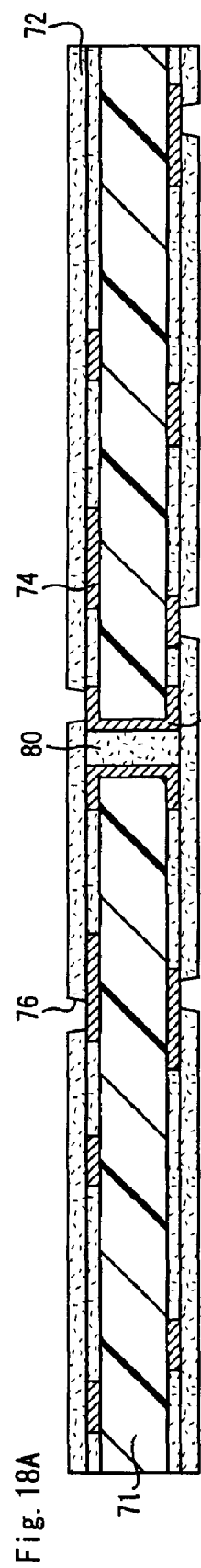
FIGS. 18A to 18D are cross-sectional views schematically illustrating part of a method for manufacturing a substrate for a motherboard which forms a device for optical communication according to one embodiment of the present invention.

(7) Next, openings for via holes 76 having a diameter of 80 μm were formed in the insulating layers 72 using a $CO_2$ gas laser having a wavelength of 10.4 μm through a mask which was placed on the insulating layers 72 and had a thickness of 1.2 mm of through holes formed therein, under such conditions that the beam had a diameter of 4.0 mm, was in a top hat mode, had a pulse width of 8.0 μsecond, and was of a one-shot type, and the diameter of through holes in the mask was 1.0 mm (see FIG. 18A).

(8) The substrate where the openings for via holes 76 were formed was immersed in a solution including 60 g/l of a permanganic acid at 80° C. for 10 minutes, so that the epoxy resin particles on the surface of the insulating layers 72 were dissolved and removed, and thereby, a coarse surface (not illustrated) was formed on the surface of the substrate, including the inner wall surface of the openings for via holes 76.

(9) Next, the substrate after the above described process was immersed in a neutral solution (made by Shipley Company L.L.C.) and then washed with water.

Furthermore, a palladium catalyst was provided on the surface of this substrate on which a process for coarsening the surface (depth of coarseness: 3 μm) was carried out, and thus, catalyst nuclei were attached to the surface of the insulating layers 72 (including the inner wall surface of the openings for via holes 76) (not illustrated). That is, the above described substrate was immersed in a catalyst solution including palladium chloride ($PdCl_2$) and stannous chloride ($SnCl_2$) so that a palladium metal was deposited, and thus, a catalyst was provided.

Figure 18B:
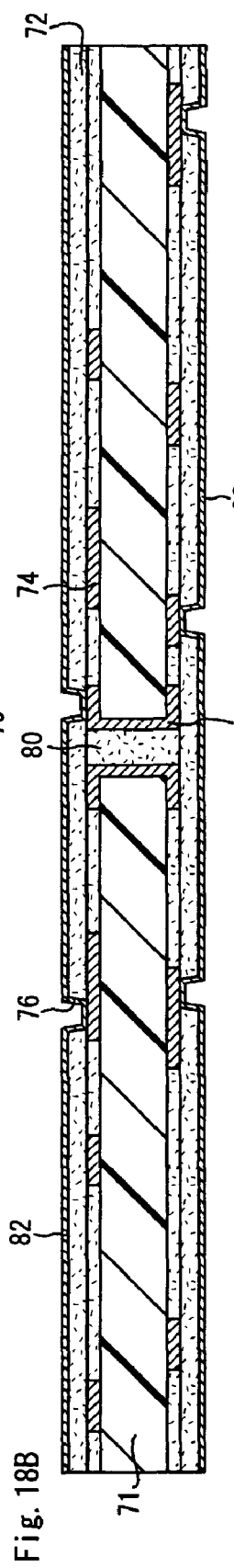

(10) Next, the substrate was immersed in an electroless copper plating solution having the following composition, and thin film conductor layers (electroless copper plating films) 72 having a thickness of 0.6 μm to 3.0 μm were formed on the surface of the insulating layers 72 (including the inner wall surface of the openings for via holes 76) (see FIG. 18B).

[Electroless Plating Solution]

| | |
|---|---|
| $NiSO_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| a,a'-bipyridyl | 100 mg/l |
| Polyethylene glycol (PEG) | 0.10 g/l |

[Conditions for Electroless Plating]

Solution Temperature of 30° C. for 40 Minutes

Figure 18C:
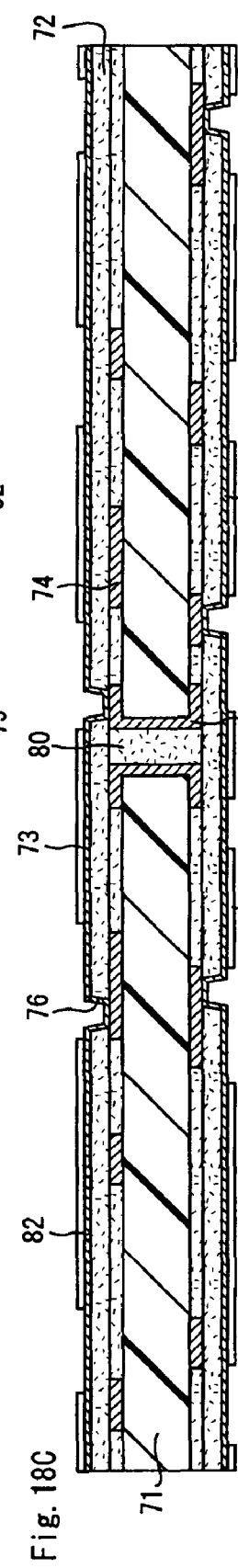

(11) Next, commercially available photosensitive dry films were pasted to the substrate on which thin film conductor layers (electroless copper plating films) 82 were formed, and the substrate was exposed to light of 100 mJ/cm² with a mask placed thereon, and then, a development process was carried out in a solution of 0.8% sodium carbonate, and thereby, plating resists 73 having a thickness of 20 μm were provided (see FIG. 18C).

Figure 18D:
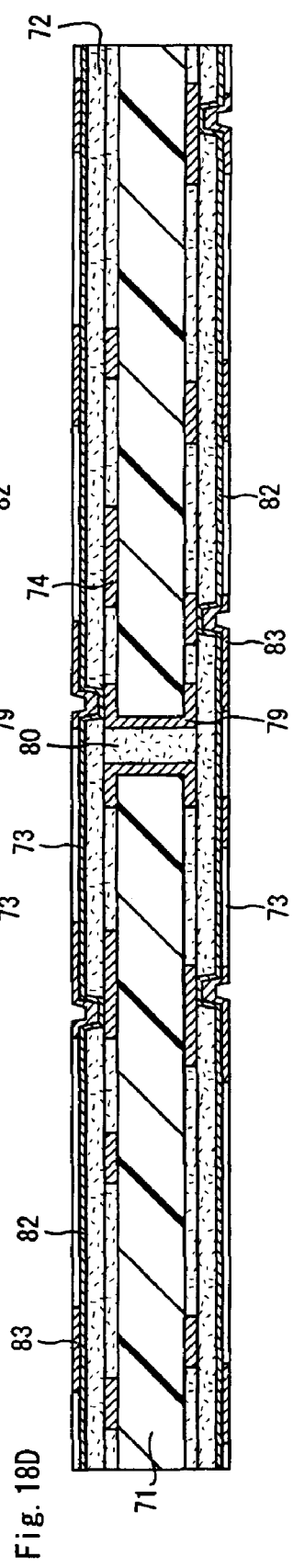

(12) Subsequently, the substrate washed with water at 50° C., the fat was removed, the substrate washed with water at 25° C., and afterward, further washed with sulfuric acid, electrolytic plating was carried out under the following conditions, and electrolytic copper plating films 83 having a thickness of 20 μm were formed in plating resist non-forming portions 73 were formed (see FIG. 18D).

[Electrolytic Plating Solution]

| | |
|---|---|
| Sulfuric acid | 2.24 mol/l |
| Copper sulfate | 0.26 mol/l |
| Additive | 19.5 ml/l |

(Kaparacid HL, Made by Atotech Japan K.K.)

[Conditions for Electrolytic Plating]

| Current density | 1 A/dm$^2$ |
|---|---|
| Time | 65 minutes |
| Temperature | 22 ± 2° C. |

(13) Furthermore, the plating resists 73 were removed through separations (peeling) (peeling) with 5% NaOH, and afterward, the thin film conductor layers beneath these plating resists 73 were dissolved and removed through an etching process using a mixed solution of sulfuric acid and hydrogen peroxide, and thus, conductor circuits 74 (including via holes 77) having a thickness of 18 μm were formed of thin film conductor layers (electroless copper plating films) 82 and electrolytic copper plating films 83 (see FIG. 19A).

(14) Furthermore, the same kind of etchant as the etchant used in the above described process (5) was used to form a coarse surface (not illustrated) on the surface of the conductor circuits 74, and then, insulating layers 72 having openings for via holes 76 where a coarse surface (not illustrated) was formed on the surface were formed and layered in the same manner as in the above described processes (6) to (8) (see FIG. 19B).

After that, a through hole 96 which penetrates through a substrate 71 and an insulating layer 72 was formed using a drill with a diameter of 350 μm, and furthermore, a desmear process was carried out on the wall surface of the through hole 96 (see FIG. 19C).

Figure 20A:
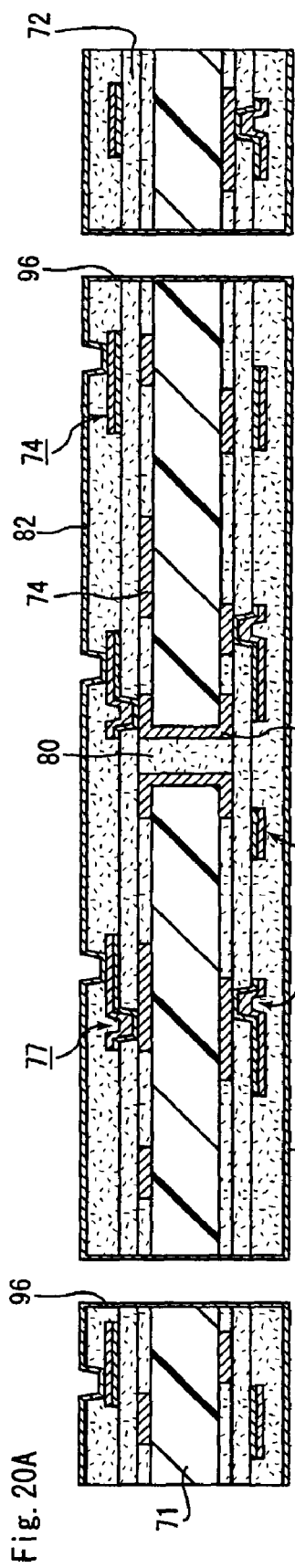
FIGS. 20A to 20C are cross-sectional views schematically illustrating part of a method for manufacturing a substrate for a motherboard which forms a device for optical communication according to one embodiment of the present invention.

(15) Next, a catalyst was added to the wall surface of the through hole 96 and the surface of the insulating layers 72 (including the inner wall surface of the openings for via holes 76) in accordance with the same method as the method used in the above described process (9), and furthermore, the substrate was immersed in the same electroless copper plating solution as the electroless plating liquid used in the above described process (10), so that thin film conductor layers (electroless copper plating films) 82 were formed on the surface of the insulating layers 72 (including the inner wall surface of the openings for via holes 76) and the wall surface of the through hole 96 (see FIG. 20A).

Figure 20B:
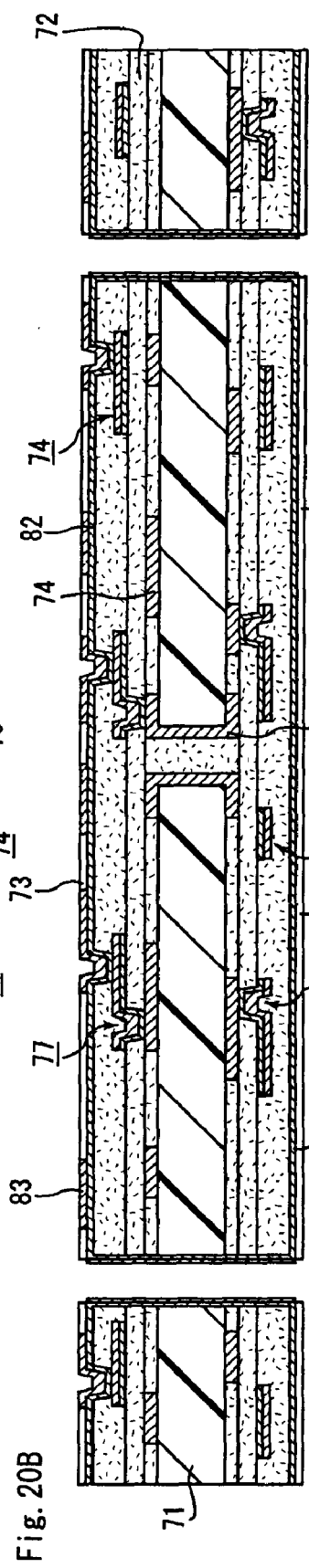

(16) Next, plating resists 73 were provided in accordance with the same method as the method used in the above described process (11), and furthermore, electrolytic copper plating films 83 having a thickness of 20 μm were formed in plating resist non-forming portions 73 were formed in accordance with the same method as the method used in the above described process (12) (see FIG. 20B).

(18) Next, in the same manner as in the process (13), the plating resists 73 were peeled off, thin film conductor layers were removed beneath the plating resists 73, and conductor circuits 74 (including via holes 77) were formed.

Figure 20C:
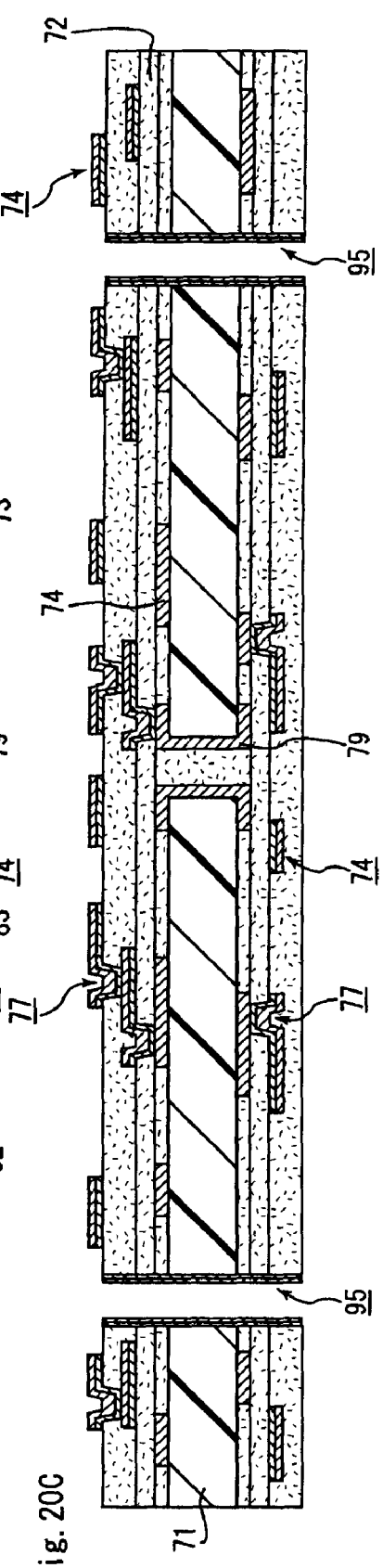

Furthermore, in the same manner as in the process (2), an oxidation-reduction process was carried out, and the surface of the conductor circuit 74 and the surface of conductor layers 95 were roughened (not illustrated) (see FIG. 20C).

(18) Next, a resin was placed on a mask for filling a hole in a printer, and screen printing was carried out, and thereby, the through hole for an optical path 81 was filled in with the resin, and afterward, a hardening process was carried out under conditions of 120° C. for one hour and 150° C. for one hour, and subsequently, the resin that protruded from the through hole for an optical path 81 was polished using polishing paper #3000, and furthermore, the surface was polished using alumina particles having a diameter of 0.05 μm so as to be flattened, and thus, a resin composite layer 97 was formed.

As the resin in this process, an epoxy resin (transmittance: 91%/mm, CTE: 82 ppm) to which 40% by weight of crushed silica having a distribution in particle diameter from 0.1 μm to 0.8 μm was added so that the transmittance became 82%/mm, the CTE became 42 ppm and the viscosity became 200000 cps was used.

(19) Next, in accordance with the following method, an optical waveguide 50 was formed on an end portion of an through hole for an optical path 96 inside which the resin composite 97 was formed.

First, an acryl based resin (index of refraction: 1.52, transmittance: 94%/mm, CTE: 72 ppm) was prepared as a resin for forming a core and an acryl based resin (index of refraction: 1.51, transmittance: 93%/mm, CTE: 70 ppm) to which 25% by weight of crushed silica having a distribution in particle diameter from 0.1 μm to 0.8 μm was added so that the transmittance became 81%/mm, the CTE became 53 ppm and the viscosity became 1000 cps was prepared as a resin for forming a clad.

Next, the resin for forming a clad was applied to an end portion of the through hole for an optical path using a spin coater (1000 μm/10 sec), pre-baking at 80° C. for 10 minutes, a process for exposing the resin to light of 2000 mJ and post-baking at 150° C. for one hour were carried out, and thus, a lower clad having a thickness of 50 μm was formed.

Next, the resin for forming a core was applied to the top of the lower clad 52 using a spin coater (1200 μm/10 sec) and pre-baking at 80° C. for 10 minutes, a process for exposing the resin to light of 1000 mJ and a development process for 2 minutes through dipping using 1% of TMH and post-baking at 150° C. for one hour were carried out, an thus, a cores 51 with a width of 50 μm×a thickness of 50 μm were formed.

Next, the resin for forming a clad was applied using a spin coater (1000 μm/10 sec) and pre-baking at 80° C. for 10 minutes, a process for exposing the resin to light of 2000 mJ and post-baking at 150° C. for one hour were carried out so that an upper clad having a thickness of 50 μm was formed on the cores, and thus, an optical waveguide 50 made up of the core 51 and the clad 52 was provided (see FIG. 21A).

After that, a dicing process using a blade of #3000 at 90 degrees was carried out on the two end portions of the optical waveguide 50, and thus, optical path conversion mirrors by 90 degrees were formed (see FIG. 21B). Here, the transmission loss at the optical path conversion mirrors formed in this manner was 1.2 dB.

(20) In addition, a solder resist composition (RPZ-1, made by Hitachi Chemical Co., Ltd.) was applied on both sides of a substrate so as to have a thickness of 30 μm after hardening, and a drying process was carried out under conditions of 70° C. for 20 minutes and 70° C. for 30 minutes, and thus, layers of a solder resist compound 84' were formed (see FIG. 21C).

(21) Next, a photomask having a thickness of 2.9 mm (0.11 inches) where patterns for openings for forming solder bumps were drawn was made to make contact with the layer of a solder resist composition 84' on the side opposite to the side where the optical waveguide 50 was formed and the pattern was exposed to ultraviolet rays of 1000 mJ/cm$^2$, and a development process was carried out in a DMTG solution, and thus, openings were formed.

The opening for an optical path formed herein is a circle in a plan view with a diameter of 200 μm.

Accordingly, the solder resist layer formed in this process is formed so as to cover the interface between the through hole for an optical path and the resin composite.

Furthermore, heat treatment was carried out under the conditions of 80° C. for one hour, 100° C. for one hour, 120° C. for one hour and 150° C. for three hours so that, the layer of a solder resist composition was hardened, and thus, solder resist layers 84 having openings for forming solder bumps 67 and openings for optical paths and having a thickness of 30 µm was formed (see FIG. 22A).

(22) Next, the substrate on which the solder resist layers 84 were formed was immersed in an electroless nickel plating solution having a pH of 4.5 and including nickel chloride ($2.3 \times 10^{-1}$ mol/l), sodium hypophosphite ($2.8 \times 10^{-1}$ mol/l) and sodium citrate ($1.6 \times 10^{-1}$ mol/l) for 20 minutes, and thus, nickel plating layers having a thickness of 5 µm were formed in the openings for forming solder bumps 98. Furthermore, this substrate was immersed in an electroless gold plating solution including gold potassium cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) under conditions of 80° C. for 7.5 minutes, and thus, gold plating layers having a thickness of 0.03 µm were formed on the nickel plating layers for forming solder pads.

(23) Next, a fluorine based polymer coating agent (EGC-1700, made by Sumitomo 3M Co., Ltd.) is applied on the entirety of the surface of the solder resist layer on the side on which micro lenses are provided, air blow was carried out thereon, and a surface treatment was carried out by air drying.

Furthermore, an inkjet apparatus was used to provide a micro lens 96 inside openings for optical paths formed on an end portion of the side opposite to the side where an optical element of a resin composite 97 was formed on the solder resist layer 84 in accordance with the following method.

That is, a UV curing epoxy based resin (transmittance: 94%/mm, index of refraction: 1.53) was prepared so as to have a viscosity of 20 cps at room temperature (25° C.), and afterward, this resin was prepared within the resin container of the inkjet apparatus so as to have a viscosity of 8 cps at a temperature of 40° C., and subsequently, the resin was applied in predetermined places on the resin composite layer 97 in hemispherical form with a diameter of 220 µm and a degree of sagging of 10 µm, and furthermore, irradiated with UV light (500 mW/mm) so that the resin hardened, and thus, a micro lens 96 was provided.

(24) Next, a solder paste was printed in the openings for forming solder bumps 98 which were formed in the solder resist layer 84 so that solder bumps 87 were formed, and a substrate for a motherboard was obtained (see FIG. 22B).

D. Manufacture of Device for Optical Communication

After mounting an IC chip on the substrate for mounting an IC chip manufactured in Example 1 and then sealing the IC chip with resin, this substrate for mounting an IC chip was placed in a predetermined position of a substrate for a motherboard manufactured in the above described process C to face each other, reflow was carried out thereon at 200° C., and thereby solder bumps of both substrates were connected to each other to form solder connection portions.

After that, sealing layers of a substrate for mounting an IC chip were formed and a device for optical communication was manufactured, using the following method, so as to make contact with the periphery of a substrate for mounting an IC chip.

That is, after adding 75% by weight of spherical silica having a distribution in particle diameter from 1 µm to 100 µm and an average particle diameter of 25 µm to an epoxy based resin and applying the resin composite with a CTE of 20 ppm, a viscosity of 250 Pa·s, and a thixotropy ratio of 1.7 by potting so as to make contact with each of the periphery of a substrate for mounting an IC chip, sealing layers of a substrate for mounting an IC chip were formed by carrying out a hardening process under the conditions of 2 hours at 150° C.

The distance between the bottom of a substrate for mounting an IC chip and the surface of a substrate for a motherboard in the device for optical communication manufactured in the present example is 300 µm.

In addition, in the device for optical communication of the present example (Example 4), the portion between the optical path for transmitting an optical signal of a substrate for mounting an IC chip and the optical path for transmitting an optical signal of a substrate for a motherboard is formed of a gap.

Example 5

The device for optical communication was manufactured in the same manner as in Example 4, except that in Example 4, an IC chip was mounted on the substrate for mounting an IC chip manufactured in Example 3 as a substrate for mounting an IC chip mounted in a substrate for a motherboard, and furthermore, this IC chip which was sealed with resin was used.

Example 6

The device for optical communication was manufactured in the same manner as in Example 4, except that in Example 4, an IC chip was mounted on the substrate for mounting an IC chip manufactured in Example 3 as a substrate for mounting an IC chip mounted in a substrate for a motherboard, and an IC chip which was not sealed with resin was used.

Example 7

In the process D of Example 4, before forming sealing layers of a substrate for mounting an IC chip, the substrate for mounting an IC chip was manufactured in the same manner as in Example 4, except that with the following method, a dam for stopping the flow of an uncured resin for sealing an optical element was formed in a predetermined position on a solder resist layer of a substrate for a motherboard (the lower portion of the substrate for mounting an IC chip mounted later), then a commercially available resin for underfill (CCN800D, made by Kyushu Matsushita Electric Co., Ltd.) was applied onto the periphery of an optical element with a dispenser, and furthermore, sealing layers of a substrate for mounting an IC chip were formed by carrying out a hardening process.

Formation of the dam was carried out by silk-printing an epoxy resin and then carrying out a hardening process.

Example 8

A substrate for mounting an IC chip was manufactured in the same manner as in Example 4, except that the process of forming the sealing layers of a substrate for mounting an IC chip of Example 4 was not performed and a cap member was attached so as to cover a substrate for mounting an IC chip using the following method.

First, a cap member was manufactured by carrying out the electrolysis Ni/Au layer (Ni: 5 µm, Au: 0.5 µm) on the copper side after completely carrying out etching on one side of a double-sided copper pasted glass epoxy substrate, and carrying out a dicing process after carrying out spot facing on the plate-shaped substrate (opposite side of Ni/Au layer).

Next, a resin composite (viscosity: 200 Pa·s, thixotropy ratio: 1.8, CTE: 30 ppm) to which 70% by weight of spherical silica having a distribution in particle diameter from 1 μm to 30 μm and an average particle diameter of 4 μm was added was applied with a dispenser in the position to which a cap member was attached and was hardened in an oven until B-stage.

After that, the above described cap member was temporarily fastened by performing alignment on a substrate, a 2 g/mm² weight was put on the above described cap member, and the cap member was attached by hardening a resin composite in an oven. Flux cleaning was carried out after mounting a substrate for mounting an IC chip.

Example 9

The device for optical communication was manufactured in the same manner as in Example 7, except that in Example 8, an IC chip was mounted on the substrate for mounting an IC chip manufactured in Example 3 as a substrate for mounting an IC chip mounted in a substrate for a motherboard, and this IC chip which was sealed with resin was used.

Example 10

The device for optical communication was manufactured in the same manner as in Example 8, except that in Example 8, an IC chip was mounted on the substrate for mounting an IC chip manufactured in Comparative Example 1 as a substrate for mounting an IC chip mounted in a substrate for a motherboard, and furthermore, this IC chip which was not sealed with resin was used.

Comparative Example 2

In Example 4, a device for optical communication was manufactured in the same manner as in Example 4, except that sealing layers of the substrate for mounting an IC chip were not formed.

With regard to a device for optical communication concerning Examples 4 to 10 and Comparative Example 2, the optical signal transmission performance was evaluated with the following method.

That is, when the light emitting element in a substrate for mounting an IC chip is emitted, optical signals transmitted via the optical path for transmitting an optical signal of a substrate for mounting an IC chip, an optical path for transmitting an optical signal of a substrate for a motherboard, an optical waveguide, an optical path for transmitting an optical signal of a substrate for a motherboard, and an optical path for transmitting an optical signal of a substrate for mounting an IC chip is received with a light receiving element of a substrate for mounting an IC chip, and the I-pattern of an electrical signal via the receiver IC was checked, it was confirmed that transmission of 1.25 Gbps can be performed about the device for optical communication concerning Examples 4 to 10 and Comparative Example 2.

In addition, with regard to the transmission of 2.5 Gbps as well, it was confirmed that an optical signal can be transmitted in the same manner.

Next, after leaving standing a device for optical communication regarding Examples 4 to 10 and Comparative Example 2 in the environment where dust is produced comparatively often, it was put into a box and carried. After that, the optical signal transmission performance of the device for optical communication was evaluated using the above described method. As a result, in the device for optical communication concerning Examples 4 to 10, an optical signal was able to be transmitted similarly to the case before leaving it standing in the environment where dust is produced.

On the other hand, some of the devices for optical communication concerning Comparative Example 2 were not able to transmit an optical signal. This is presumably because dust has intruded in an optical path for transmitting an optical signal.

The same liquid phase temperature cycle test carried out in Test Examples 1 to 5 was performed concerning the device for optical communication of Examples 4 to 10, and the gross leakage test based on MIL-STD-833 about the sealing performance of the subsequent substrate for mounting an IC chip was conducted. That is, after the device for optical communication was immersed in the fluorocarbon liquid for 1 minute, sealing performance was evaluated by observing occurrence of bubble.

As a result, it became clear that the device for optical communication of Examples 4 to 10 has sufficient sealing performance.

The contents of MTL-STD-883 are incorporated by reference in their entirety.

In addition, with regard to a device for optical communication of Examples 4 to 10, wire bonding was carried out on an dummy IC chip on which aluminum sputtering was performed in advance on the entirety of the substrate for mounting an IC chip, and when a changing rate of resistance after a liquid phase temperature cycle test was measured, the changing rate of resistance was less than 5% in all the devices for optical communication.

In addition, in the device for optical communication in Example 5, when a cap member comprising ceramics was used instead of a cap member comprising a resin material and also when an IC chip was sealed with resin using a cap member comprising ceramics was used instead of a cap member comprising resin and an IC chip was sealed with resin, the same results as in Example 5 were obtained.

In addition, in the device for optical communication in Example 5, when a cap member comprising ceramics was used instead of a cap member comprising a resin material, and also, a cap member is attached by interposing solder instead of an adhesive, the same results as in Example 5 were obtained. Here, in order to attach a cap member by interposing solder, a solder resist layer was not formed in this portion, in addition to forming a pad (pattern for soldering) on the outermost insulating layer in advance.

In addition, in the device for optical communication in Example 10, also when a cap member comprising ceramics was used instead of a cap member comprising a resin material, the same results as in Example 10 were obtained.

In addition, in the device for optical communication in Example 10, also when a cap member is attached by interposing solder instead of an adhesive, using a cap member comprising ceramics, the same results as in Example 10 were obtained. Here, in order to attach a cap member via solder, a solder resist layer was not formed in this portion, in addition to forming a pad (pattern for soldering) on the outermost insulating layer in advance.

In addition, flux cleaning was performed in Examples 8 to 10. However, when flux cleaning was not carried out on other samples, transmission loss of an optical signal sometimes increased. This is presumably because of an influence of the remaining flux component.

In addition, each of a one-channel light emitting element and a one channel light receiving element was mounted as an optical element in the device for optical communication according to Examples 4 to 10, a four-channel light emitting element and a four-channel light receiving element were mounted instead of these optical elements, and the same results were obtained also in the device for optical communication in which the cross-sectional size of an optical path for transmitting an optical signal was made large in accordance with this.

In addition, in a device for optical communication according to the third aspect of the present invention, since a gap part can exist between a substrate for mounting an IC chip and a solder resist layer of a substrate for a motherboard, thermal expansion of air present in this gap part is likely to cause cracks in solder connection portions, sealing layers of a substrate for mounting an IC chip, and the like. Then, by carrying out the following Test Examples 6 to 10, the influence by the difference in the portion where sealing layers of a substrate for mounting an IC chip are formed was evaluated on the basis of the indicators, that is, whether cracks occur or not in solder connection portions, sealing layers of the substrate for mounting an IC chip, a substrate for mounting an IC chip, a substrate for a motherboard, and the like after a liquid phase temperature cycle.

Test Example 6

Basically, a device for optical communication was manufactured with the same method as in Example 4. However, when forming sealing layers of the substrate for mounting an IC chip, sealing layers of the substrate for mounting an IC chip was formed so that a sealing resin layer existed only outside solder bumps.

Test Example 7

Basically, a device for optical communication was manufactured with the same method as in Example 4. However, sealing layers of the substrate for mounting an IC chip were formed so that when forming sealing layers of the substrate for mounting an IC chip, a sealing resin layer existed also inside solder bumps and so that solder bumps are buried inside the sealing resin layer.

Test Example 8

Basically, a device for optical communication was manufactured with the same method as in Example 4. However, sealing layers of the substrate for mounting an IC chip were formed so that when forming sealing layers of the substrate for mounting an IC chip were formed, the sealing resin layer existed also inside the solder bumps, and so that the portion where solder bumps are buried inside a sealing resin layer and the portion where the sealing resin layer is formed only outside solder bumps are mixed.

Test Example 9

A substrate for mounting an IC chip was manufactured with the same method as in Comparative Example 2. That is, sealing layers of the substrate for mounting an IC chip were not formed.

Test Example 10

Basically, a device for optical communication was manufactured with the same method as in Example 4. However, an underfill was formed on the entirety of the portion between the substrate for mounting an IC chip and the substrate for a motherboard, instead of sealing layers of the substrate for mounting an IC chip.

With regard to the substrate for mounting an IC chip concerning these Test Examples 6 to 10, the same liquid phase temperature cycle test as that of Test Examples 1 to 5 was carried out concerning each of the five devices for optical communication in 0 cycle, 250 cycles, 500 cycles, and 1000 cycles. After that, a device for optical communication was cut crosswise (to observe the cross section), and furthermore, whether or not cracks occur was observed under a microscope in the cross sections of sealing layers of a substrate for mounting an IC chip, of solder connection portions, of a substrate for mounting an IC chip, and of a substrate for a motherboard.

As a result, cracks were not observed in any device for optical communication.

This shows that in the device for optical communication according to the third aspect of the present invention, even when a gap part is formed between the substrate for mounting an IC chip and the substrate for a motherboard (portion to which an optical signal is transmitted), it does not adversely affect a device for optical communication.

What is claimed as new and desired to be secured by Letters Patent of the United States is:

1. A substrate for mounting an IC chip, where conductor circuits and insulating layers are formed and layered, an optical element is mounted, an optical path for transmitting an optical signal is formed,
    wherein the substrate comprises:
    an optical element sealing layer formed so as to make contact with a periphery of said optical element; and
    a solder resist layer formed as an outermost layer, wherein:
        said optical path for transmitting an optical signal is formed so as to penetrate through at least said insulating layer and said solder resist layer,
    a portion where said optical path for transmitting an optical signal penetrates through said solder resist layer is formed of a gap, and a cross-sectional diameter of the portion in which said gap is formed, is smaller than a cross-sectional diameter of the portion where said optical path for transmitting an optical signal penetrates through at least said insulating layer.

2. The substrate for mounting an IC chip according to claim 1,
    wherein
    particles are included in said optical element sealing layer.

3. The substrate for mounting an IC chip according to claim 2,
    wherein
    the particle diameter of said particles is at least 1 μm and at most 500 μm and/or the average particle diameter of said particles is at least 10 μm and at most 100 μm.

4. The substrate for mounting an IC chip according to claim 1,
    wherein
    said optical element sealing layer comprises solder.

5. The substrate for mounting an IC chip according to claim 4,
    wherein
    a metal layer is formed on the portion where the side of said optical element makes contact with said optical element sealing layer.

6. The substrate for mounting an IC chip according to claim 1,
    wherein
    said optical element sealing layer comprises a resin composite.

7. The substrate for mounting an IC chip according to claim 6,
wherein
a resin component of said resin composite is a thermosetting resin, a photosensitive resin where a photosensitive group is added to a portion of a thermosetting resin, or a resin compound which includes these resins and a thermoplastic resin.

8. The substrate for mounting an IC chip according to claim 6,
wherein
particles are included in a resin composite forming said optical path for transmitting an optical signal.

9. The substrate for mounting an IC chip according to claim 8,
wherein
said particles are inorganic particles comprising alumina, silica, or titania.

10. The substrate for mounting an IC chip according to claim 8,
wherein
a particle diameter of said particles is at least 0.01 µm and at most 0.8 µm.

11. The substrate for mounting an IC chip according to claim 1,
wherein
said optical element is a light receiving element and/or a light emitting element.

12. The substrate for mounting an IC chip according to claim 1,
wherein
an IC chip is mounted, and an optical element sealing cap is formed so as to integrally cover said IC chip and said optical element.

13. The substrate for mounting an IC chip according to claim 1,
wherein
a micro lens is provided on said optical element or said optical path for transmitting an optical signal.

14. The substrate for mounting an IC chip according to claim 1,
wherein
a solder resist layer is formed as an outermost layer, and
a dam is formed between said optical element and said solder resist layer so as to prevent the inflow of said optical element sealing layer into a center of said optical element.

15. The substrate for mounting an IC chip according to claim 14,
wherein
said dam is formed by printing an epoxy resin, a silicone resin, or an acrylic resin.

16. A device for optical communication, where conductor circuits and insulating layers are formed and layered, an optical waveguide is formed thereon to form a substrate for a motherboard on which an optical path for transmitting an optical signal is formed, and furthermore, a substrate for mounting an IC chip and which is mounted with an optical element is mounted on the substrate for a motherboard on which an optical path for transmitting an optical signal is formed,
wherein the device for optical communication comprises:
sealing layers of a substrate for mounting an IC chip formed so as to make contact with a periphery of said substrate for mounting an IC chip; and
a solder resist layer formed as both sides of an outermost layer, wherein:
said optical path for transmitting an optical signal is formed so as to penetrate through at least said insulating layer and one side of the solder resist layer,
a portion where said optical path for transmitting an optical signal penetrates through said solder resist layer is formed of a gap, and
a cross-sectional diameter of the portion in which said gap is formed, is smaller than the cross-sectional diameter of a portion where said optical path for transmitting an optical signal penetrates through at least said insulating layer.

17. The device for optical communication according to claim 16,
wherein
particles are included in said sealing layers of a substrate for mounting an IC chip.

18. The device for optical communication according to claim 17,
wherein
a particle diameter of said particles is at least 1 µm and at most 500 µm and/or the average particle diameter of said particles is at least 10 µm and at most 100 µm.

19. The device for optical communication according to claim 16,
wherein
said sealing layers of a substrate for mounting an IC chip comprises solder.

20. The device for optical communication according to claim 16,
wherein
said sealing layers of a substrate for mounting an IC chip comprise a resin composite.

21. The device for optical communication according to claim 20,
wherein
a resin component of said resin composite is a thermosetting resin, a photosensitive resin where a photosensitive group is added to a portion of a thermosetting resin, or a resin compound which includes these resins and a thermoplastic resin.

22. The device for optical communication according to claim 20,
wherein
particles are included in a resin composite forming said optical path for transmitting an optical signal.

23. The device for optical communication according to claim 22,
wherein
said particles are inorganic particles comprising alumina, silica, or titania.

24. The device for optical communication according to claim 22,
wherein
a particle diameter of said particles is at least 0.01 µm and at most 0.8 µm.

25. The device for optical communication according to claim 16,
wherein
said optical waveguide is an organic based optical waveguide.

26. The device for optical communication according to claim 25,
wherein
particles are mixed in said organic based optical waveguide.

27. The device for optical communication according to claim 26, wherein
a particle diameter of said particles is smaller than the wavelength for communication.

28. The device for optical communication according to claim 26,
wherein
a particle diameter of said particles is at least 0.01 μm and at most 0.8 μm.

29. The device for optical communication according to claim 26,
wherein
said optical waveguide comprises a core portion and a clad portion, and particles are mixed only in said clad portion.

30. The device for optical communication according to claim 26,
wherein
optical conversion mirrors are formed in said optical waveguide.

31. The device for optical communication according to claim 26,
wherein
said optical element is a light receiving element and/or a light emitting element.

32. The device for optical communication according to claim 16,
wherein
said optical element is a light receiving element and/or a light emitting element.

33. The device for optical communication according to claim 32,
wherein
a micro lens is provided on said optical path for transmitting an optical signal.

34. The device for optical communication according to claim 16,
wherein
a solder resist layer is formed as an outermost layer, and
a dam is formed between said substrate for mounting an IC chip and said solder resist layer so as to prevent the inflow of said sealing layers of a substrate for mounting an IC chip.

35. The device for optical communication according to claim 34,
wherein
said dam is formed by printing an epoxy resin, a silicone resin, or an acrylic resin.

* * * * *